United States Patent
Mizukoshi et al.

[19]

[11] Patent Number: 6,063,640

[45] Date of Patent: May 16, 2000

[54] SEMICONDUCTOR WAFER TESTING METHOD WITH PROBE PIN CONTACT

[75] Inventors: Masataka Mizukoshi; Hidehiko Akasaki; Masao Nakano; Yasuhiro Fujii; Shinnosuke Kamata; Makoto Yanagisawa; Yasurou Matsuzaki; Toyonobu Yamada; Masami Matsuoka; Hiroyoshi Tomita, all of Kawasaki, Japan

[73] Assignee: Fujitsu Limited, Kawasaki, Japan

[21] Appl. No.: 09/030,349

[22] Filed: Feb. 25, 1998

[30] Foreign Application Priority Data

| | | | | |
|---|---|---|---|---|
| Mar. 18, 1997 | [JP] | Japan | ..................................... | 9-065117 |
| Jun. 12, 1997 | [JP] | Japan | ..................................... | 9-155287 |
| Jun. 27, 1997 | [JP] | Japan | ..................................... | 9-172121 |
| Jul. 22, 1997 | [JP] | Japan | ..................................... | 9-196100 |

[51] Int. Cl.⁷ ............................. G01R 31/26; H01L 21/66
[52] U.S. Cl. ................................ 438/15; 438/18; 438/977
[58] Field of Search ................................ 438/15, 18, 977, 438/FOR 142, FOR 388, FOR 397, FOR 485

[56] References Cited

U.S. PATENT DOCUMENTS 5,716,218  2/1998  Farnworth et al. .
5,851,845  12/1998  Wood et al. .

Primary Examiner—David E. Graybill
Attorney, Agent, or Firm—Armstrong, Westerman, Hattori, McLeland & Naughton

[57] ABSTRACT

A semiconductor wafer testing method includes a pre-test step for forming a temporary test film on a surface of a semiconductor wafer, a test step for testing the semiconductor wafer by applying a probe to the temporary test film and a post-test step for exfoliating the temporary test film from the surface of the semiconductor wafer. The temporary test film includes test electrode groups each provided with a plurality of regularly arranged test electrodes, and wiring patterns for electrically connecting the test electrodes with corresponding ones of semiconductor unit electrodes in respective semiconductor units on the semiconductor wafer. Probe pins of said probe are arranged so as to be aligned with corresponding ones of the test electrodes of the respective test electrode groups.

31 Claims, 46 Drawing Sheets

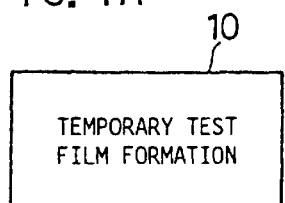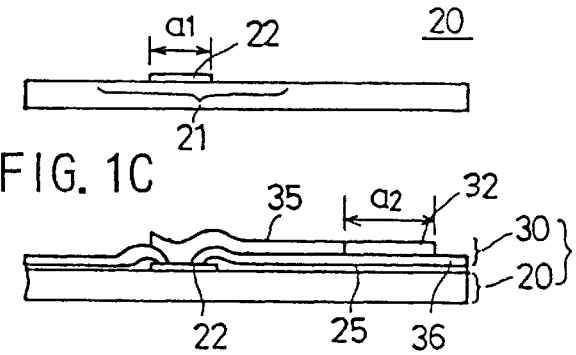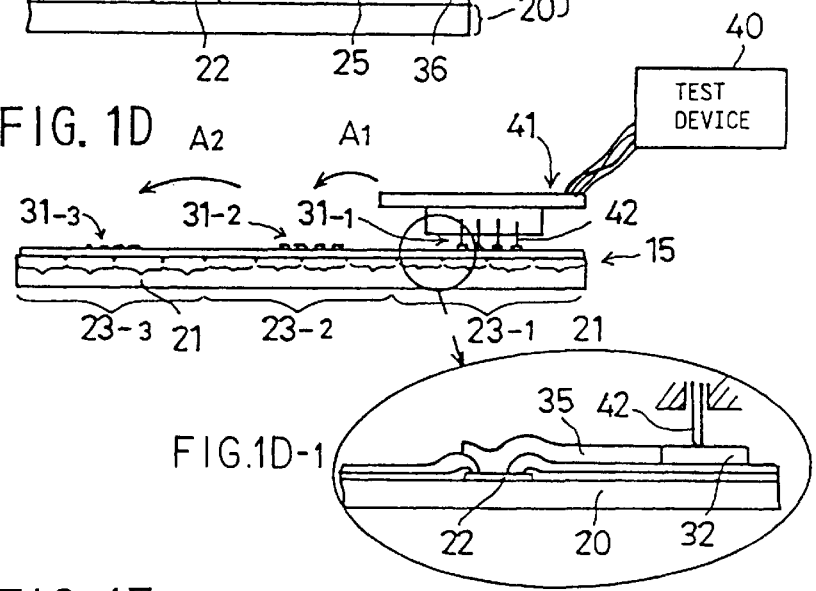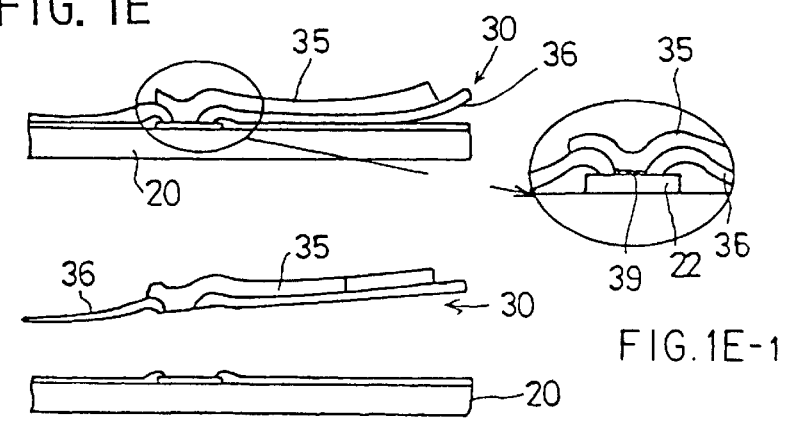

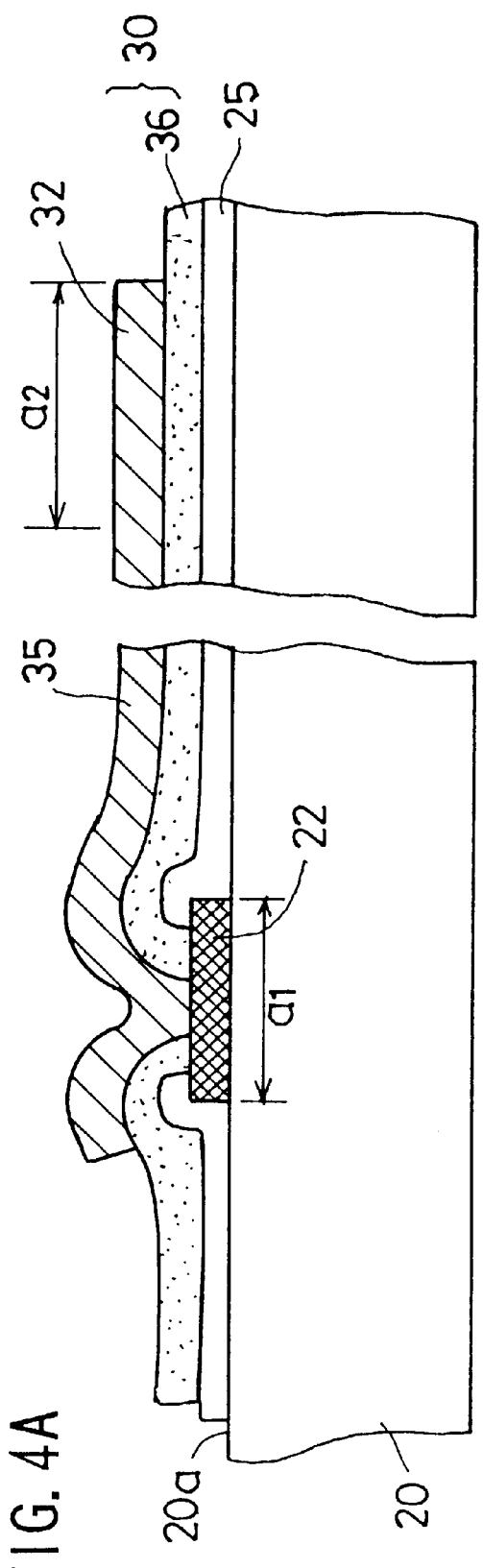
FIG. 4A
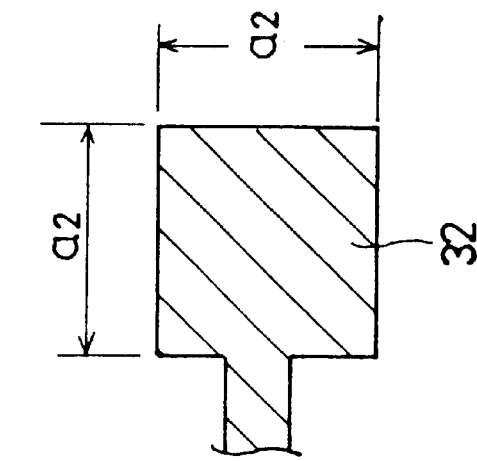
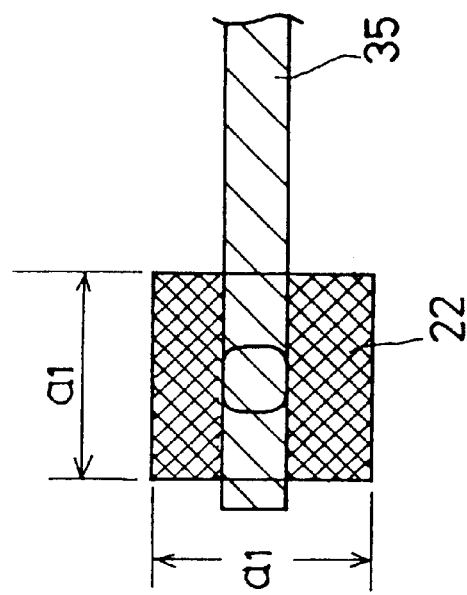
FIG. 4B

FIG.9A
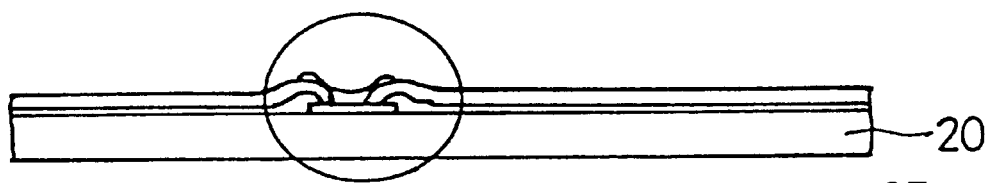
FIG.9A-1
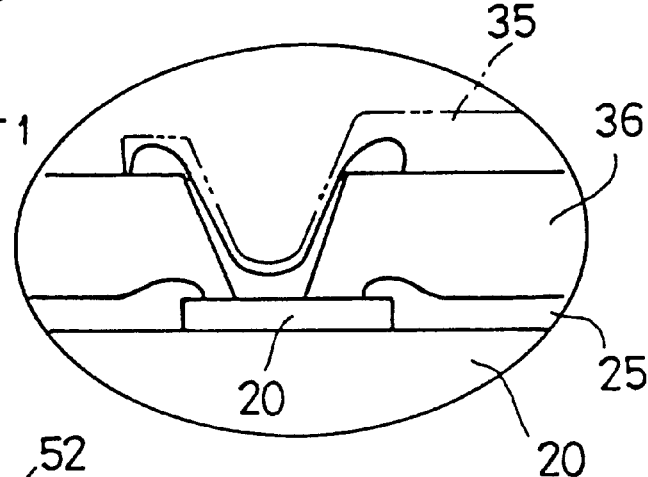
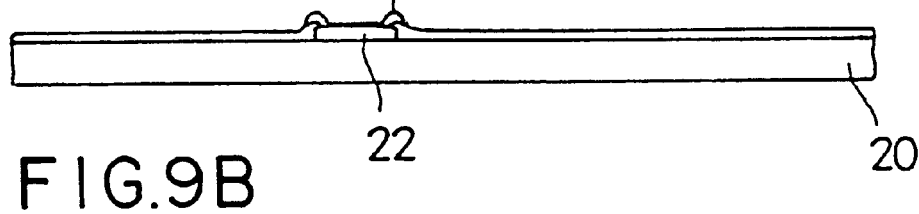
FIG.9B

SEMICONDUCTOR WAFER TESTING METHOD WITH PROBE PIN CONTACT

BACKGROUND OF THE INVENTION

1. Field of the Invention

The present invention generally relates to methods for testing a semiconductor wafer and, more particularly, to a method for efficiently testing a semiconductor wafer in which reliable electrical contact is ensured between electrodes of semiconductor units and probe pins of a prose.

A semiconductor device is normally manufactured such that a semiconductor wafer with a large number of semiconductor chips, each including at least one semiconductor element, is first produced. For example, a total of 200 to 300 chips may be formed on a wafer. The semiconductor wafer is scribed so that each of the semiconductor chips is packaged. Conventionally, post-packaging tests have been studied more extensively than pre-packaging tests. Recently, however, many semiconductor devices are manufactured such that packaging is conduced in a factory different from the factory where semiconductor wafers are produced. An increasing number of pre-packaged semiconductor wafers are shipped out of factories. For this reason, a growing importance is being attached to a method for testing semiconductor chips on a semiconductor wafer so as to select chips of a satisfactory quality.

2. Description of the Related Art

A description will now be given of a first aspect of a problem inherent in the semiconductor wafer testing method according to the related art.

Generally, each semiconductor chip on a semiconductor wafer is tested such that probe pins of a probe are applied to respective electrodes of individual semiconductor chips. Testing the semiconductor chips of the semiconductor wafer one by one takes a significant period of time, rendering the testing process inefficient. According to one conventional approach to efficiently test the semiconductor chips on the semiconductor wafer, probe pins are applied to respective electrodes of a plurality of semiconductor chips at the same time so that the plurality of semiconductor chips are tested simultaneously.

A probe for testing a plurality of semiconductor chips simultaneously should be provided with several times as many probe pins as the electrodes of a semiconductor chip. Since each pinhead of such probe pins should be applied to the corresponding electrode, the pinheads of the probe pins of a probe are irregularly distributed over a relatively wide area. It is significantly difficult to position the pinheads of all the probe pins with precision. Thus, it is difficult to ensure that the pinheads of all the probe pins are properly applied to the corresponding electrodes when a test is conducted.

Poor reliability in contact between the pinheads of the probe pin and the electrodes on the semiconductor chip results in difficulty in conducting a full-specification test and a burn-in test.

A description will now be given of a second aspect of the problem inherent in the related art.

FIGS. 13 and 14 are a top view and a side view, respectively, showing how a semiconductor wafer is tested according to the related art. Each of a plurality of chips on a wafer is tested using a test probe card and test probe pins adapted for a wafer test.

Referring to FIGS. 13 and 14, each chip 1 on a wafer 2 is provided with permanent pads 7-1 and 7-2. These permanent pads 7-1 and 7-2 are referred to as first electrodes in the description given later in the specification (see, for example, FIG. 20). Each of the permanent pads 7-1 and 7-2 is connected to a various semiconductor circuits that constitute semiconductor elements in the chip 1. The semiconductor elements in the chip 1 are tested by applying test probe pins 6 to the permanent pads 7-1 and 7-2 and supplying an input/output signal and a power source voltage to the semiconductor elements from a test probe card 110.

FIG. 15 is a top view showing how a plurality of chips are tested according to the related art. In the example shown, tae wafer 2 in which the chips 1 are arranged in the X direction and in the Y direction is tested.

In order to test the wafer 2 efficiently and in a short period of time, it is required that the test probe pins 6 be simultaneously applied to the permanent pads 7-1 and 7-2 of the plurality of chips 1 on the wafer 2 so that the plurality of chips 1 are tested at the same time. However, the arrangement of the permanent pads 7-1 and 7-2 is primarily determined by how a subsequent chip assembly process for packaging the chip should be facilitated rather than by how the wafer test should be facilitated. Since the permanent pads 7-1 and 7-2 cannot be removed after the test, various restrictions are imposed on the arrangement and the number of the permanent pads 7-1 and 7-2.

For example, FIG. 15 shows that the permanent pads 7-1 and 7-2 are not arranged at regular intervals in the Y direction. For this reason, the test probe pins 6 at regular intervals can be simultaneously applied to the permanent pads 7-1 and 7-2 only in the X direction. With the arrangement of the permanent pads 7-1 and 7-2 as shown in FIG. 15, only a limited number of chips can be tested simultaneously using the test probe card 110, thus making it difficult to test the wafer 2 efficiently.

Describing the problem in further details, the following restrictions may be imposed when the related art testing method is used to test a plurality of chips on a wafer.

(1) The arrangement of the permanent pads on the plurality of chips on the wafer may also be determined by an arrangement of semiconductor circuits in the chip or positions of lead terminals in a package. For this reason, the arrangement of the permanent pads cannot be determined by how the test should be facilitated.

(2) Pads dedicated to the test may be provided in addition to the permanent pads in order to perform the wafer test efficiently. However, such an addition of test pads increases the chip area.

(3) With the conventional testing method, it is not possible to provide wires across different chips on the wafer.

The following problems arise associated with the above restrictions.

(A) It is difficult to provide a permanent pad arrangement adapted for increasing the number of chips that can be simultaneously tested using a test probe card.

(B) It is necessary to provide various types of test probe cards in the event that chips of different types coexist on the wafer.

(C) It is difficult to connect signal lines in the chip to the test pads dedicated to the test and to directly supply signals to the test pads for the wafer test.

(D) It is necessary to apply test probe pins to all the chips on the wafer to supply the same signal to all the chips on the wafer, when the entirety of the wafer is tested as in a wafer burn-in test.

(E) While it is necessary to provide capacity between a plurality of power sources in order to prevent occurrence of power source noise while the wafer is being tested, by locating the capacity as close as possible to a power supply pad of the permanent pads. However, the testing method according to the related art only enables capacity to be provided at the root of a test probe pin. Accordingly, it has been difficult to reduce the power source noise to a satisfactorily low level.

A description will now be given of a third aspect of the problem inherent in the related art.

FIG. 37 is a top view showing a semiconductor wafer testing method according to the related art.

Referring to FIG. 37, permanent pads 126 are provided on a chip 1. Each of the permanent pads 126 is connected to various circuits in the chip 1. A semiconductor wafer test is performed by applying test probe pins 130 io the permanent pads 126 and applying a voltage and a signal to a plurality of semiconductor elements in the chip 1 via the permanent pads 126. The plurality of semiconductor elements in the chip 1 may be divided into four cell blocks: block A; block B; block C and block D.

The plurality of semiconductor elements are tested by individually testing the cell blocks in the chip. Due to voltage interference or interference caused by capacity coupling that may occur between different cell blocks (for instance, interference may occur between block A and block B), the entirety of the cell blocks should be tested simultaneously for operation. In order to complete a test of a plurality of semiconductor elements in a chip, the time proportional to the nth power of the number of cell blocks (n is a positive integer equal to or greater than 2) is required. An extended period of time is required to detect a defective block. When any of the cell blocks in a chip is found to be defective as a result of the semiconductor wafer test, the chip cannot be shipped as a produce.

Since voltage interference and interference caused by capacity coupling that occurs between different cell blocks in a chip should be considered in the related art test for testing a plurality of semiconductor elements included in the chip, the following problems nay occur.

(1) If any of the cell blocks in a chip is found to be defective, the chip cannot be used as a product.

(2) Since it is necessary to test the entirety of the chips in order to examine voltage interference or the like between different cell blocks in the chip, the time required for the test is all the more extended.

(3) Since the permanent pads are used as test pads, the test pads cannot be located at desired positions.

(4) Since the current status of technology does not allow the size of a test probe pin to be reduced beyond a certain limit (for instance, a diameter of 20 μm), the size of the permanent pad (test pad) to which the test probe pin is applied can be reduced only slightly. Accordingly, it is difficult to provide a large number of permanent pads on the chip.

A description will now be given of a fourth aspect of the problem inherent in the related art.

With the widespread use of semiconductor devices in various electronic appliances, various types of structures of a package accommodating the semiconductor that correspond to the space for mounting the electronic appliances are in use. Accordingly, the semiconductor element accommodated in the semiconductor device should be compatible with the structure of the package.

As a result of using the various types of package structures, different types of packages may be used to accommodate the sane type of semiconductor elements, particularly in the case of general-purpose semiconductor devices.

FIGS. 54 and 55 illustrates the fourth aspect of the related art problem. Referring to FIG. 54, a semiconductor device 211A is a package constructed such that leads 216 extend from shorter sides of a resin package 214A (hereinafter, such a type of resin package will be referred to as a latitudinally elongated package).

Referring to FIG. 55, a semiconductor device 211B is constructed such that leads 216 extend from longer sides of a resin package 214B (hereinafter, such a type of resin package will be referred to as a longitudinally elongated package). A semiconductor element 212A accommodated in the package 214A and a semiconductor element 212B accommodated in the package 214B have the same function.

Subsequently, a description will now be given, with reference to FIGS. 56 and 57, of how the semiconductor elements 212A and 212B are connected to the leads 216.

FIG. 56 shows how the semiconductor element 212A in the latitudinally elongated package 214A is connected to the lead 216. As shown in FIG. 56, the semiconductor element 212A should be provided to adapt to the latitudinally elongated configuration of the package 214A.

Electrodes 218A formed in the semiconductor element 212A are electrically connected to the respective leads 216 via wires 219. The wires 219 should be as short as possible in order to control the loss. Therefore, in the conventional package 214A, the electrodes 218A are often provided along the shorter sides of the semiconductor element 212B.

FIG. 57 shows how the semiconductor element 212B in the longitudinally elongated package 214B is connected to the leads 216. As shown in FIG. 57, the semiconductor element 212B should be provided to adapt to the longitudinally elongated configuration of the package 214B.

Electrodes 218B formed in the semiconductor element 212B aria electrically connected to the respective leads 216 via wires 219. The wires 219 should be as short as possible in order to control the loss. Therefore, in the conventional package 214B, the electrodes 218B are often provided along the longer sides of the semiconductor element 212B.

As described above, the semiconductor device 212A as shown in FIGS. 54 and 56 and the semiconductor device 212B as shown in FIGS. 55 and 57 are of the same function. However, the electrodes 218A and 218B are provided in different arrangements in the semiconductor device 212A and in the semiconductor device 212B. Thus, the related art has a drawback in that the semiconductor element 212A and 212B have to be produced independently due only to the different arrangements of the electrodes 218A and 218B.

In addition, the following problem is inherent in inventory management of the semiconductor devices produced according to the related art. In order to deliver semiconductor products in a short period of time in response a client order that could be expected at any moment, there has to be a corresponding volume of stock capable of producing a corresponding amount of semiconductor elements. According to the related art whereby semiconductor elements of different electrode arrangements are accommodated in packages of different structures, if the stock is prepared based on a wrong prospective order, inventory of an improper scale or a defective inventory results. For this reason, according to the related art, determination of the prospect order is such a difficult task that inventory management has become difficult.

One approach to the aforementioned drawback of the related art is to provide both the electrodes for the latitudinally elongated package and the electrodes for the longitudinally elongated package on the semiconductor element.

However, providing the electrodes for the latitudinally elongated package and the electrodes for the longitudinally elongated package on the same surface of the semiconductor element results in twice the number of electrodes as compared with the semiconductor elements 212A and 212B. Accordingly, the space required to accommodate the electrodes increases so that the semiconductor element become excessively large in scale.

SUMMARY OF THE INVENTION

Accordingly, an object of the present invention is to provide a method for testing a semiconductor wafer in which the aforementioned problem is eliminated.

Another and more specific object of the present invention is to provide a method for testing a semiconductor wafer in which reliable electrical contact between probe pins and electrodes of a semiconductor chip is ensured.

Still another object of the present invention is to provide a method for efficiently testing a plurality of semiconductor chips on a wafer by increasing the number of chips that can be simultaneously tested by a test probe card without introducing additional pads on the wafer dedicated to the wafer test.

Still another object of the present invention is to provide a method for testing various types of chips coexisting on the wafer, using a test probe card of a single type compatible with the various chip types.

Still another object of the present invention is to provide a method for efficiently performing a wafer burn-in test by supplying a signal to all the chips on the wafer.

Still another object of the present invention is to provide a method of efficiently testing a semiconductor wafer by controlling power source noise occurring while the wafer is being tested, by providing capacity as close as possible to a power supply pad on the chip.

Still another object of the present invention is to provide a method of completing a test of a plurality of semiconductor elements in a wafer efficiently and in a relatively short period of time and enabling a chip having a defective block to be used as a product.

Yet another object of the present invention is to provide a semiconductor element, a method of modifying an electrode configuration, and a semiconductor device compatible with different package structures.

The aforementioned objects can be achieved by a semiconductor wafer testing method using a probe for testing a plurality of semiconductor units formed on a surface of a semiconductor wafer; the semiconductor wafer testing method comprising the steps of: forming a temporary test film on the surface of the semiconductor wafer so as to be detachable therefrom by exfoliation, forming each of the plurality of semiconductor units on the semiconductor wafer being provided with a plurality of semiconductor unit electrodes, and providing the temporary test film with a plurality of regularly arranged test electrodes and wiring patterns for electrically connecting the plurality of regularly arranged test electrodes with corresponding ones of the plurality of semiconductor unit electrodes of the plurality of semiconductor units; testing the plurality of semiconductor units by applying a plurality of probe pins of the probe to corresponding ones of the plurality of regularly arranged test electrodes provided in the temporary test film; and detaching by the exfoliation the temporary test film from the surface of the semiconductor wafer.

The aforementioned objects can also be achieved by a semiconductor wafer testing method using a probe for testing a plurality of semiconductor units formed on a surface of a semiconductor wafer; the semiconductor wafer testing method comprising the steps of: forming a temporary test film on the surface of the semiconductor wafer so as to be detachable therefrom by chemical means, forming each of the plurality of semiconductor units on the semiconductor wafer being provided with a plurality of semiconductor unit electrodes, and providing the temporary test film with a plurality of regularly arranged test electrodes and wiring patterns for electrically connecting the plurality of regularly arranged test electrodes with corresponding ones of the plurality of semiconductor unit electrodes of the plurality of semiconductor units; testing the plurality of semiconductor units by applying a plurality of probe pins of the probe to corresponding ones of the plurality of regularly arranged test electrodes provided in the temporary test film; and detaching by the chemical means the temporary test film from the surface of the semiconductor wafer.

According to these aspects of the present invention, probe pins of a probe can be positioned with improved precision. Electrical connection between all the probe pins and the respective test electrodes can be properly established. Therefore, a full-specification test and a burn-in test can be reliably conducted on a plurality of semiconductor units on a pre-packaged semiconductor wafer. The full-specification test and the burn-in test could be conducted simultaneously.

The aforementioned objects can also be achieved by a semiconductor wafer testing method using a probe for testing a plurality of semiconductor units formed on a surface of the semiconductor wafer; the semiconductor wafer testing method comprising the steps of: forming a temporary test film on the surface of the semiconductor wafer so as to be detachable therefrom, forming each of the plurality of semiconductor units on the semiconductor wafer provided with a plurality of semiconductor unit electrodes, and providing the temporary test film with a first insulating film, first wiring pattern formed on the first insulating film so as to lead from corresponding ones of the plurality of semiconductor unit electrodes, forming a second insulating film on the first insulating film so as to cover the first wiring patterns, forming second wiring patterns on the second insulating film so as to lead from corresponding ones of junction electrodes at respective ends of the first wiring patterns and a plurality of regularly arranged test electrodes at respective ends of the second wiring patterns; testing the plurality of semiconductor units by applying a plurality of probe pins of the probe to corresponding ones of the plurality of regularly arranged test electrodes provided in the temporary test film; and detaching the temporary test film from the surface of the semiconductor wafer.

In addition to the advantages already mentioned, the invention described immediately above makes it easy to form wiring patterns.

The aforementioned objects can also be achieved by a semiconductor wafer testing method using a probe for testing a plurality of semiconductor units formed on a surface of the semiconductor wafer; the semiconductor wafer testing method comprising the steps of: forming a temporary test film on the surface of the semiconductor wafer so as to be detachable therefrom, forming each of the plurality of semiconductor units on the semiconductor wafer being provided with a plurality of semiconductor unit electrodes, providing the temporary test film with a first insulating film, forming a first wiring pattern on the first insulating film so as to lead from corresponding ones of the plurality of semiconductor unit electrodes, forming a second insulating film on the first insulating film so as to cover the first wiring patterns, forming second wiring patterns on the second insulating film so as to lead from corresponding ones of junction electrodes at respective ends of the first wiring patterns and a plurality of regularly arranged test electrodes at respective ends of the second wiring patterns, and providing the junction electrodes in the corresponding semiconductor unit having the semiconductor unit electrodes thereof connected to the junction electrodes via corresponding ones of the first wiring patterns; testing the plurality of semiconductor units by applying a plurality of probe pins of a probe to corresponding ones of the plurality of regularly arranged test electrodes provided in the temporary test film; and detaching the temporary test film from the surface of the semiconductor wafer.

According to this aspect of the invention, it is easy to form wiring patterns. Wire-bonding packaging may be performed more easily than the related art by wire-bonding the junction electrodes.

The aforementioned objects can also be achieved by a semiconductor wafer testing method comprising the steps of: forming an insulating film on a wafer carrying a plurality of semiconductor chips each including a plurality of semiconductor elements; forming a metal film connected to a first electrode leading from a corresponding one of the plurality of semiconductor elements via a hole in the insulating film; forming a temporary wiring layer adapted for a wafer test, by etching the metal film; forming a second electrode leading from the temporary wiring layer and arranging a plurality of the second electrodes at desired location on the wafer; applying a test probe pin for the wafer test to the second electrode so as to individually test the plurality of semiconductor elements; and removing the temporary wiring layer and the plurality of second electrodes when the plurality of semiconductor elements have been tested.

The aforementioned objects can also be achieved by a semiconductor wafer testing method comprising the steps of: forming a first insulating film on a wafer carrying a plurality of semiconductor chips each including a plurality of semiconductor elements; forming a first metal film connected to a first electrode leading from a corresponding one of the plurality of semiconductor elements via a hole in the first insulating film; forming a first temporary wiring layer adapted for a wafer test, by etching the first metal film; forming a second electrode leading from the first temporary wiring layer and arranging a plurality of the second electrodes at desired locations on the wafer; forming a second insulating film on the first metal film; forming a second metal film connected to the first electrode via a hole in the second insulating film; forming a second temporary wiring layer adapted for a wafer test, by etching the second metal film; forming a third electrode leading from the second temporary wiring layer and arranging a plurality of the third electrodes at desired locations on the wafer; applying test probe pins for the wafer test to the plurality of second electrodes and the plurality of third electrodes so as to individually test the plurality of semiconductor elements; and removing the first temporary wiring layer, the plurality of second electrodes, the second temporary wiring layer and the plurality of third electrodes when the plurality of semiconductor elements have been tested.

According to these aspects of the invention, the second electrodes serve as test electrodes. Since the temporary wiring layer and the second electrodes are removed after the test, the testing method according to the invention involves no restriction as to the arrangement and the number of test electrodes unlike the testing method according to the related art. There is no increase in the chip area resulting from introducing test pads dedicated to the test. The test electrodes (second electrodes) can be arranged in such a way as to maximize the number of chips to which test probe pins are simultaneously applied. Therefore, it is possible to test a plurality of semiconductor chips on a wafer efficiently and in a relatively short period of time.

By arranging test electrodes of a common type leading from the temporary wiring layer, on a plurality of chips of different types, and by applying test probe pins to the test electrodes of the common type, the chips of different types can be efficiently tested using the test probe card of a common type.

By providing test electrodes of a common type leading from the temporary wiring layer and by supplying the same signal to all the chips in the wafer via the test electrodes thus provided, it is possible to efficiently perform a wafer burn-in test. A benefit of using the test electrodes of a common type is that the number of test electrodes on the wafer is significantly reduced so that the number of test probe pins per a wafer is significantly reduced. Accordingly, the stress exerted on the wafer is significantly reduced.

By forming a first temporary wiring layer connected to the first electrode originally existing on the chip, by forming a second temporary wiring layer connected to the first electrode and isolated from the first temporary wiring layer using an insulating layer, and by connecting first and second capacity electrode layers formed in the first and second temporary wiring layers, respectively, to respective power supply pads, it is possible to provide capacity in the immediate vicinity of the power supply pads. Since the capacity electrode layers are removed after the wafer test, it is possible to reduce the power source noise occurring while the wafer test is being performed, without increasing the chip area.

In summary, the semiconductor wafer testing method according to the above aspects takes advantage of the TRT (Temporary Rerouting for Test) technology to rearrange the electrodes such as the permanent pads originally existing on the chip, by forming a temporary wiring lager connected to the originally existing electrodes, and by providing additional electrodes embodied by test pads leading from the temporary wiring layer at any desired locations on the chip. With this technology, it is possible to test a large number of chips on the wafer simultaneously and to complete a wafer test efficiently and in a relatively short period of time.

The aforementioned objects can also be achieved by a semiconductor wafer testing method comprising the steps of: forming an insulating film on a wafer carrying a plurality of semiconductor chips each including a plurality of semiconductor elements; forming a metal film connected to a first electrode leading from a corresponding one of the plurality of semiconductor elements via a hole in the insulating film; forming a second electrode at a desired location on the wafer by etching the metal film; forming a temporary wiring layer so as to include a plurality of the second electrodes; testing the plurality of semiconductor elements individually using the temporary wiring layer so as to identify a defective semiconductor element; removing the temporary wiring layer when the plurality of semiconductor elements have been tested; and rewiring only those first electrodes leading from the semiconductor elements that are found to be non-defective by the testing step.

The aforementioned objects can also be achieved by a semiconductor wafer testing method comprising the steps of: forming an insulating film on a wafer carrying a plurality of semiconductor chips each including a plurality of semiconductor elements; forming a hole in the insulating film in alignment with a first electrode leading from a corresponding one of the plurality of semiconductor elements in such a manner as to expose the first electrode; forming a metal film connected to the first electrode via the hole; forming a second electrode corresponding to the first electrode by etching the metal film and arranging a plurality of the second electrodes at desired locations on the wafer; forming a temporary wiring layer so as to include the plurality of second electrodes; testing the plurality of semiconductor elements individually using the plurality of second electrodes so as to identify ai defective semiconductor element; removing the temporary wiring layer when the plurality of semiconductor elements have been tested; and rewiring only those first electrodes leading from the semiconductor elements that are found to be non-defective by the testing step.

The aforementioned objects can also be achieved by a semiconductor wafer testing method comprising the steps of: forming an insulating film on a wafer carrying a plurality of semiconductor chips each including a plurality of semiconductor elements; forming a first hole in the insulating film in alignment with a first electrode leading from a corresponding one of the plurality of semiconductor elements in such a manner as to expose the first electrode, and forming a second hole in the insulating film in alignment with a fuse electrode including a fuse member in such a manner as to expose the fuse electrode; forming a first metal film that is in contact, via the first hole, with a contact portion of the first electrode, and forming a second metal film that is in contact, via the second hole, with a contact portion of the second electrode; forming a second electrode corresponding to the first electrode by etching the first metal film and arranging a plurality of the second electrodes at desired locations on the wafer; testing the plurality of semiconductor elements individually using the second electrode so as to identify a defective semiconductor element; causing a sufficiently large current to blow the fuse member of the fuse electrode in alignment with the defective semiconductor element, in the second electrode connected to the fuse electrode in alignment with the defective semiconductor element; removing a temporary wiring layer in which the second electrode connected to the fuse electrode in alignment with the defective semiconductor element is formed, after the fuse member of the fuse electrode in alignment with the defective semiconductor element is blown; and rewiring the plurality of semiconductor elements.

The aforementioned objects can also be achieved by a semiconductor testing method comprising the steps of: forming an insulating film on a wafer carrying a plurality of semiconductor chips each including a plurality of semiconductor elements; forming one of an identification symbol and an identification character for identifying a defective semiconductor element on the insulating film; effecting semiconductor chip production management by reading one of the identification symbol and the identification character; and removing the one of the identification symbol and the identification character after the semiconductor chip production management has been completed.

According to these aspects of the present invention, a second electrode connected to a first electrode originally existing on a chip is formed at a desired location on a wafer so that the second electrode is used as a test electrode. When a plurality of semiconductor elements have been tested individually, a temporary wiring layer including the second electrodes is removed. Therefore, no restrictions are imposed on the arrangement and the number of test electrodes. Since it is relatively easy to apply a voltage and a signal from test probe pins to the semiconductor elements, the plurality of semiconductor elements in the wafer are tested efficiently and in a relatively short period of time.

By rerouting the first electrodes of a non-defective semiconductor element to the permanent pads, wiring for a defective semiconductor element (defective cell block) is properly removed. Accordingly, the rewired chip, in which wiring is provided only for the non-defective semiconductor elements, can be shipped as a proper product.

The semiconductor wafer testing method according to the above aspects uses the TRT (Temporary Rerouting for Test) technology after the temporary wiring layer is removed, in order to reroute the first electrodes of only those semiconductor elements that are found to be non-defective as a result of a test using the temporary wiring layer. Accordingly, the semiconductor wafer test can be performed efficiently and in a relatively short period of time. In addition, redundancy may be introduced into semiconductor device production by allowing chips that include defective cell blocks to be used as a product.

The aforementioned objects can also be achieved by a semiconductor element comprising: an element main body in which electronic circuits are formed; a plurality of first electrodes arranged on a surface of the element main body in a first formation; an insulating member formed on the surface so as to be removable from the element main body by exfoliation; a plurality of second electrodes arranged on the insulating member in a second formation different from the first formation; and electrode connection means for connecting the plurality of first electrodes to the plurality of second electrodes, in a state in which the insulating member remains on the surface.

The aforementioned objects can also be achieved by an electrode arrangement modification method for modifying an arrangement of electrodes in a semiconductor element, the semiconductor element comprising: an element main body in which electronic circuits are formed; a plurality of first electrodes arranged on a surface of the element main body in a first formation; an insulating member formed on the surface so as to be removable from the element main body by exfoliation; a plurality of second electrodes arranged on the insulating member in a second formation different from the first formation; and electrode connection means fox connecting the plurality of first electrodes to the plurality of second electrodes, in a state in which the insulating member remains on the surface, wherein the electrode arrangement modification method comprises the step of selecting a desired electrode arrangement by one of maintaining the insulating member and removing the insulating member from the element main body.

The aforementioned objects can also be achieved by a semiconductor device comprising: a semiconductor element; leads electrically connected to the semiconductor element; and a package for Fl hermetically accommodating the semiconductor element, wherein the semiconductor element comprises: an element main body in which electronic circuits are formed; a plurality of first electrodes arranged on a surface of the element main body in a first formation; an insulating member formed on the surface so as to be removable from the element main body by exfoliation; a plurality of second electrodes arranged on the insulating member in a second formation different from the first formation; and electrode connection means for connecting the plurality of first electrodes to the plurality of second electrodes, in a state in which the insulating member remains on the surface.

According to these aspects of the invention, the first electrodes are formed on the element main body and the second electrodes are formed on the insulating member formed on the element main body. As a result, the first electrodes are built upon the second electrodes via the insulating member. With this construction, an increase in the area of the semiconductor element by providing the first and second electrodes is prevented so that the compact semiconductor device can be produced.

In a state where the insulating member remains on the element main body, the first electrodes and the second electrodes are electrically connected to each other via the electrode connection means. Accordingly, by connecting external terminals (for example, leads) to the second electrodes, the external terminals can be connected to the semiconductor element.

The insulating member is provided on the element body so as to be removable therefrom by exfoliation. Electrical connection between the first electrodes and the second electrodes by means of the electrode connection means is canceled when the insulating member is exfoliated from the element main body. When the insulating film is removed from the element main body, the first electrodes remain exposed on the element main body so that, by connecting the external terminals to the first electrodes, electrical connection between the externa; terminals and the semiconductor element is established by connecting the external terminals to the first electrodes.

With this arrangement, different electrode arrangements can be introduced depending on whether the insulating member remains attached to the element main body or is removed therefrom. Accordingly, the electrode arrangement adapted to the package structure can be implemented simply by maintaining the insulating member or removing the insulating member from the element main body.

BRIEF DESCRIPTION OF THE DRAWINGS

Other objects and further features of the present invention will be apparent from the following detailed description when read in conjunction with the accompanying drawings, in which:

FIG. 1A shows steps included in a method for testing a semiconductor wafer according to a first embodiment of the present invention;

FIG. 1B is a lateral section of a semiconductor wafer showing an semiconductor unit electrode;

FIG. 1C shows the semiconductor wafer provided with a temporary test film;

FIG. 1D shows how a test of the semiconductor wafer is conducted;

FIGS. 1E and 1F shows how the temporary test film is exfoliated from the surface of the semiconductor wafer;

FIGS. 4A and 4B show the construction of the temporary test film;

FIGS. 9A and 9B show a variation of how the temporary test film is removed;

DETAILED DESCRIPTION OF THE PREFERRED EMBODIMENTS

A description will now be given of how the present invention resolves, the first aspect of the problem inherent in the related art.

FIGS. 1A–1F show a method for testing a semiconductor wafer according to a first embodiment of the present invention.

As shown in FIG. 1A, the method according to the first embodiment includes a pre-test step 10 for forming a temporary test film, a test step 11 for applying probe pins of a probe to the temporary test film to test semiconductor units and a post-test step 13 for exfoliating the temporary test film after the test.

Before going into details of the first embodiment, a description will now be given of a temporary test film according to the present invention.

Figure 2:
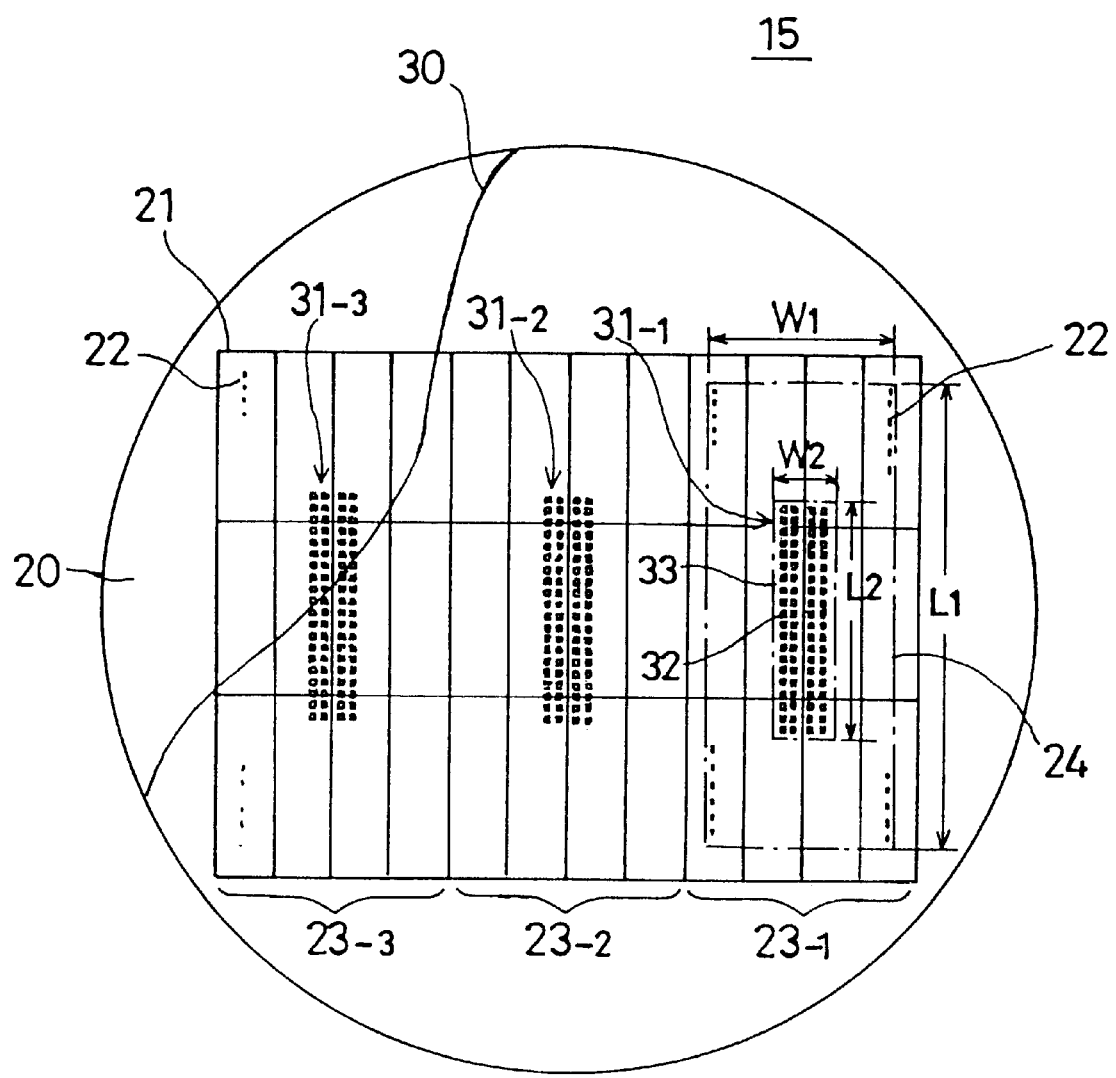
FIG. 2 is a top view of a semiconductor wafer assembly with the temporary test film.

FIG. 2 shows a semiconductor wafer assembly 15 with a temporary test film. The semiconductor wafer assembly 15 with a temporary test film comprises a semiconductor wafer 20 and a temporary test film 30 covering the entirety of the surface of the semiconductor wafer 20. For the sake of illustration, the temporary test film 30 is shown to be transparent.

The semiconductor wafer 20 is constructed such that a matrix of 36 semiconductor units (DRAM memory elements) 21 are arranged on the surface of a wafer. Each of the semiconductor units 21 has a total of N semiconductor unit electrodes 22 arranged along the center of the top surface of the semiconductor unit 21. Each of the semiconductor unit electrodes 22 is a1 by a1 in size (see FIG. 1B). The semiconductor unit electrodes are arranged at a pitch of p1. Dividing the 36 semiconductor units 21 into three groups comprising a first group 23-1, a second group 23-2 and a third group 23-3, there are N×12 semiconductor unit electrodes 22 in the first group 23-1 so that the semiconductor unit electrodes 22 are distributed over an area 24 which is L1 by W1 in size (see FIG. 2). The same applies to the second group 23-2 and the third group 23-3.

Referring to FIG. 4A, an $SiO_2$ foundation-covering film 25 is formed on a surface 20a of the semiconductor wafer 20 outside the semiconductor unit electrodes 22. The foundation-covering film 25 is firmly attached to the surface 20a of the semiconductor wafer 20 by an adhesive.

As shown in FIG. 2, the temporary test film 30 covers the entirety of the surface 20a of the semiconductor wafer 20. The temporary test film 30 is provided with a first test electrode group 31-1 that corresponds to the first group 23-1, a second test electrode group 31-2 that corresponds to the second group 23-2 and a third test electrode group 31-3 that corresponds to the third group 23-3.

Figure 3:
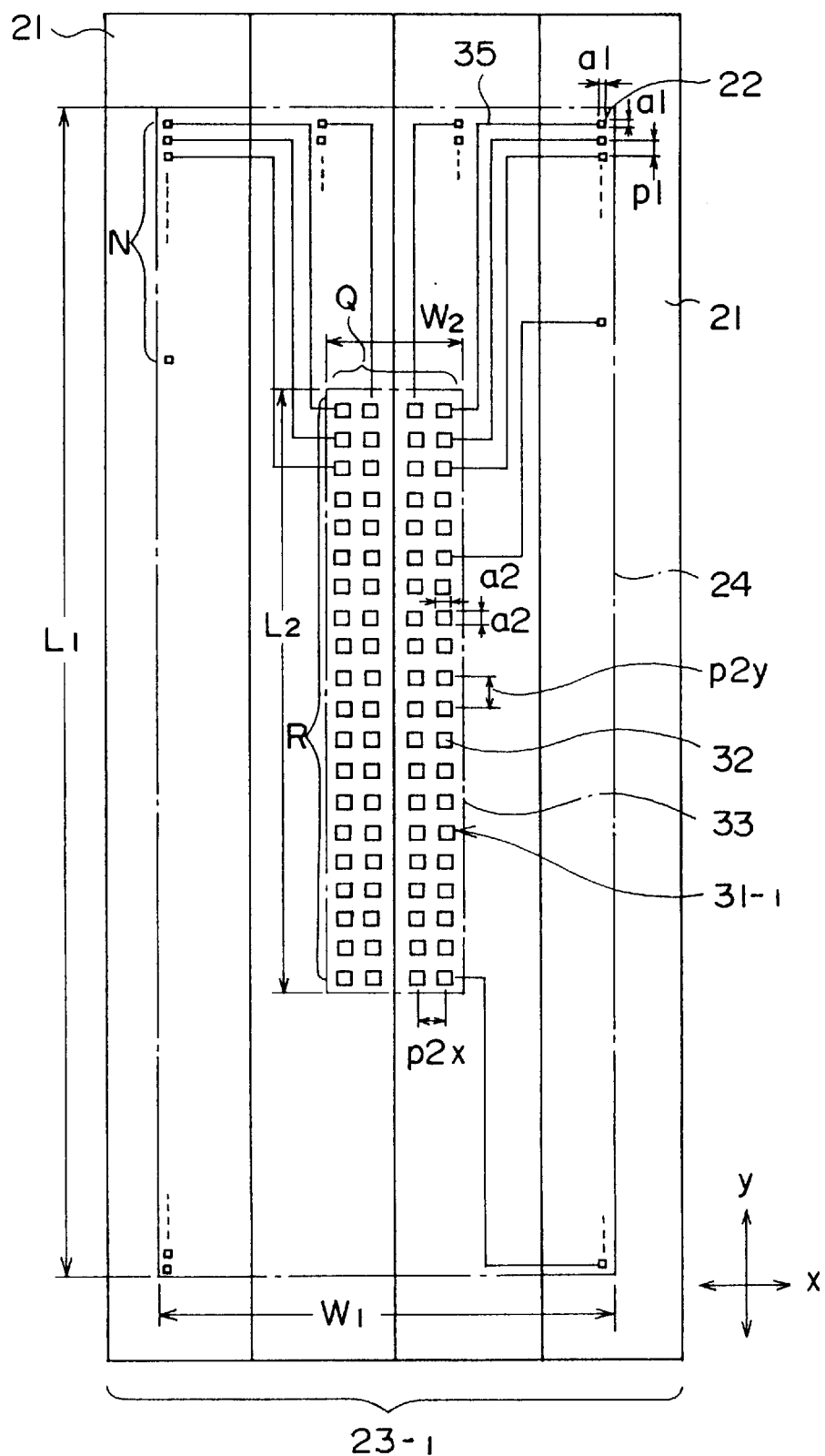
FIG. 3 is an enlarged view of the semiconductor wafer assembly of FIG. 2.

As is also shown in FIG. 3, the first test electrode group 31-1 consists of a total of N×12 test electrodes 32 regularly arranged in a matrix of Q by R in a area 33 of a size L2 by W2 at the center of the first group 23-1 comprising 12 semiconductor units 21. Each of the test electrodes 32 is a2×a2 in size (see FIGS. 4A and 4B). The test electrodes 32 are arranged at a lateral pitch p2x in the X direction and a longitudinal pitch p2y in the Y direction (see FIG. 3).

It is assumed that L1≈50 mm, W1≈30 mm, a1≈0.1 mm, p1≈0.2 mm, L2≈30 mm, W2≈10 mm, a2≈0.2 mm, p2x≈0.5 mm and p2y≈1.0 mm. Given that N=50, configuring the matrix such that Q=20 and R=30 ensures that L2<L1 and W2<W1. As a result, the area 33 is substantially smaller than the area 24. However, it is to be noted that a2>a1, meaning that the size of each of the test electrodes 32 is greater than the size of the semiconductor unit electrode 22. Since p2x>p1 and p2y>p1, the separation between adjacent test electrodes 32 is larger than the separation between adjacent semiconductor unit electrodes 22.

The test electrodes 32 can be regularly arranged in a relatively small area 33 because the temporary test film 30 is removed later by exfoliation.

The temporary test film 30 further has a total of N×12 wiring patterns 35. As shown in FIGS. 4A and 4B, the wiring patterns 35 lead from the semiconductor unit electrodes 22 of the 12 individual semiconductor units 21 constituting the first group 23-1 and extend to the center of the first group 23-1. Each of the test electrodes 32 is provided at the end of the corresponding wiring pattern 35 so as to electrically connect one of the semiconductor unit electrodes 22 to the corresponding one of the test electrodes 32. The N×12 wiring patterns 35 provide one-to-one correspondence between the N×12 semiconductor unit electrodes 22 and the N×12 test electrodes 32.

As described above, the test electrodes 32 are re-placements of the semiconductor unit electrodes 22, facilitating the application of the probe to the semiconductor wafer 20.

The second group 23-2 and the third group 23-3 are constructed in the same manner as described above.

As shown in FIG. 4A, the temporary test film 30 is also provided with an insulating film 36.

For example, the insulating film 36 could be formed mainly of an olefin resin with an epoxy resin mixed with a predetermined density. The insulating film 36 covers the entirety of the foundation-covering film 25 except the semiconductor unit electrodes 22. The olefin resin with a mixture of epoxy resin ensures that a release of the insulating film 36 occur when heated beyond a decomposition temperature of the epoxy resin. Thus, the insulating film 36 is prevented from being permanently bonded to the foundation-covering film 25. A certain exfoliative force applied to the insulating film 36 removes it from the foundation-covering film 25. The insulating film 36 may also be formed of a polyimide containing an epoxy.

The wiring patterns 35 and the test electrodes 32 are formed on the insulating film 36.

A description will now be given of how the semiconductor wafer is tested according to the first embodiment.

First, the pre-test step 10 for forming the temporary test film 30 will be described.

Figure 5A:
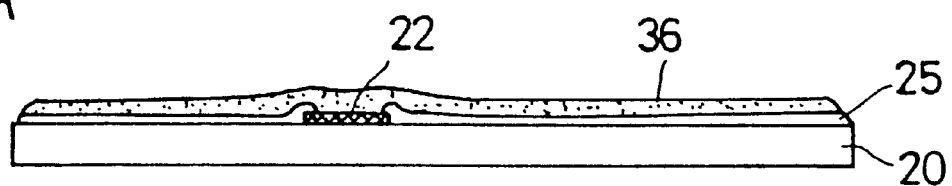
FIGS. 5A–5D show how the temporary test film is formed on the surface of the semiconductor wafer.

As shown in FIG. 5A, a olefin resin containing an epoxy is applied to the foundation-covering film 25 of the surface 20a of the semiconductor wafer 20 so as to form the insulating film 36.

Figure 5B:
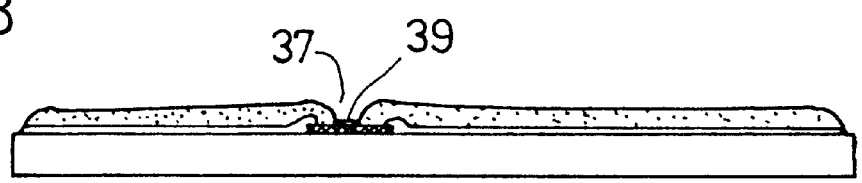

Referring to FIG. 5B, a window 37 is opened in the insulating film 36 so as to expose the semiconductor unit electrodes 22. In case the insulating film 36 is photosensitive, the window 37 is formed by directly exposing the insulating film 36. In case the insulating film 36 is not photosensitive, a photoresist is applied to the insulating film 36 before exposure. The conventional photolithographic technique is employed to develop and etch the photoresist so that the window 37 is formed. An organic material is applied to the semiconductor unit electrodes 22 exposed through the window 37 so as to form an organic film 39. The organic film 39 ensures that the wiring patterns 35 are easily exfoliated from the semiconductor unit electrodes 22 in the post-test step 13 described later. Instead of forming the organic film 39, the foundation-covering film 25 could be made to partially cover the semiconductor unit electrodes 22 to achieve the same objective.

Figure 5C:
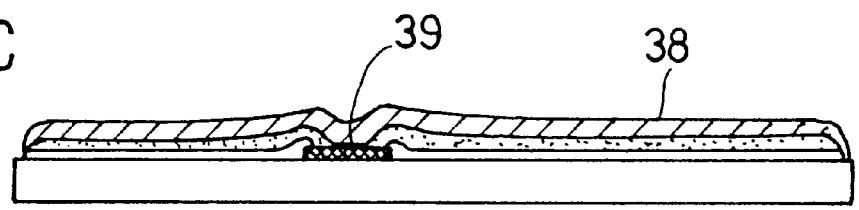
Figure 5D:
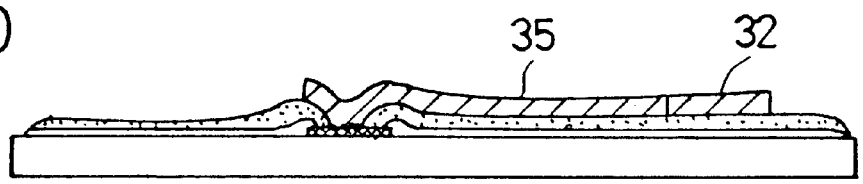

Referring now to FIG. 5C, a metal film 38 of, for example, an aluminum, is formed on the entirety of the insulating film 36 by a sputtering technique or an evaporation technique. Finally, etching is performed so as to form the wiring patterns 35 and the test electrodes 32, as shown in FIGS. 5C, 1C and 4B. The organic film 29 prevents the wiring patterns 35 from being permanently bonded to the semiconductor unit electrodes 22. Electrical connection between the wiring patterns 35 and the semiconductor unit electrodes 22 is properly established.

Thus, the temporary test film 30 is formed.

The test step 11 will now be described. As shown in FIG. 1D, probe pins 42 of a probe 41 connected to a test device 40 are applied to the test electrodes 32 of the first test electrode group 31-1. In this state, the test device 40 supplies a signal to the 12 semiconductor units 21 constituting the first group 23-1 so as to monitor an output from the semiconductor units 21. In this way, a full-specification test and a burn-in test of the 12 semiconductor units constituting the first group 23-1 are carried out simultaneously.

Subsequently, the probe 41 is shifted in the direction indicated by the arrow A1 so as to apply the probe pins 42 to the test electrodes 32 of the second test electrode group 31-2. In this way, a full-specification test and a burn-in test of the 12 semiconductor units 21 constituting the second group 23-2 are carried out simultaneously. Subsequently, the probe 41 is shifted in the direction indicated by the arrow A2 so as to apply the probe pins 42 to the test electrodes 32 of the third electrode group 31-3. In this way, a full-specification test and a burn-in test of the 12 semiconductor units 21 constituting the third group 23-3 are carried out simultaneously. Appropriate means (not shown) is used to identify the group to which the tested semiconductor units belong.

Figure 12:
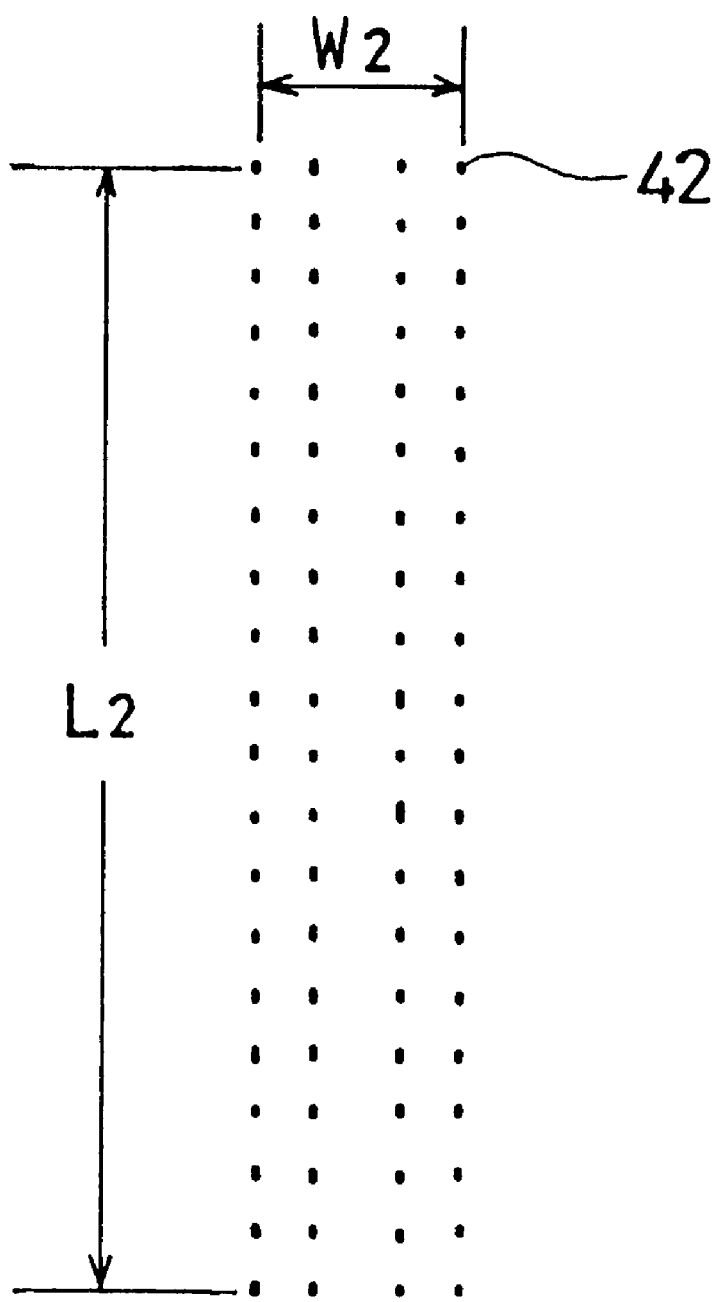
FIG. 12 show an arrangement of probe pins of a probe.

Since the test electrodes 32 of each of the first, second and third test electrode groups 31-1, 31-2 and 31-3 are arranged in a Q×R matrix in the area 33 of the size L2 by W2, the probe 41 is constructed such that the probe pins 42 are arranged in a Q×R matrix in the area 33 of the size L2 by W2, as shown in FIG. 12.

Since the area 33 of the size L2 by W2 is relatively small, the pinheads of the probe pins 42 can be positioned with a higher precision than the pinheads of the probe pins as positioned in a relatively widely distributed pin arrangement according to the related art. Accordingly, all the probe pins 42 of the probe 41 are applied to the corresponding test electrodes 32 with high reliability, resulting in highly reliable electrical connection between all the probe pins 42 of the probe 41 and the corresponding test electrodes 32. Since electrical connection of the probe pins 42 of the probe 41 with the test electrodes 32 is ensured, it is possible to perform a full-specification test and a burn-in test.

Referring now to FIGS. 1E and 1F, the post-test step 13 will be described. As shown in FIGS. 1E and 1F, the insulating film 36 is exfoliated from the foundation-covering film 25 so that the temporary test film 30 is removed from the semiconductor wafer 20.

Thanks to the organic film 39, the wiring patterns 35 are easily exfoliated from the semiconductor unit electrodes 22.

Thereafter, the semiconductor wafer 20 is processed in accordance with the test result.

A description will now be given of variations of the first embodiment.

Figure 6A:
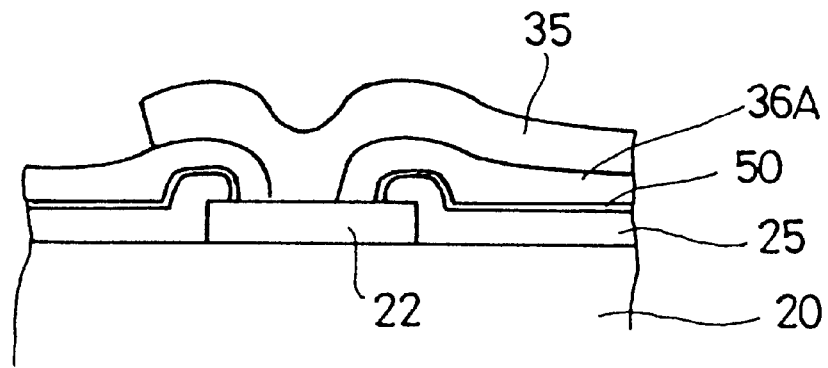
FIGS. 6A and 6B show variations of an insulating film and a foundation-covering film.

A first variation concerns an insulating film and a foundation-covering film. As shown in FIG. 6A, a release film 50 containing a component that facilitates a release may be formed on the surface of the foundation-covering film 25. A polyimide may be applied to the release film 50 so as to form an insulation film 36A. The insulating film 36A is exfoliated from the release film 50.

Figure 6B:
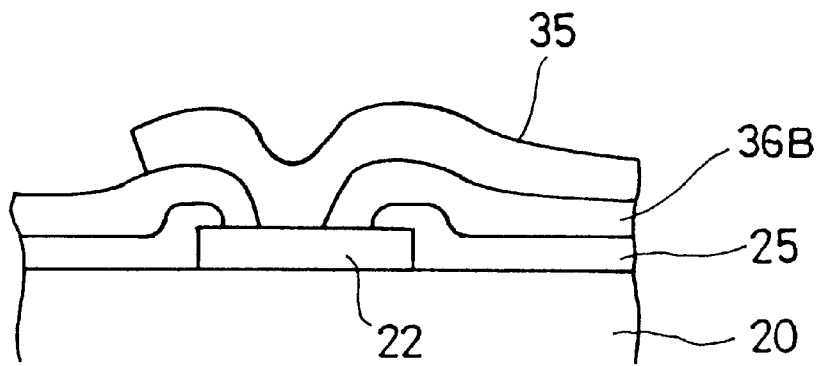

A second variation also concerns an insulating film and a foundation-covering film. As shown in FIG. 6B, an insulating film 36B formed of an organic insulating material (photoresist) which decomposes at 150–300° C. may be formed on the surface of the foundation-covering film 25. When the test is completed, the semiconductor wafer 20 is heated to 150–300° C. By heating the semiconductor wafer 20, the organic insulating material forming the insulating film 36B partially decomposes so that adhesion of the insulating film 36B to the foundation-covering film 25 is lessened, facilitating exfoliation of the insulating film 36B.

Figure 7:
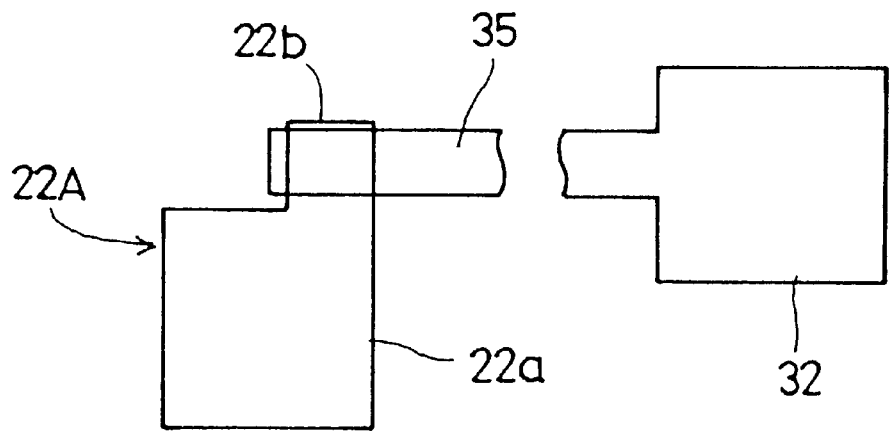
FIG. 7 shows a variation of a wiring pattern.

A third variation concerns wiring patterns. As shown in FIG. 7 the variation uses an semiconductor unit electrode 22A comprising a main electrode 22a and a sub-electrode 22b that projects from the main electrode 22a. The wiring pattern 25 leads off from the sub-electrode 25b. With this arrangement, stress is exerted only on the sub-electrode 22b when the insulating film is exfoliated. Since no stress is exerted on the main electrode 22a, the main electrode 22a is prevented from being damaged.

Figure 8A:
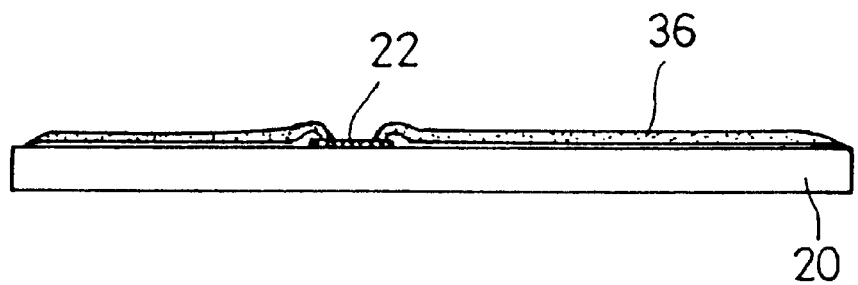
FIGS. 8A and 8B show, variations of how the temporary test film is removed.

A fourth variation concerns removal of the temporary test film 30. As shown in FIG. 8A, the wiring patterns 35 and the test electrodes 32 may be chemically removed from each other using an acid or an alkali. The insulating film 36 remains unremoved.

Figure 8B:
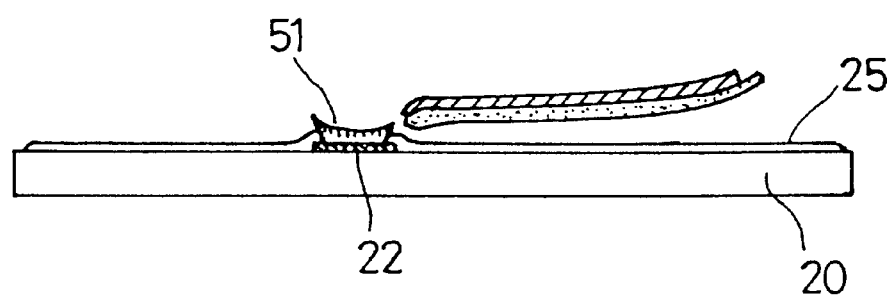

A fifth variation also concerns removal of the temporary test film 30. As shown in FIG. 8B, the insulating film 36 could se exfoliated from the foundation-covering film 25 so that the temporary test film 30 is removed from the semi-conductor wafer 20. In this process, each of the wiring patterns 35 could be ripped off at an area immediately adjacent to the corresponding ones of the semiconductor unit electrodes 22 so that a portion of the wiring pattern 35 immediately adjacent to the semiconductor unit electrode 22 remains unremoved. In FIG. 8B, numeral 51 indicates a metal-film piece from the wiring pattern 35 that remains attached to the semiconductor unit electrode 22.

A sixth variation also concerns removal of the temporary test film 30. FIGS. 9A and 9B show another example where a portion of the wiring pattern 35 immediately adjacent to the semiconductor unit electrode 22 remains unremoved. As shown in FIG. 9A, the wiring pattern 35 and the test electrode 32 are chemically resolved and removed from each other, using an acid or an alkali. Since the window 37 has an inverse trapezoid cross section, the wiring pattern 35 indicated by the alternate long and two short dashes line in the encircled enlarged view is resolved in the window 37 until the portion indicated by the solid line remains.

Subsequently, a chemical agent is used to resolve and remove the insulating film 36 from the semiconductor wafer 20. As a result, a metal-piece portion 52 from the wiring pattern 35 remains attached to the semiconductor unit electrode 22, as shown in FIG. 9B.

Figure 10A:
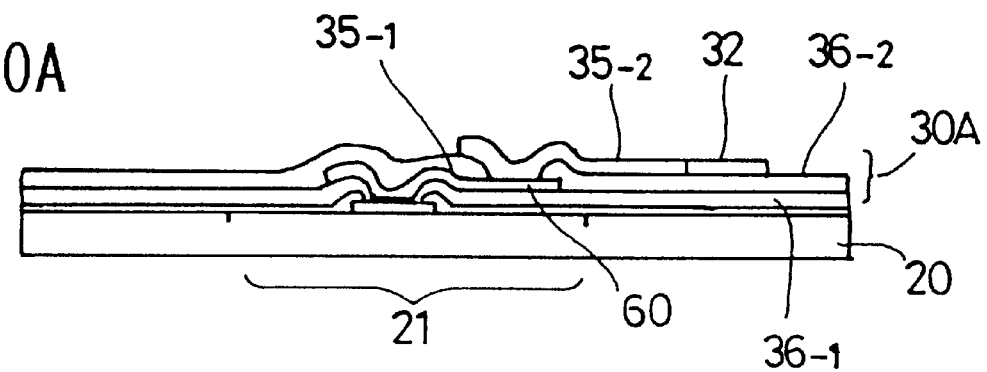
FIGS. 10A and 10B show a variation of the temporary test film.
Figure 10B:
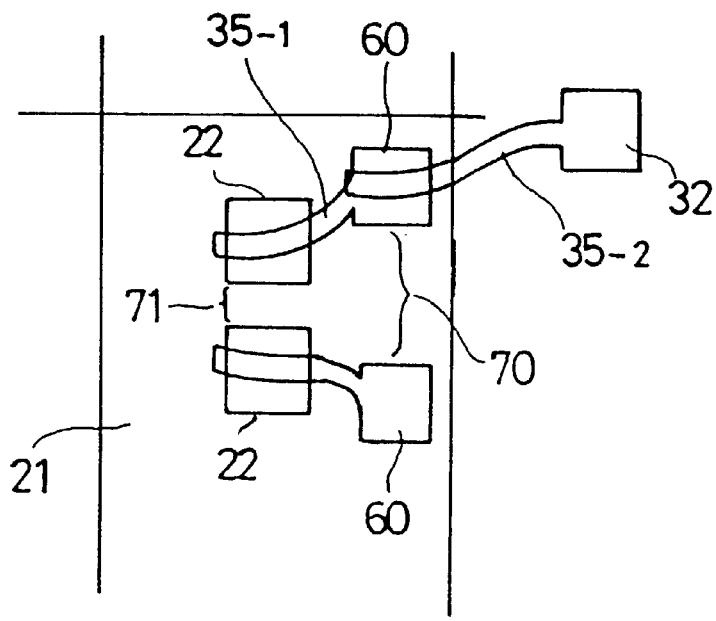

A seventh variation concerns a temporary test film. As shown in FIGS. 10A and 10B, a temporary test film 30A according to the seventh variation includes two-layer wiring patterns. More specifically, the temporary test film 30A consists of a first insulating film 36-1, first wiring patterns 35-1, a second insulating film 36-2 and second wiring patterns 35-2.

Like the insulating film 36, the first insulating film 36-1 and the second insulating film 36-2 are provided such that they can be exfoliated easily.

The first insulating film 36-1 is formed so as to cover the foundation-covering film 25.

Each of the first wiring patterns 35-1 leads off from the corresponding semiconductor unit electrode 22 to extend on the first insulating film 36-1 and has a junction electrode 60 at the end thereof. The first wiring patterns 35-1 and the junction electrodes 60 are located within the extent of the semiconductor unit 21 having those semiconductor unit electrodes 22.

The second insulating film 36-2 is formed to cover the first insulating film 36-1 and the first wiring patterns 35-1.

Each of the second siring patterns 35-2 leads off from the corresponding junction electrode 60 to extend on the second insulating film 36-2 and has the test electrode 32 at the and thereof.

A test is conducted by applying the probe pins 42 of the probe 41 to the test electrodes 32.

Figure 11A:
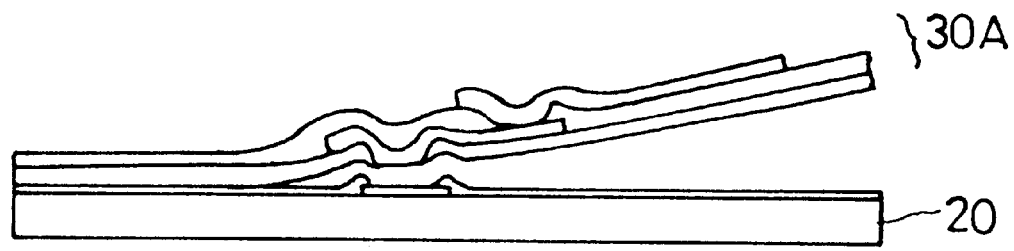
FIGS. 11A and 11B show how the temporary test film of FIGS. 10A and 10B is removed.
Figure 11B:
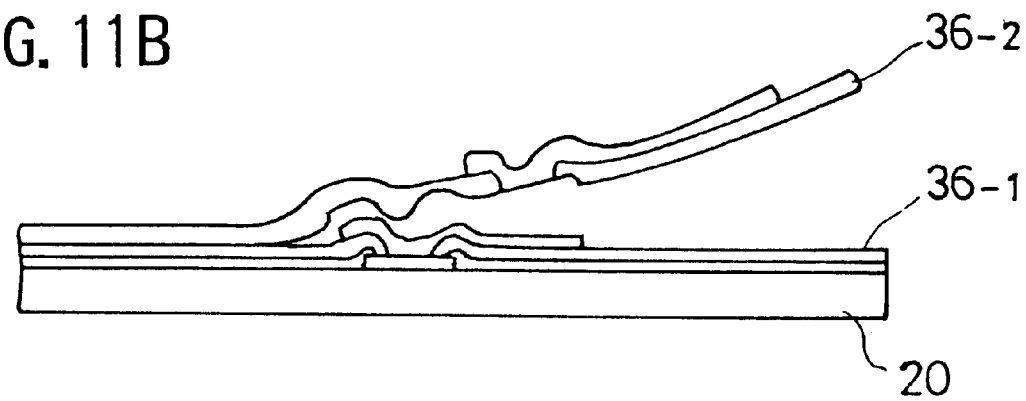

When the test is completed, the temporary test film 30A is exfoliated as shown in FIG. 11A or as shown in FIG. 11B.

In one mode of exfoliation shown in FIG. 11A, the entirety of the temporary test film 30A is exfoliated.

In another mode of exfoliation shown in FIG. 11B, the second insulating film 36-2, the second wiring pattern 35-2 and the test electrodes 32 are exfoliated. The first insulating film 36-1, the first wiring patterns 35-1 and the junction electrodes 60 remain on the semiconductor unit 21 even after scribing the semiconductor wafer 20. Packaging could be performed by wire-bonding the junction electrodes 60.

As shown in FIG. 10B, a gap 70 between the adjacent junction electrodes 60 is larger than a gap 71 between the adjacent semiconductor unit electrodes 22. Therefore, leading a wiring pattern through the gap 70 between the adjacent junction electrodes 60 is easier than leading a wiring pattern through the gap 71 between the adjacent semiconductor unit electrodes 22. Providing the junction electrodes 60 ensures that wiring patterns with a relatively high density around the test electrodes 32 are formed efficiently.

It is to be appreciated that the probe 41 can be used to test other types of semiconductor wafers. Even if the arrangement of the semiconductor unit electrodes on the semiconductor unit differs from one type to another, the same arrangement of the test electrodes as used in the above can be used. Accordingly, only one type of probe is needed in a factory which manufactures a plurality of types of semiconductor wafers, resulting in reduction of the cost.

A description will now be given of how the present invention resolves the second aspect of the problem inherent in the related art.

Figure 16:
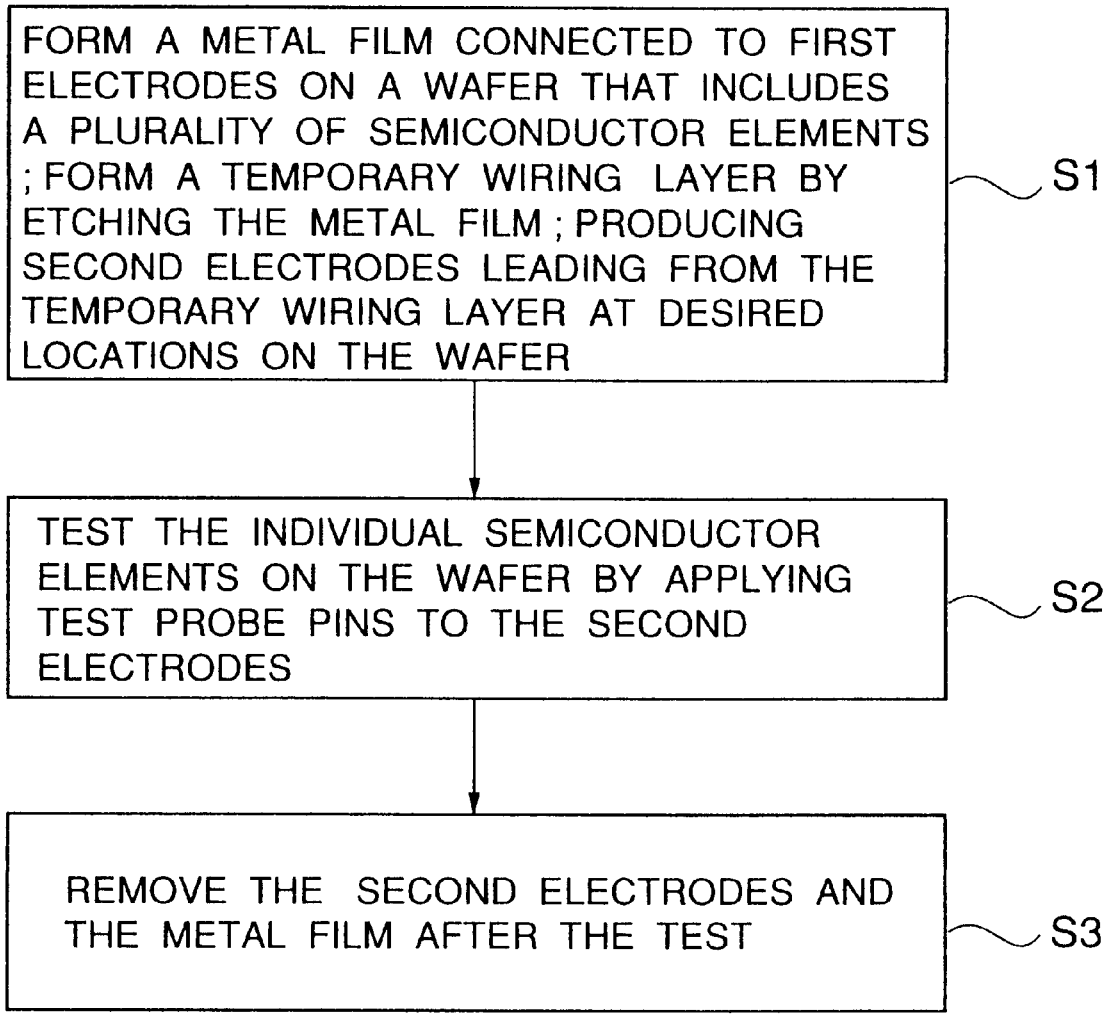
FIG. 16 is a flowchart showing the principle of a semiconductor wafer testing method for resolving the second aspect of the related art problem.

FIG. 16 is a flowchart showing the principle of a semiconductor wafer testing method according to the present invention for resolving the second aspect of the related art problem.

In step S1, an insulating film is formed on a wafer that includes a plurality of semiconductor chips. A metal film connected, via a hole in the insulating film, to a first electrode leading from each of the plurality of semiconductor chips is formed. A temporary wiring layer adapted for a wafer test is formed by etching the metal film. A second electrode leading from the temporary wiring layer is formed at an appropriate location on the wafer.

In step S2, individual semiconductor chips on the wafer are tested by applying test probe pins for a wafer test to the second electrodes.

In step S3, the temporary wiring layers and the second electrodes are removed after the test.

Figure 14:
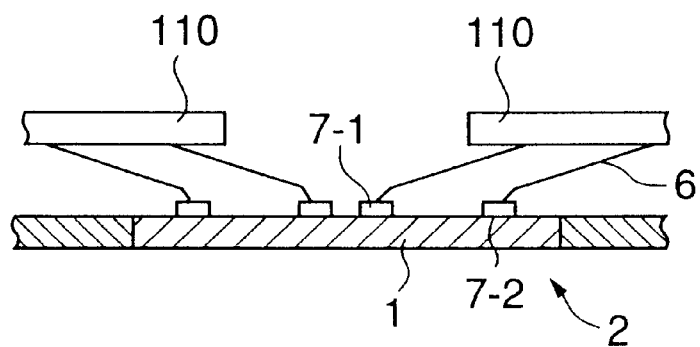
FIG. 14 is a side view showing how a semiconductor wafer is tested according to the related art.
Figure 15:
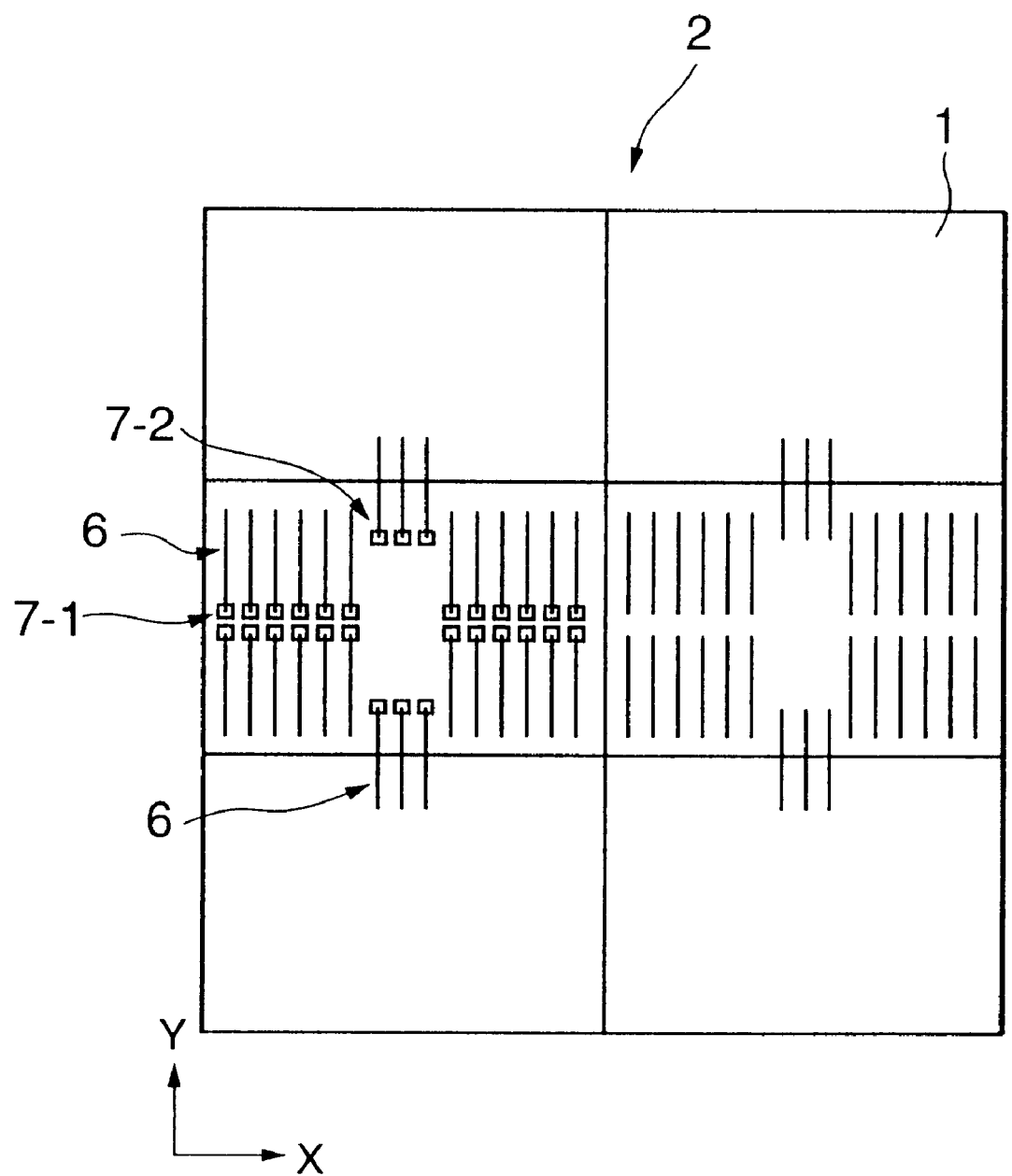
FIG. 15 is a top view showing how a plurality of chips are tested according to the related art.

A description will now be given, with reference to FIGS. 17–36, of a testing method according to a second embodiment directed to the second aspect of the related art problem. In FIGS. 17–36, those elements that correspond to the elements of FIGS. 13–15 are designated by the same reference numerals.

Figure 17:
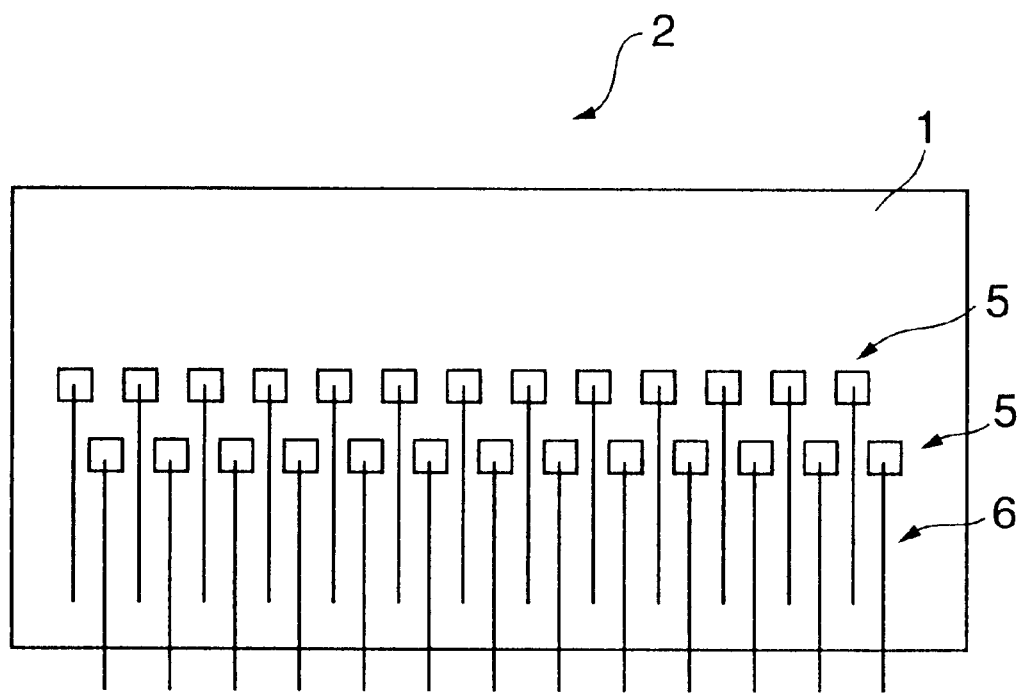
FIG. 17 is a top view showing a semiconductor testing method according to a second embodiment.
Figure 18:
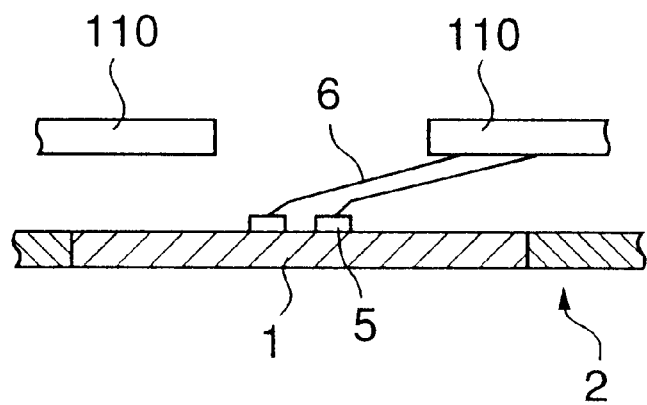
FIG. 18 is a side view showing a semiconductor testing method according to a second embodiment.
Figure 19:
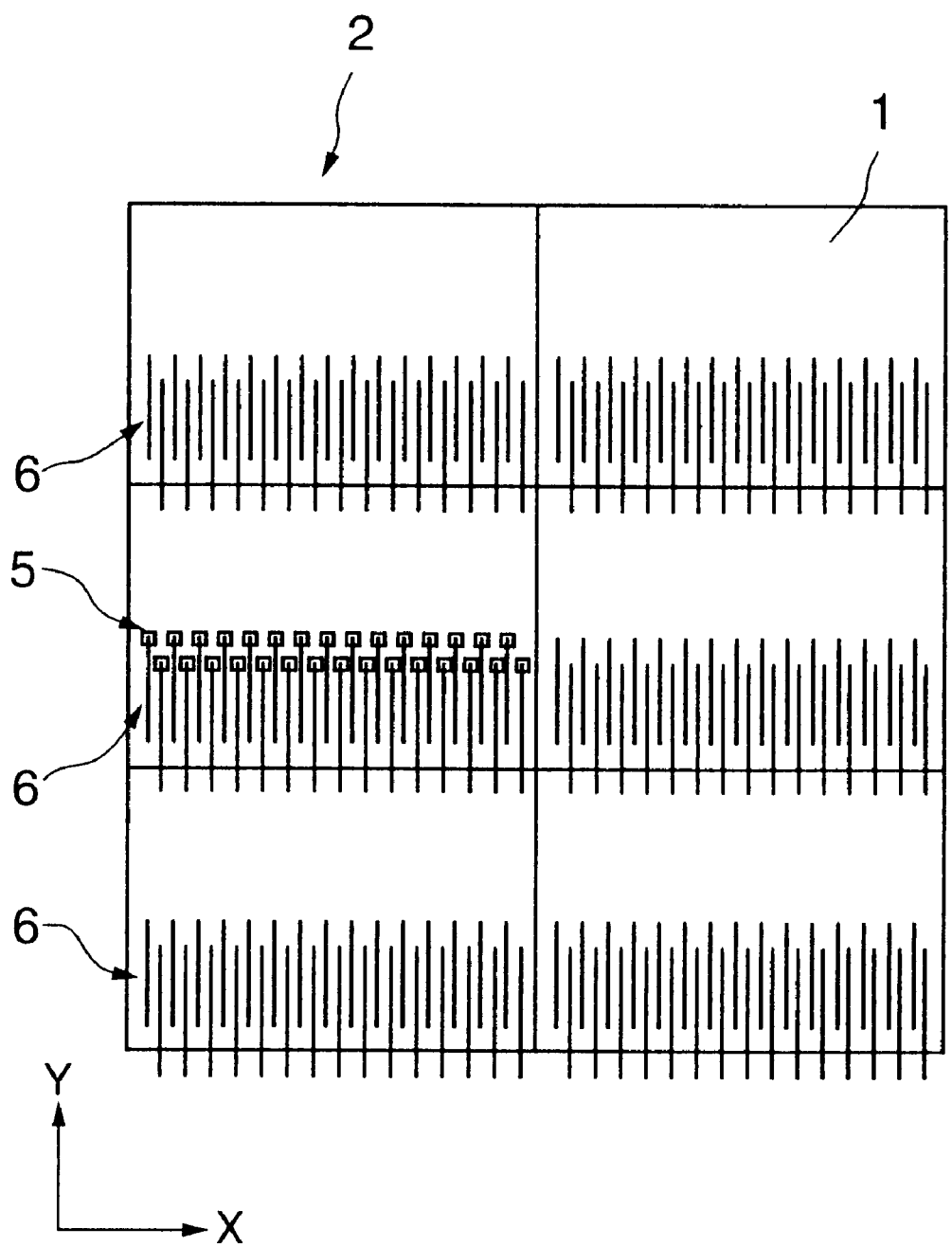
FIG. 19 is a top view showing how a block of semiconductor chips arranged in the X direction and in the Y direction are simultaneously tested according to the second embodiment.

FIGS. 17 and 18 are a top view and a side view, respectively, showing the semiconductor testing method according to the second embodiment. FIG. 19 is a top view showing how the chips arranged in the X direction and in the Y direction are simultaneously tested according to the second embodiment.

Figure 13:
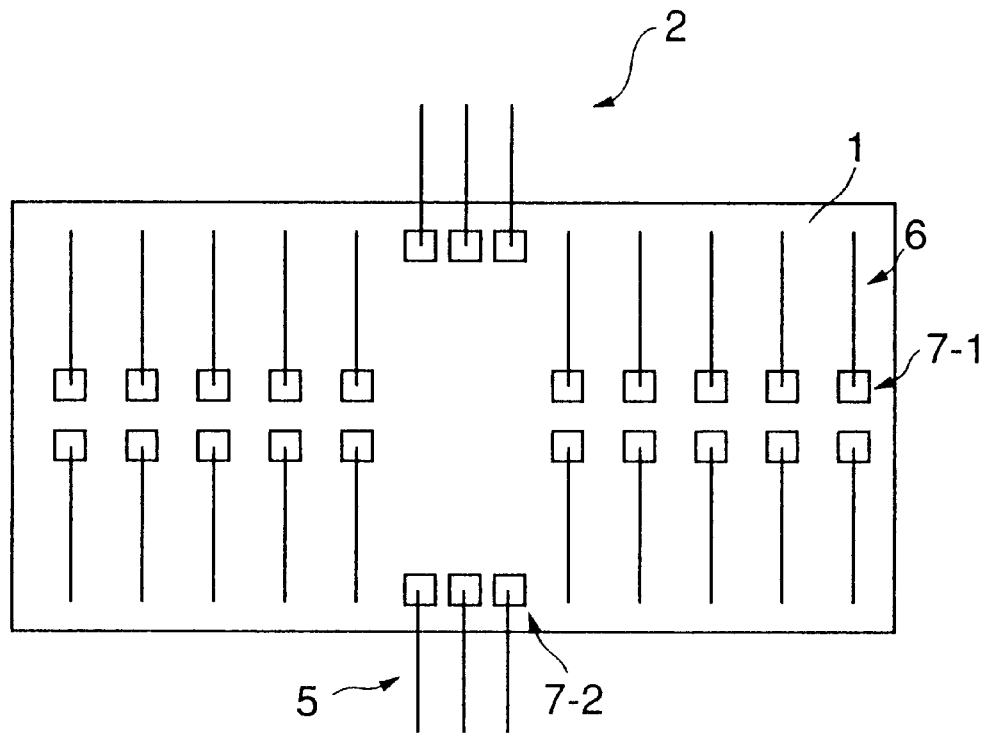
FIG. 13 is a top view showing how a semiconductor wafer is tested according to the related art.

In the second embodiment illustrated in FIGS. 17–19, a metal film is formed so as to be connected to a corresponding one of a plurality of first electrodes (for example, the permanent pads 7-1 and 7-2 as shown in FIG. 13) connected to a plurality of chips 1 on the wafer 2. A temporary wiring layer is formed by etching the metal film. A second electrode 5 leading from the temporary wiring layer is formed at a desired location on the wafer 2. By arranging the second electrodes 5 at regular intervals in two directions at right angles to each other, for example, by arranging the second electrodes 5 near the center of each chip 1 at regular intervals in the X direction and in the Y direction as shown in FIGS. 17–19, the test probe pins 6 can be simultaneously applied to the second electrodes 5 of a plurality of chips 1.

Therefore, the second embodiment ensures that the input/output signal and the power supply voltage are simultaneously supplied from the test probe card 110 to a large number of chips via the test probe pins 6. As a result, the number of chips that can be simultaneously tested is increased as compared to the related art. Accordingly, the time required to complete a test of the entirety of the chips 1 in the wafer 2 can be significantly reduced.

Describing the second embodiment in further details, by forming the temporary wiring layer connected to the first electrode such as the permanent pad originally located on the chip 1, and by forming the second electrode 5 leading from the temporary wiring layer, it is ensured that the second electrode 5 can be used as a test electrode (hereinafter, the second electrode may sometimes be referred to as a temporary test pad). Since the temporary wiring layer and the second electrode 5 are removed after the entirety of the chips 1 on the wafer 2 have been tested, no restrictions are imposed on the arrangement and the number of the test electrodes, unlike the related art testing method as described with reference to FIGS. 13–15. This makes it possible to arrange the test electrodes in such a way as to maximize the number of chips to which the test probe pins 6 are simultaneously applied. Accordingly, it is possible to perform a semiconductor water test efficiently and in a relatively short period of time.

A description will now be given of specific processes for forming and removing the second electrode on the chip.

Figure 20:
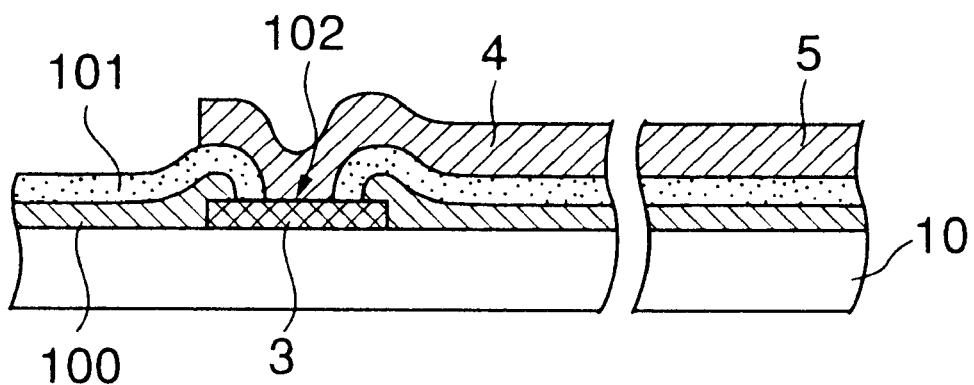
FIG. 20 is a sectional view showing a construction of a second electrode and a temporary wiring layer used in the second embodiment.
Figure 21:
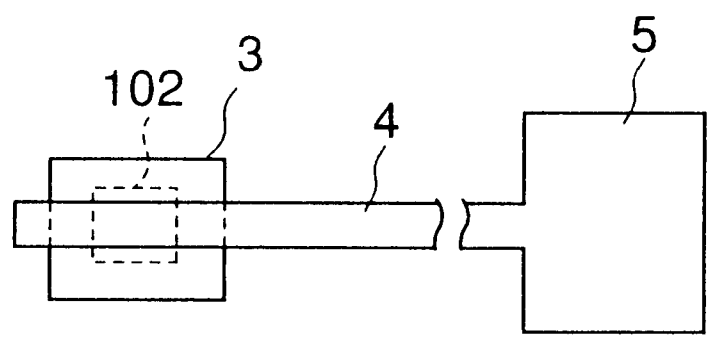
FIG. 21 is a top view showing the construction of the second electrode and the temporary wiring layer used in the second embodiment.

FIGS. 20 and 21 are a sectional view and a top view, respectively, showing the construction of the second electrode and the temporary wiring layer used in the second embodiment. In the top view of FIG. 21, illustration of an insulating film is omitted.

Referring to FIGS. 20 and 21, a cover film 100 is formed in order to protect the first electrode 3 leading from a plurality of semiconductor chips 1. An insulating film 101 is formed on the cover film 100 to which a metal film is attached. By etching the metal film (see FIG. 20) by a sputtering technique or an evaporation technique, a temporary wiring layer 4 and the second electrode 5 are formed.

The temporary wiring layer 4 electrically connected to the second electrode 5 is in direct contact with a contact portion 102 on the first electrode 3 via a hole formed in the insulating film 101. The second electrode 5 is formed so as to be sufficiently larger than the first electrode 3 to ensure proper contact with the test probe pin 6 (see, for example, FIG. 17) for testing individual semiconductor elements in the chip. For example, the second electrode 6 is formed to be as large as 100 $\mu$m×100 $\mu$m. It is unlikely that improper connection occurs between the test probe 6 (having a diameter of, for example, 20 $\mu$m) and the second electrode 5.

FIGS. 22A–22D are sectional views showing a process whereby the temporary wiring layer 4 and the second electrode 5 are formed.

Figure 22A:
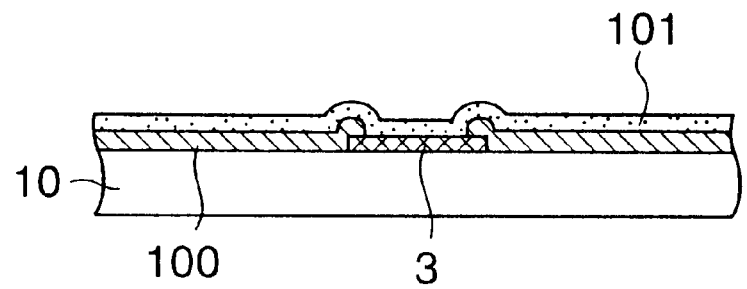
FIGS. 22A–22D are sectional views showing a process whereby the temporary wiring layer and the second electrode are formed.

First, as shown in FIG. 22A, the insulating film 101 is formed on the cover film 100. One of the following methods may be used to form the insulating film 101.

i) An agent providing a release force for preventing permanent bondage between the cover film 100 and the insulating film 101 is applied to a certain density on the cover film 100, whereupon the insulating film 101 is formed on the cover film 100.

ii) An agent providing a release force for preventing permanent bondage between the cover film 100 and the insulating film 101 is applied to a certain density on the insulating film 101, whereupon the insulating film 101 is formed on the cover film 100.

iii) The insulating film 101 is formed of an organic insulating material decomposed at a temperature of 150–300°. By heating the insulating film 101 thus formed at a temperature higher than the temperature that occurred at formation, a portion of the insulating film 101 is decomposed so that bondage between the insulating film 101 and the cover film 100 is weakened. As a result, the insulating film 101 is removed from the cover film 100.

iv) The insulating film 101 is formed of an organic material subject to abrupt decomposition at a certain temperature. The insulating film 101 is removed from the cover film 100 by heating the insulating film 101 at a temperature higher than the temperature that occurred at formation.

v) The insulating film 101 is formed of an organic material resolvable in a solvent (for example, a photoresist).

Figure 22B:
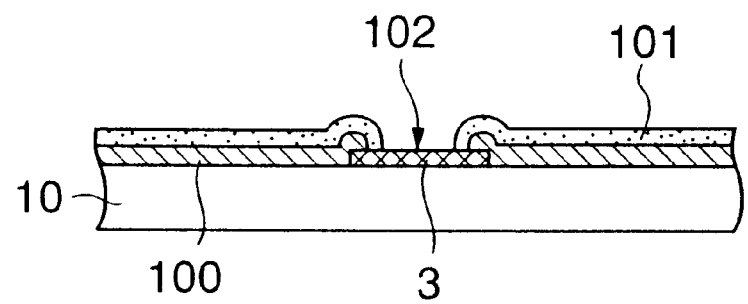

In a subsequent step as shown in FIG. 22B, the contact portion 102 So be connected to the temporary wiring layer 4 is formed by forming a window in the insulating film 101 in alignment with the first electrode 3.

Figure 22C:
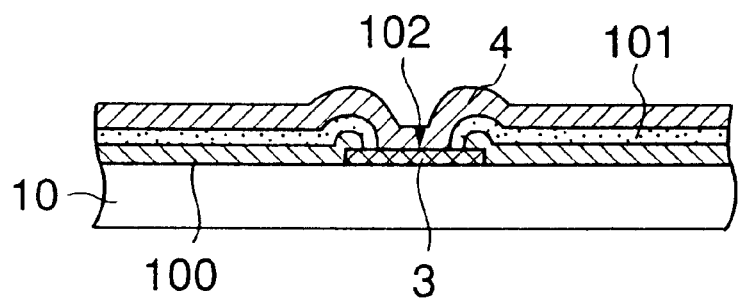

In a subsequent step as shown in FIG. 22C, a metal film is formed on the contact portion 102 by a sputtering technique or an evaporation technique.

Figure 22D:
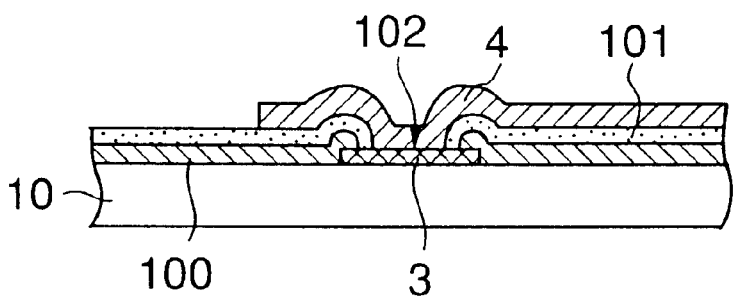

In a subsequent step as shown in FIG. 22D, the temporary wiring layer 4 and the second electrode 5 (see FIGS. 20 and 21) are formed by etching the metal film to a desired configuration.

Figure 23:
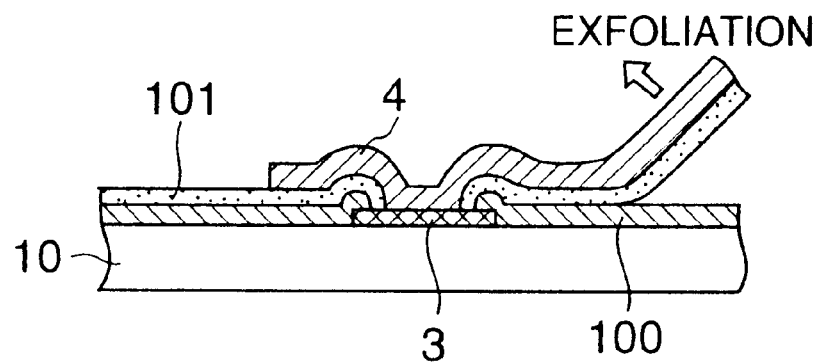
FIG. 23 is a sectional view showing how the temporary wiring layer and the second electrode formed according to the steps illustrated in FIGS. 22A–22D are removed.

FIG. 23 is a sectional view showing how the temporary wiring layer and the second electrode formed according to the steps illustrated in FIGS. 22A–22D are removed.

Referring to FIG. 23, the temporary wiring layer 4 and the second electrode 5 (see FIGS. 20 and 21) are removed after the plurality of semiconductor elements in the chip have been tested, by simultaneously removing the metal film and the insulating film 101. One of the following three methods may be used to remove the temporary wiring layer 4 and the second electrode 5.

a) The insulating film 101 is removed by exfoliation from the cover film 100 to which the insulating film 101 is relatively weakly bonded.

b) The organic insulating film 101 is heated beyond a decomposition temperature so as to decompose a portion of the organic insulating film 101 and remove the organic insulating film 101 from the cover film 100.

c) The insulating film 101 is removed from the cover film 100 by resolving the insulating film 101 in a solvent.

A description will now be given, with reference to FIGS. 24–26, of a testing method according to a third embodiment directed to the second aspect of the related art problem.

Figure 24:
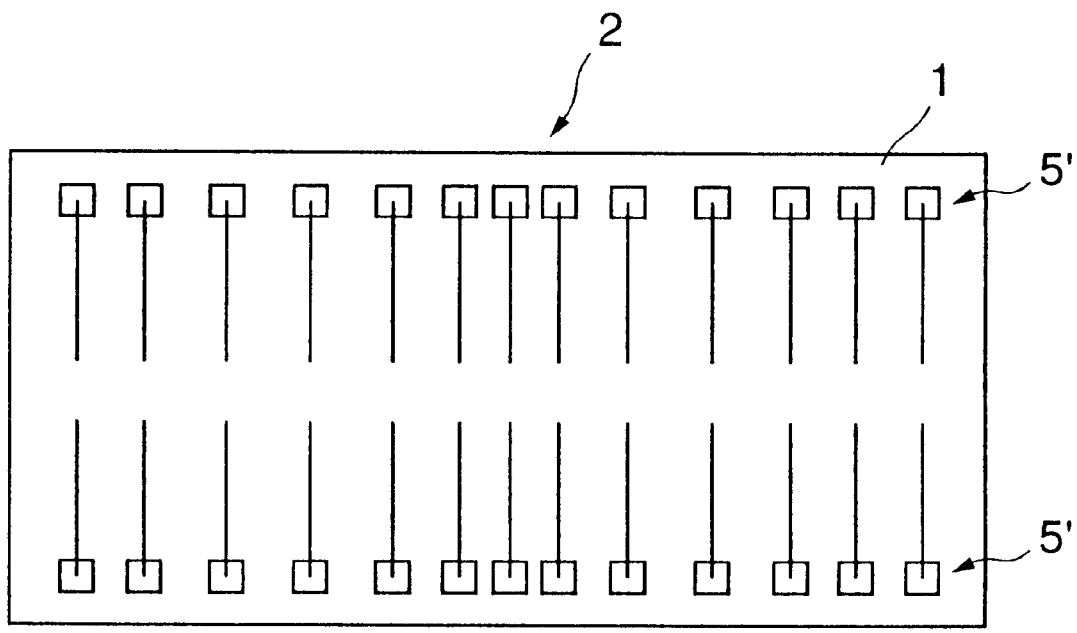
FIG. 24 is a top view showing a semiconductor wafer testing method according to a third embodiment.
Figure 25:
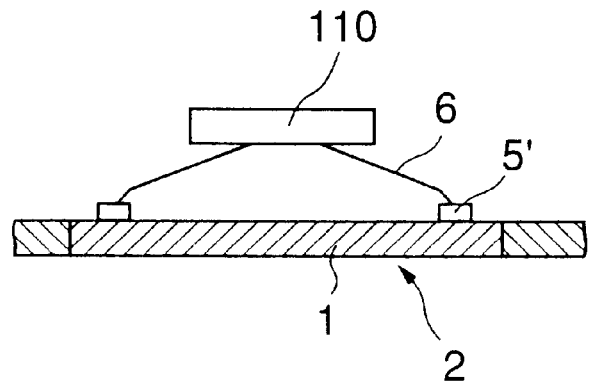
FIG. 25 is a side view showing a semiconductor wafer testing method according to a third embodiment.
Figure 26:
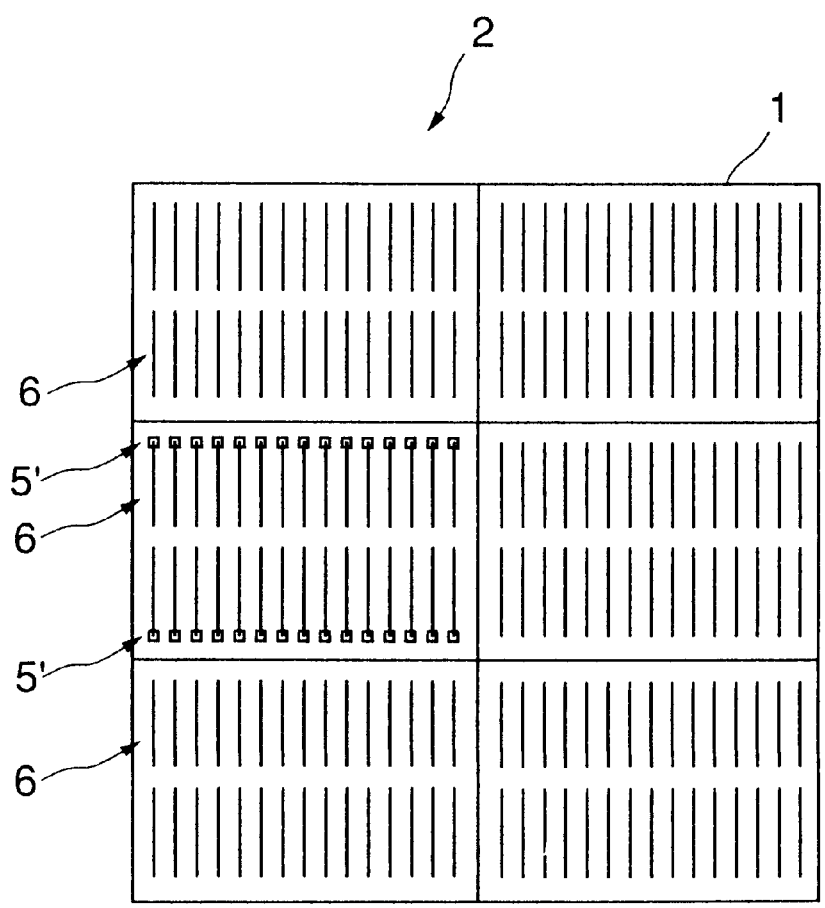
FIG. 26 shows how the chips arranged in the X direction and in the Y direction are tested according to the third embodiment.

FIGS. 24 and 25 are a top view and a side view, respectively, showing a semiconductor wafer testing method according to the third embodiment. FIG. 26 shows how the chips arranged in the X direction and in the Y direction are simultaneously tested according to the third embodiment.

Similar to the second embodiment described above, a metal film is formed so as to be connected to the first electrode 3 (see, for example, FIG. 20) leading from the chip 1 on the wafer 2. By etching the metal film, the temporary wiring layer 4 (see, for example, FIG. 20) is formed. A plurality of second electrodes 5' each leasing from the temporary wiring layer 4 are arranged or the wafer 2.

The third embodiment differs from the second embodiment in that the second electrodes 5' are provided at respective ends of the chip 1. With this arrangement, the test probe pins 6 can be simultaneously applied to the second electrodes 5' of a plurality of chips 1.

Similar to the second embodiment, the third embodiment ensures that the input/output signal and the power supply voltage can simultaneously be supplied from the test probe card 110 to a large number of chips via the test probe pins 6. According to the third embodiment, the number of chips that can be tested simultaneously is increased significantly as compared to the related art testing method. Associated with this, the time required to test all the chips 1 in the wafer 2 is reduced significantly.

A description will now be given, with reference to FIG. 27, of a semiconductor wafer testing method according to a fourth embodiment.

Figure 27:
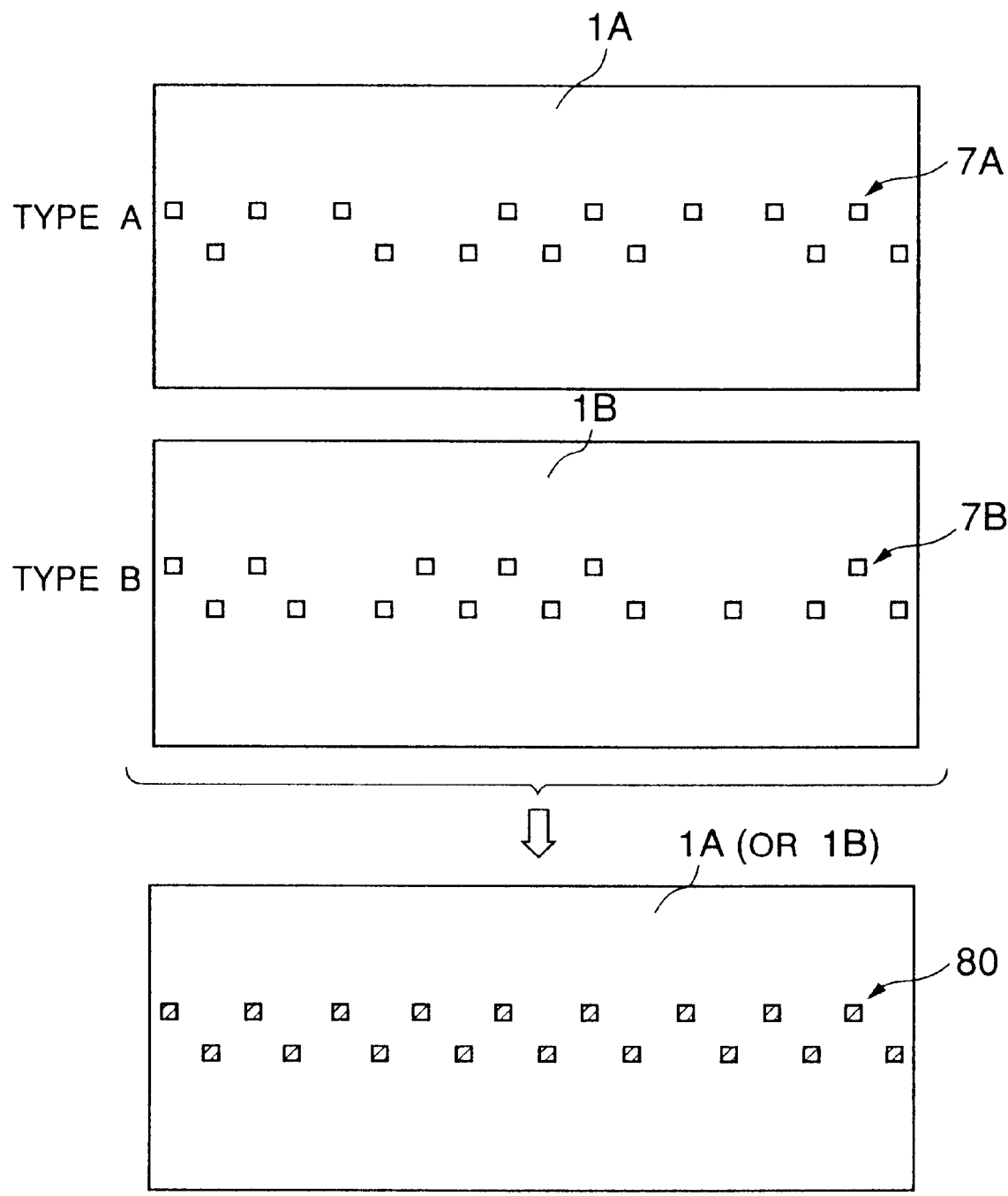
FIG. 27 shows how two chips having different functions are tested using temporary test pads of a common type.

FIG. 27 shows how two chips having different functions are tested using temporary test pads of a common type.

Referring to FIG. 27, a chip 1A of type A and a chip 1B of type B differ from each other in the arrangement of the permanent pads. More specifically, the permanent pads 7A of the type A chip 1A are arranged differently from the permanent pads 7B of the type B chip 1B. A temporary test pad 80 of a common type is formed to adapt to both the pads 7A and the pads 7B so as to provide second electrodes for both the chip 1A and the chip 1B. In this way, probe pins of a common type can be applied to the chips.

According to the fourth embodiment, chips of different types can be efficiently tested using a test probe card and test probe pins of a common type. Reduction in the cost for test equipment is also achieved.

A description will now be given, with reference to FIG. 28, of a semiconductor wafer testing method according to a fifth embodiment.

Figure 28:
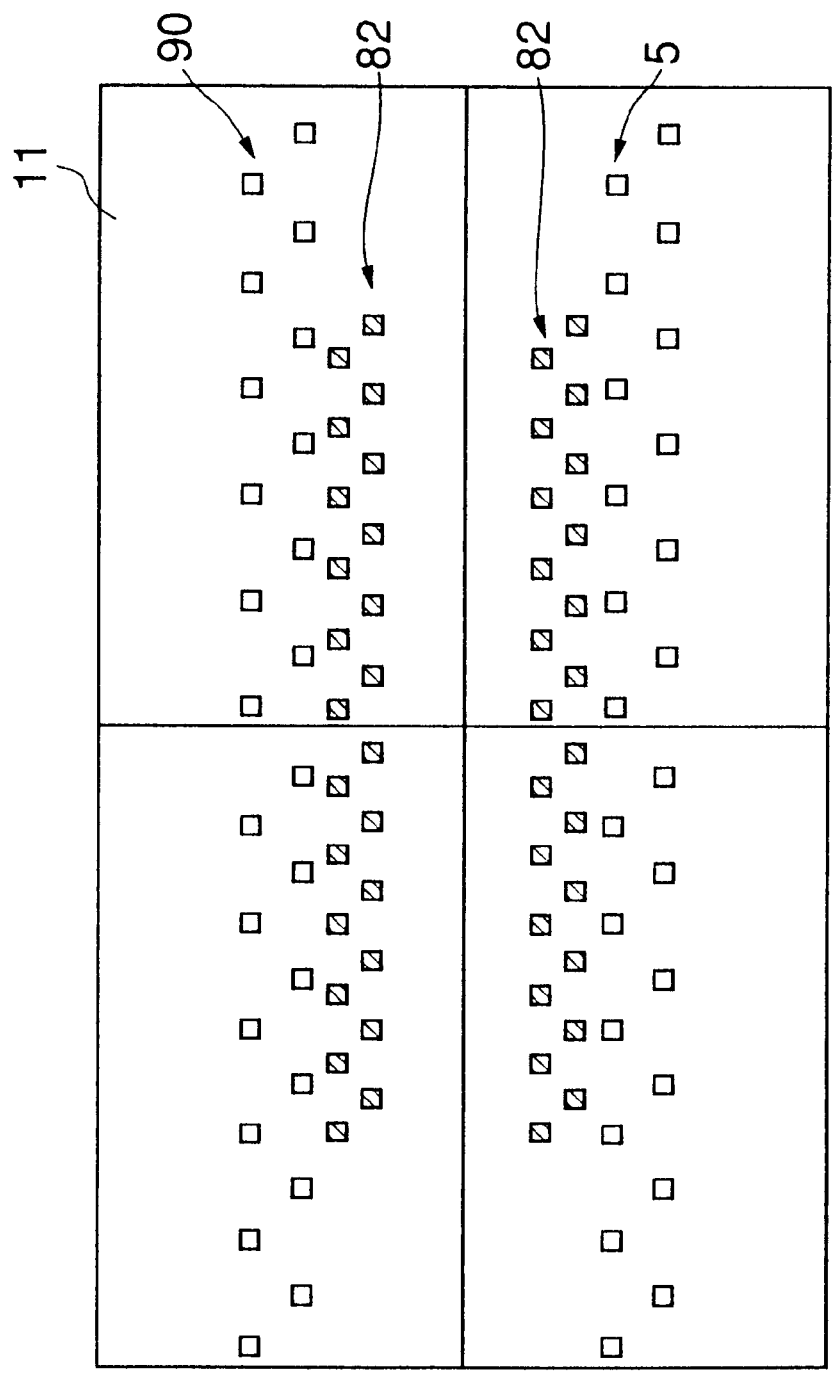
FIG. 28 is a top view showing how temporary test pads are provided on a plurality of chips before a shrinking process.
Figure 29:
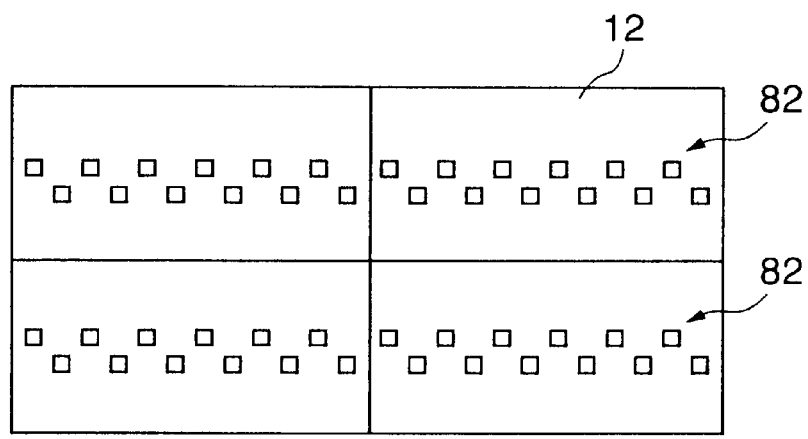
FIG. 29 is a top view showing how temporary test pads are provided on a plurality of chips after the shrinking process.

FIG. 28 is a top view showing how temporary test pads are provided on a plurality of chips before a shrinking process. FIG. 29 is a top view showing how temporary test pads are provided on a plurality of chips after a shrinking process.

In the fifth embodiment shown in FIGS. 28 and 29, temporary test pads for a semiconductor chip (hereinafter, referred to as a pre-shrinked chip 11, or an old chip) that is so designed as to be subject to a shrinking process are configured to be compatible with temporary test pads 82 adapted for a shrinked chip 12 (a new chip) obtained after the shrinking process. More specifically, referring to FIGS. 28 and 29, permanent pads 90 in each of the pre-shrinked chips 11 are connected to the respective temporary test pads 82 in an identical arrangement with the temporary test pads 82 for each of the shrinked chips 12. FIGS. 28 and 29 also show how a temporary test probe card is used to test four chips simultaneously.

According to the fifth embodiment, the temporary test probe card of a common type is used for both the pre-shrinked chip 11 and the shrinked chip 12. Therefore, reduction in the cost for test equipment is achieved.

A description will now be given, with reference to FIG. 30, of a semiconductor wafer testing method according to a sixth embodiment.

Figure 30:
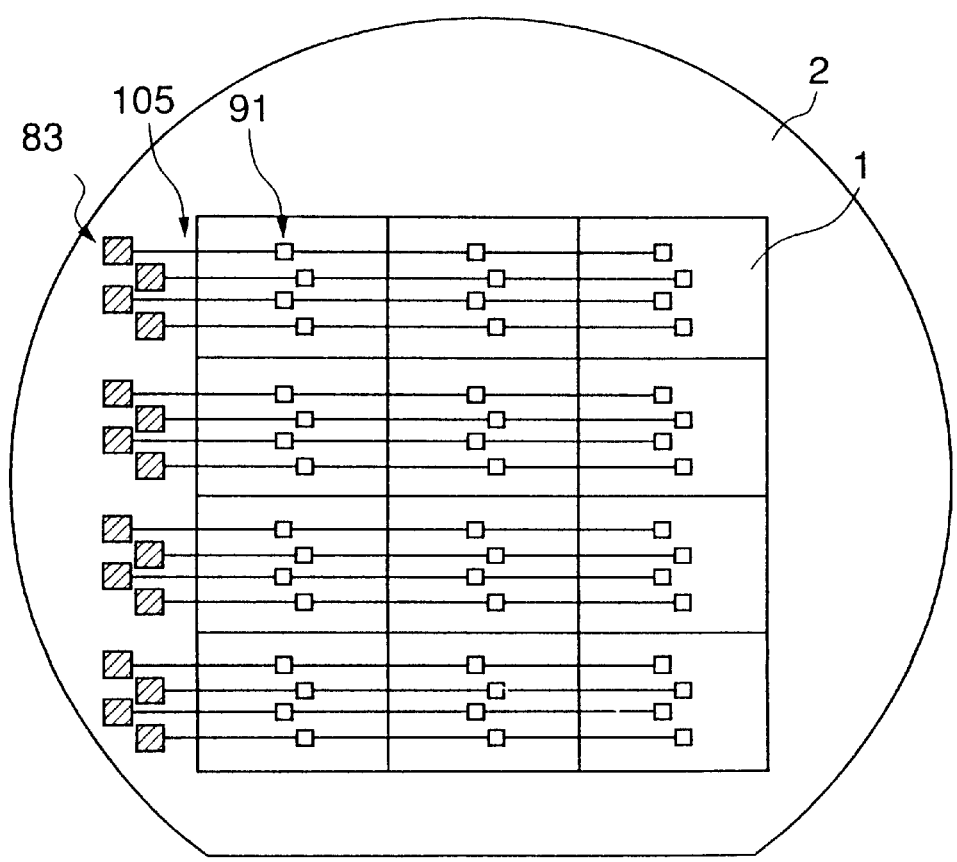
FIG. 30 shows how a wafer burn-in test is performed according to a sixth embodiment.

FIG. 30 shows how a wafer burn-in test is performed according to the sixth embodiment.

A wafer burn-in test for detecting an initial failure is conducted before the product is shipped out of a factory, by setting the temperature and voltage higher than a normal level. According to the sixth embodiment, input/output signal terminals and power supply terminals 91 used to test individual semiconductor elements in the plurality of chips 1 are led to the temporary wiring layers to form a temporary wiring pattern 105. Those of the input/output signal terminals and the power supply terminals 91 that have the same function are connected to a common temporary test pad 83 shared by a plurality of chips 1, via the temporary wiring pattern 105. The temporary test pads 83 embodying the second electrodes are provided at respective locations on the wafer 2 outside the chip area.

By arranging the temporary test pads 83, the number of test probe pins used in the wafer burn-in test is significantly reduced. This has a benefit of reducing a risk in which the positions of the test probe pins are displaced when the wafer is expanded as a result of a temperature rise, and reducing stress exerted from the test probe pins to the chip.

Figure 31:
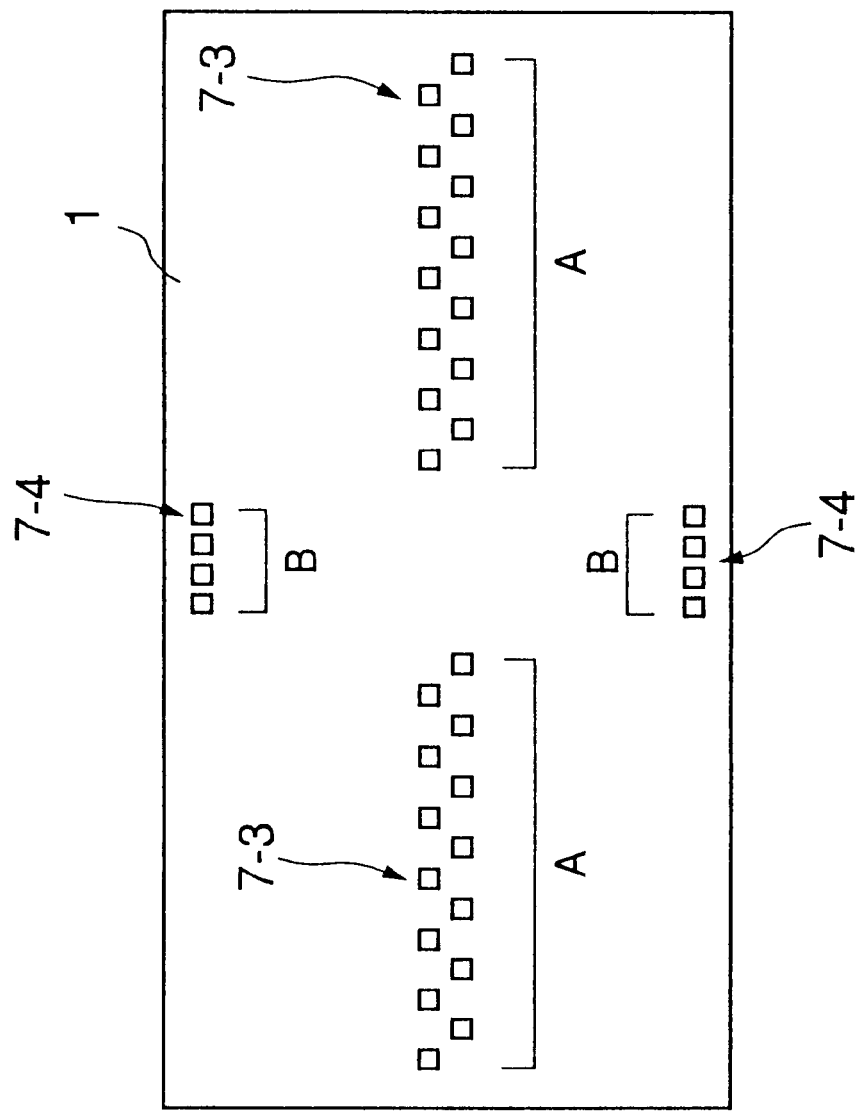
FIG. 31 is a top view showing how a chip is tested without the temporary test pad of the present invention, wherein the permanent pads and the pads dedicated to the test are coexistent.
Figure 32:
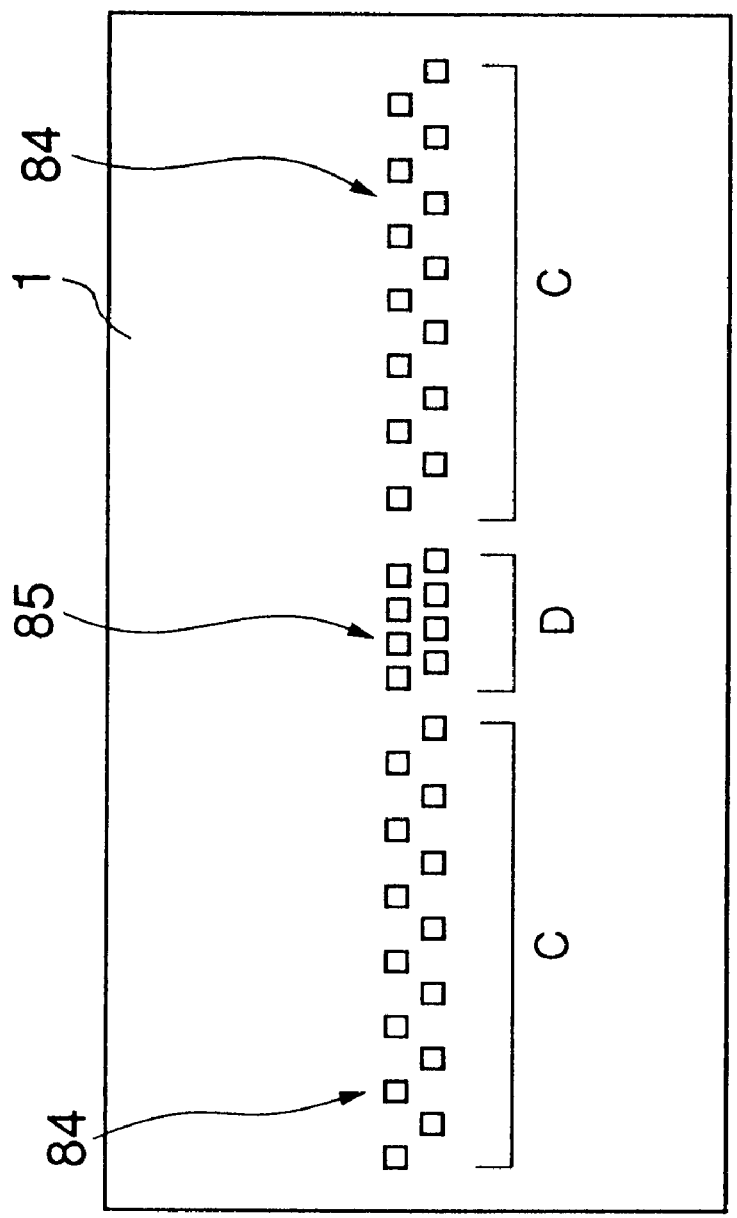
FIG. 32 is a top view showing how test pads dedicated to a test is implemented by temporary test pads according to a seventh embodiment.

FIG. 31 is a top view showing how a chip is tested without the temporary test pads of the present invention, wherein the, permanent pads and the pads dedicated to the test are coexistent. FIG. 32 is a top view showing how a semiconductor wafer test is performed using the temporary test pads according to a seventh embodiment.

FIG. 31 is provided to illustrates a difference between the seventh embodiment and the semiconductor wafer test according to the related art. Referring to FIG. 31, permanent pads 7-3 (at locations A) and test pads 7-4 dedicated to the test (at locations B) are coexistent on the chip 1. According to the related art test, the test pads 7-4 dedicated to the test should be provided at locations outside the permanent pads 7-3. Accordingly, restrictions are imposed on the arrangement and number of dedicated test pads so that it is difficult to perform a wafer test efficiently and in a short period of time.

In the seventh embodiment as shown in FIG. 32, temporary test pads (second electrodes) are used to provide test pads 85 dedicated to the test (at locations D). Such temporary test pads are also provided at locations (locations C) that correspond to permanent pads 84. In other words, the permanent pads at locations C are "copied" to the corresponding temporary test pads at the identical locations so that it is unnecessary to provide the temporary test pads 85 outside the permanent pads 7-3.

The chip produced and shipped out of a factory according to the seventh embodiment is not provided with test pads dedicated to the test and no longer in use after the test. In other words, the test pads dedicated to the test such as the test pads 7-4 of FIG. 31 are not provided in the chip product produced according to the seventh embodiment.

Since the temporary test pads are removed from the chip product after the wafer has been tested, the chip area according to the seventh embodiment is smaller than the chip area according to the related art. Since a relatively large number of second electrodes for test purpose can be formed by using temporary test pads without increasing the chip area, a greater variety of tests can be performed according to the seventh embodiment than the related art.

A description will now be given, with reference to FIGS. 33 and 34, of a semiconductor wafer testing method according to an eighth embodiment.

Figure 33:
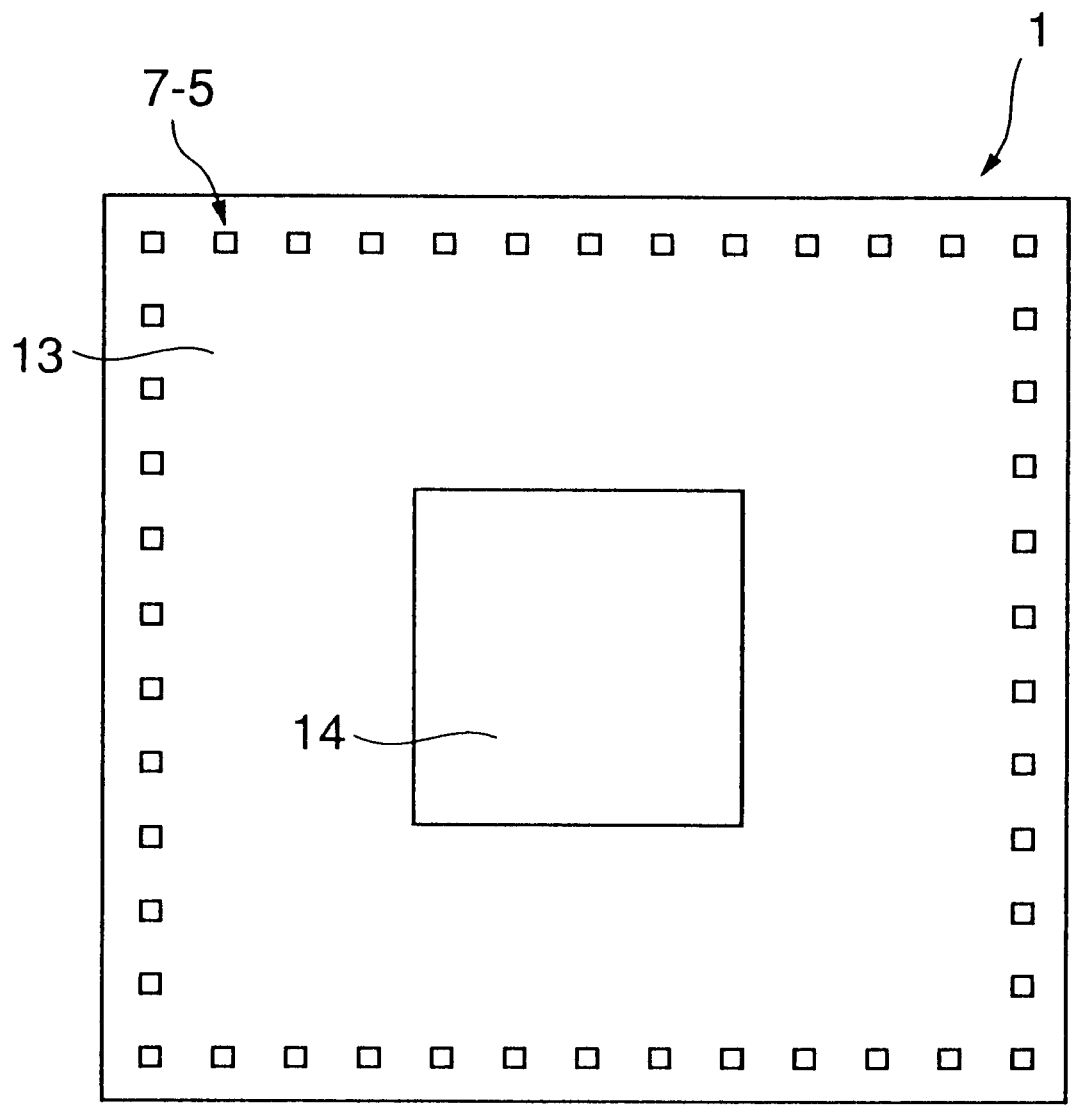
FIG. 33 is a top view showing how a chip having a logic part and a memory part is tested without using the temporary test pads of the present invention.

FIG. 33 is a top view showing how a chip having a logic part and a memory part is tested without using the temporary test pads of the present invention. FIG. 34 is a top view showing how a chip having a logic part and a memory part is tested according to the eighth embodiment of the present invention.

FIG. 33 is provided to illustrate a difference between the eighth embodiment and the related art. Referring to FIG. 33, a related art wafer test is performed on a chip having a logic part 13 at the periphery and a memory part 14 at the center, without using temporary test pads. In this case, since external terminals (test terminals dedicated to the test) are not led from the memory part 14 at the center of the chip 1, it is impossible to test the memory part 14 via terminals of the chip 1.

Figure 34:
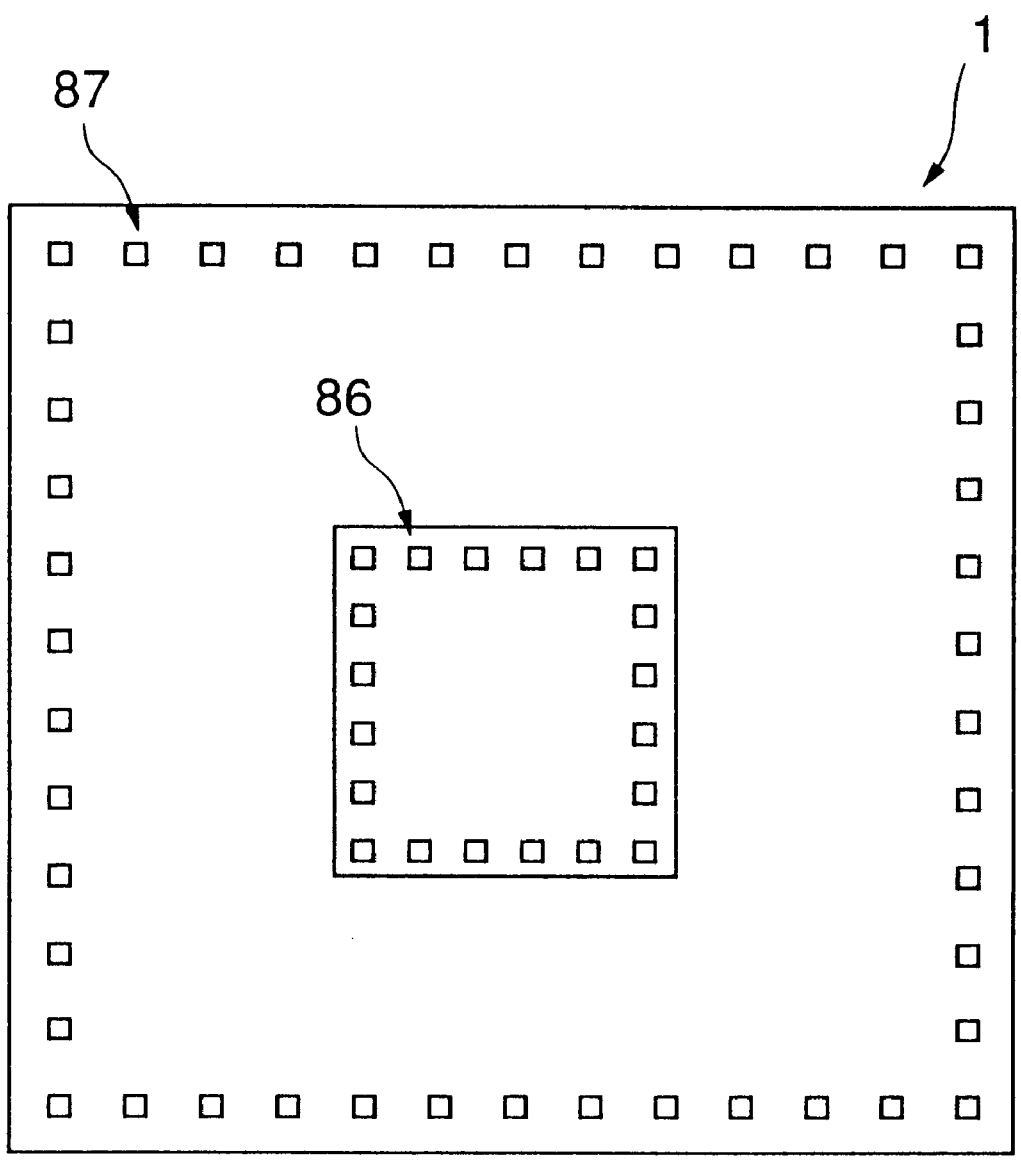
FIG. 34 is a top view showing how a chip having a logic part and a memory part is tested according to an eighth embodiment of the present invention.

In contrast, the eighth embodiment shown in FIG. 34 provides inner temporary test pads 86 for testing the memory part 14 and outer temporary test pads 87 for testing the logic part 13. At least one of the input/output signal terminals and the power supply terminals of the memory part 14 are led to the temporary wiring layers so as to be connected to the inner temporary test pads 86.

By providing temporary test pads dedicated to testing the memory part 14, it is possible to lead at least one of the input/output signal terminals and the power supply terminals of the memory part 14 outside chip 1. Thus, it is possible to test the memory part 14 located at the center of the chip without increasing the chip area.

While the eighth embodiment described above assumes the use of temporary test pads for a chip where the logic part and the memory part coexist, the temporary test pads may a so be used for chips other than such a chip in order to lead the input/output signal lines and/or the power supply lines outside the chip for a test, without increasing the chip area.

Figure 35:
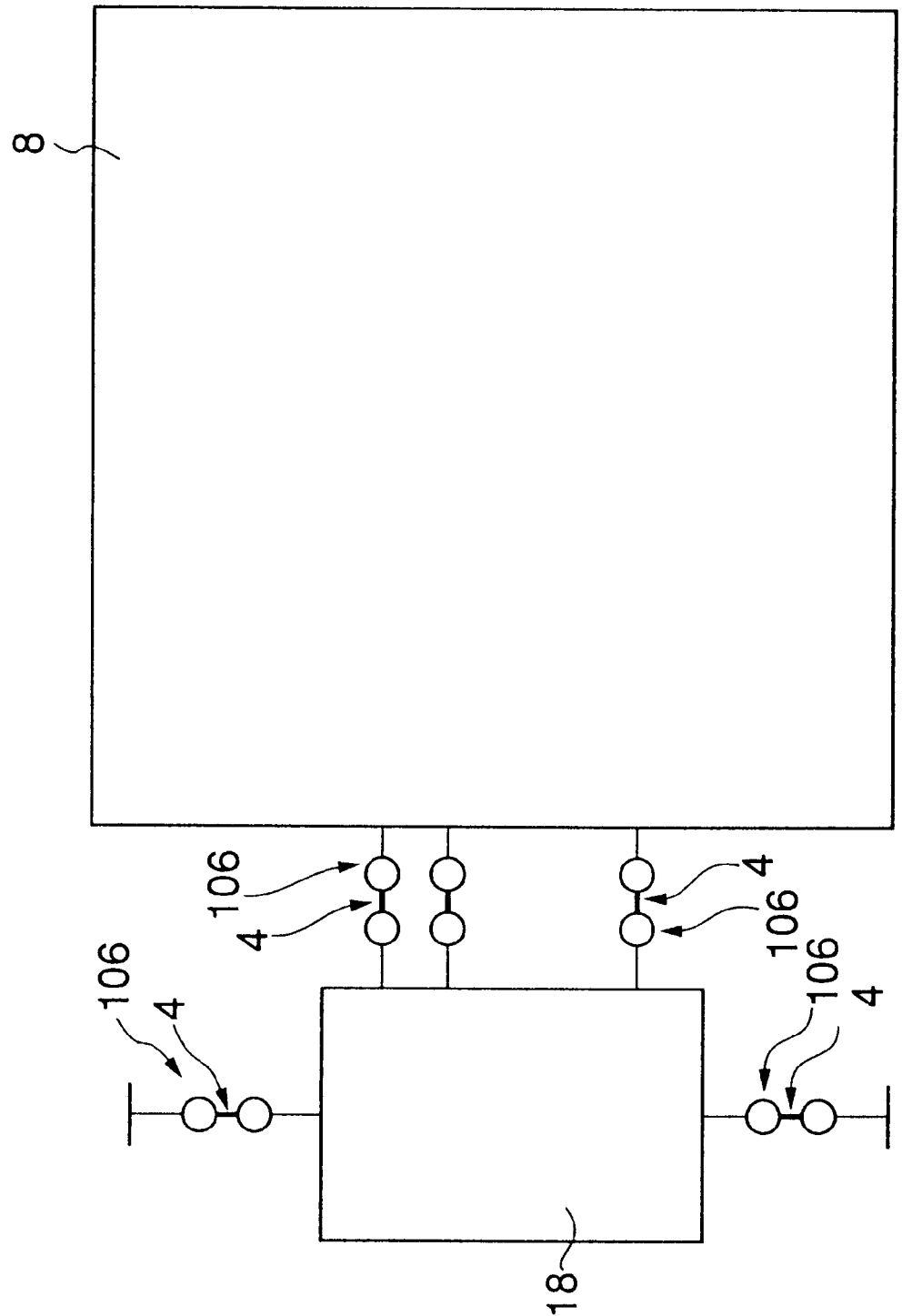
FIG. 35 is a block diagram showing how a test pattern generating circuit and a semiconductor unit on a wafer are connected to each other using temporary test pads of the present invention.

FIG. 35 is a block diagram showing how a test pattern generating circuit and a semiconductor unit in a chip are connected to each other using temporary test pads of the present invention.

Referring to FIG. 35, a test pattern generating circuit 18 for generating various test patterns for testing a plurality of semiconductor elements constituting a semiconductor unit 8 in the chip 1 is embedded in the wafer. The semiconductor unit 8 and the test pattern generating circuit 18 are connected to each other via the temporary wiring layer 4 and connection terminal parts 106 so that the plurality of semiconductor elements included in the semiconductor unit 8 are tested.

The test pattern generating circuit 18 may be located on the same chip as the semiconductor unit 8. Alternatively, the test pattern generating circuit 18 may be provided for a plurality of chips. Preferably, the test pattern generating circuit 18 is used to generate high-frequency test patterns that can not be generated by a tester or the like.

By embedding the test pattern generating circuit 18 in the wafer, a high-frequency wafer test that is difficult to perform with a tester or the like can be performed using a simple construction and in a relatively short period of time.

A description will now be given, with reference to FIG. 36, of a semiconductor wafer testing method according to a ninth embodiment of the present invention.

Figure 36:
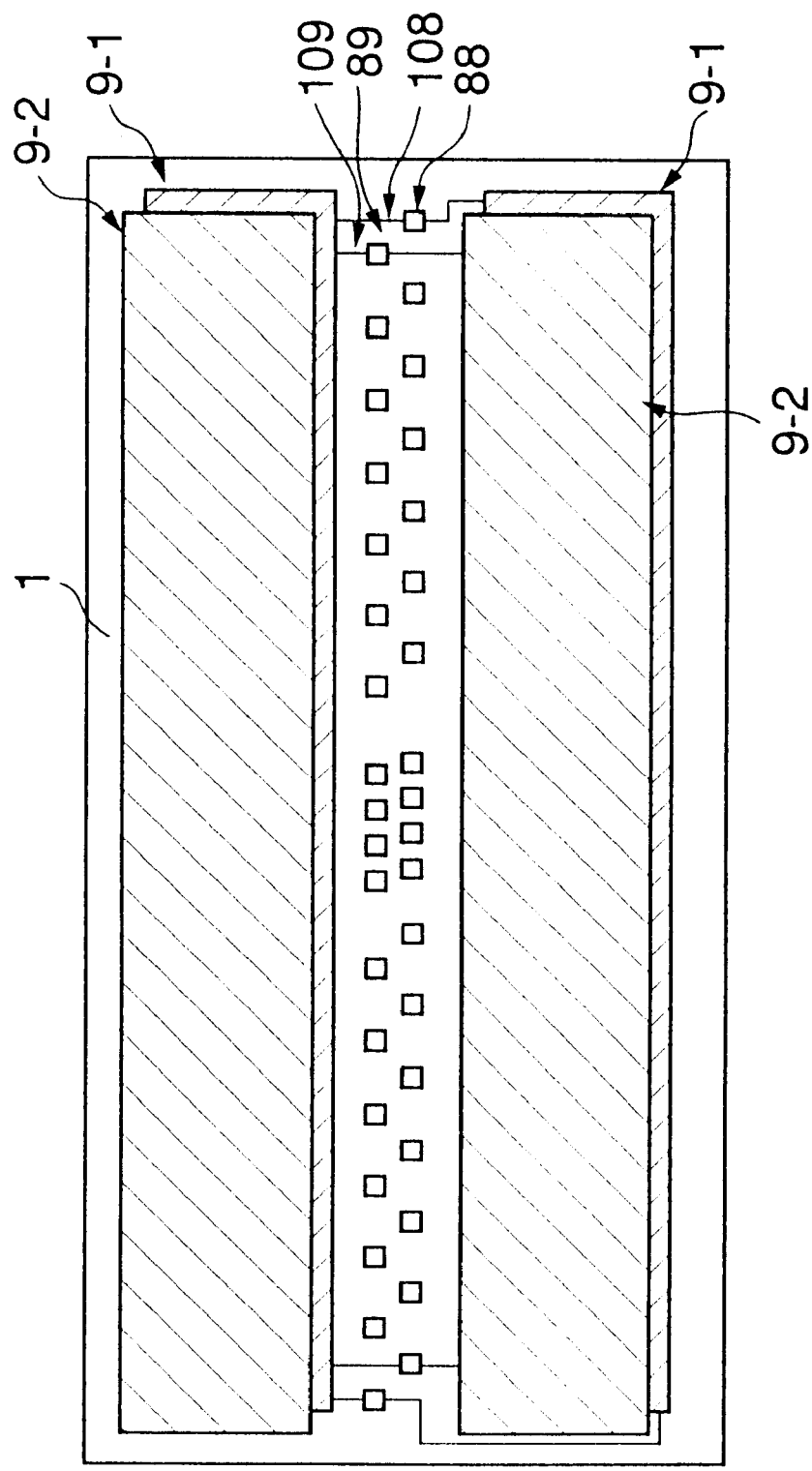
FIG. 36 is a top view showing a semiconductor wafer testing method according to a ninth embodiment.
Figure 37:
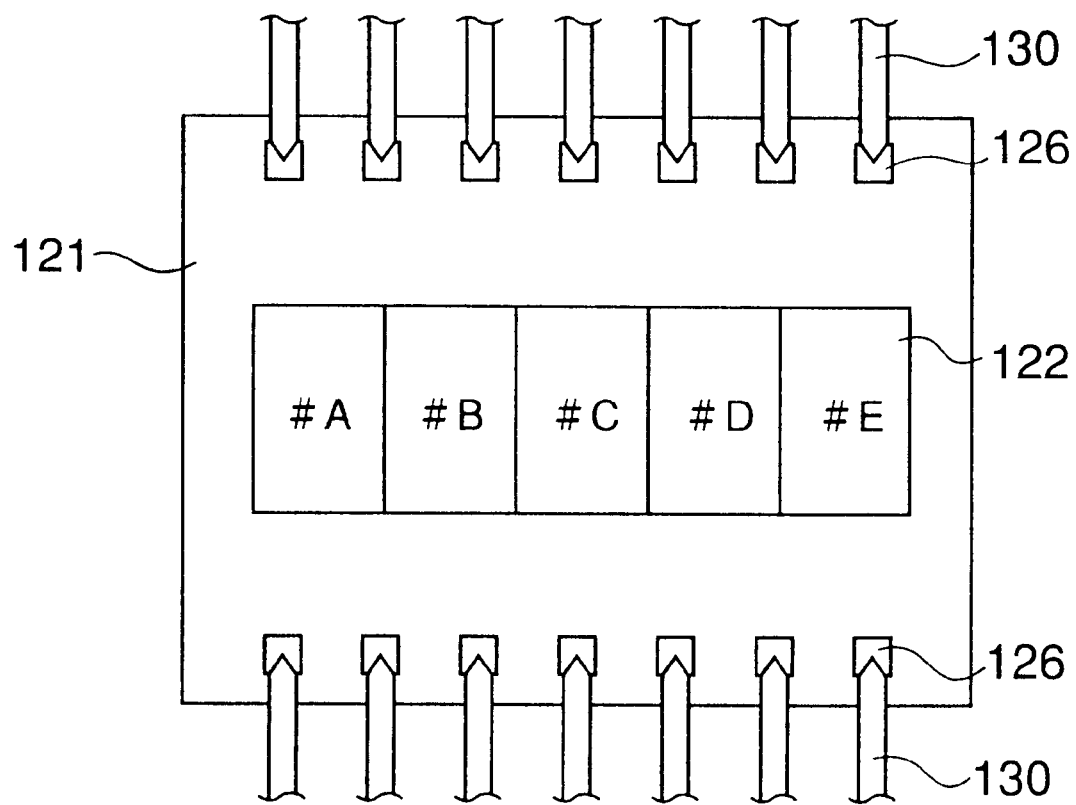
FIG. 37 is a top view showing a semiconductor wafer testing method according to the related art.

FIG. 36 is a top view showing a semiconductor wafer testing method according to the ninth embodiment.

In the ninth embodiment shown in FIG. 36, a first metal film connected to each of a plurality of first electrodes leading from the chips 1 on the wafer is formed, whereupon a first temporary wiring layer is formed by etching the metal film. A plurality of second electrodes (for example, temporary test pads including source power supply temporary pads 88) leading from the first temporary wiring layer are then formed on the wafer.

Subsequently, an insulating film is formed on the first metal film including the second electrode. A second metal film connected to the first electrode via a hole in the insulating film is formed. A second temporary wiring layer is formed by etching the second metal film. A plurality of third electrodes (for example, temporary test pads including drain power supply temporary pads 89) leading from the second temporary wiring layer are then formed on the wafer.

The ninth embodiment is also configured such that a first capacity electrode layer 9-1 included in the first temporary wiring layer and a second capacity electrode layer 9-2 included in the second temporary wiring layer are used to provide capacity on the wafer.

The first capacity electrode layer 9-1 is connected to the source power supply temporary pads 88 via a source power supply temporary wiring pattern 108. The source power supply temporary pads 88 are also connected to a source power supply for operating a plurality of semiconductor elements. The second capacity electrode layer 9-2 is connected to the drain power supply temporary pads 89 via a drain power supply temporary wiring pattern 109. The drain power supply temporary pads 89 are also connected to a drain power supply for operating a plurality of semiconductor elements. Since the capacity is provided in the immediate vicinity of the two power supply temporary pads, the power source noise occurring when the wafer is being tested is significantly reduced.

The first and second capacity electrode layers 9-1 and 9-2, the first and second temporary wiring layers, and the second and third electrodes are removed simultaneously after the wafer test is completed. With this arrangement, the power source noise that otherwise occurs when the wafer is being tested is reduced without increasing the chip area.

It is to be noted that, in the second through ninth embodiments described above, traces of the temporary wiring layer that includes the second electrodes remain in the contact portion of the first electrode even after a removal process. However, such traces are of such a limited quantity that the subsequent processes are not affected at all.

A description will now be given of how the present invention resolves the third aspect of the problem inherent in the related art.

Figure 38:
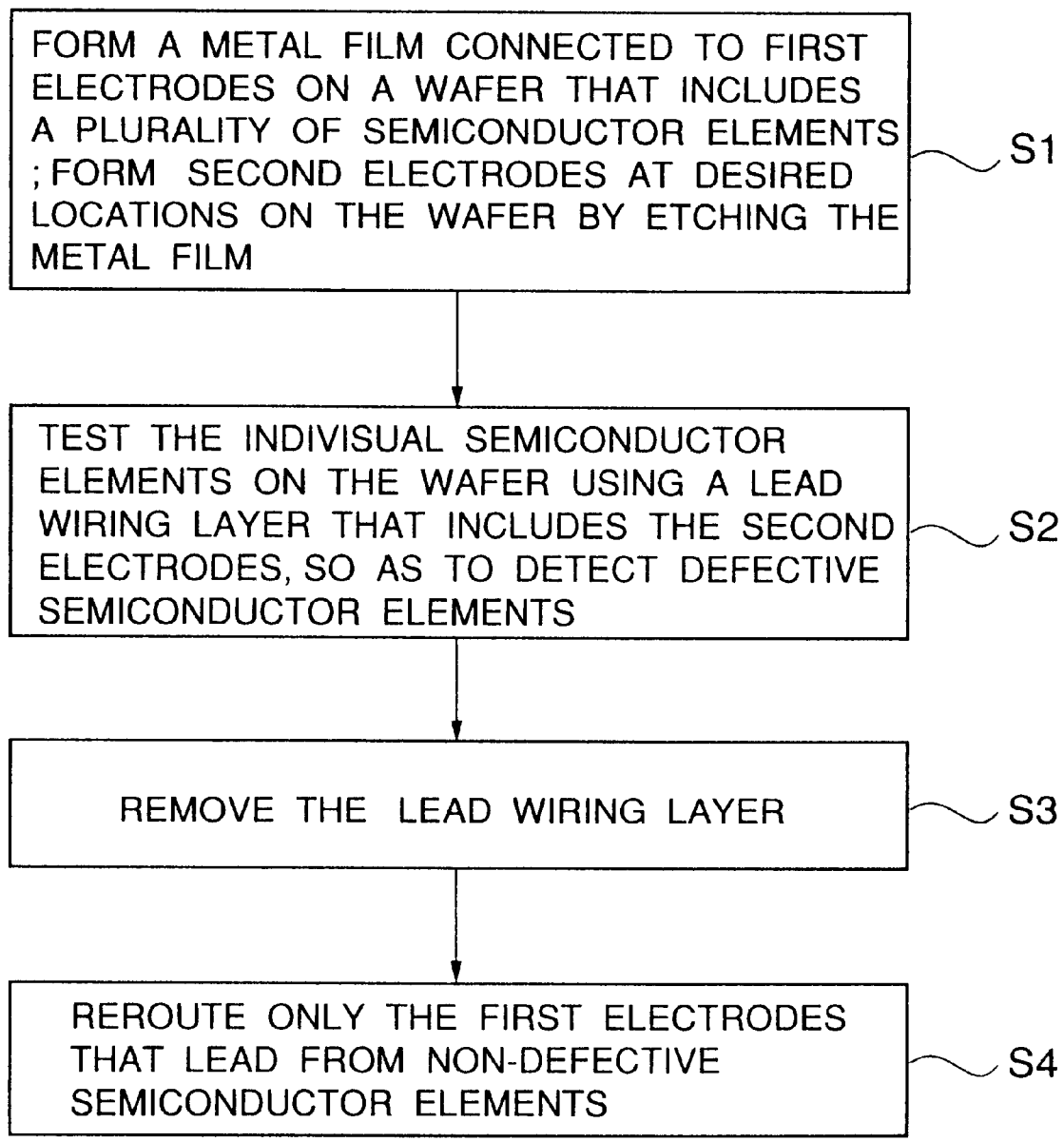
FIG. 38 is a flowchart showing the principle whereby the third aspect of the related art problem is resolved.

FIG. 38 is a flowchart showing the principle whereby the third aspect of the related art problem is resolved.

Referring to FIG. 38, the semiconductor wafer testing method directed to resolving the third aspect of the related art problem includes step S1 for forming an insulating film on a wafer that includes a plurality of semiconductor chips each including a plurality of semiconductor elements, forming a metal film connected via a hole in the insulating film to a first electrode led from a corresponding one of the plurality of semiconductor elements, and forming a second electrode on the wafer by etching the metal film. The method also includes step S2 for testing the individual semiconductor elements on the wafer by using a temporary wiring layer that includes the second electrodes, and identifying defective semiconductor elements. The method also includes step S3 for removing the temporary wiring layer after the semiconductor elements have been tested, and step S4 for rerouting only the first electrodes leading from the non-defective semiconductor elements.

A description will now be given, with reference to FIGS. 39–53, of a semiconductor wafer testing method according to a tenth embodiment of the present invention directed to resolving the third aspect of the related art problem. In FIGS. 39–53, those components that are the same as the corresponding components described already are designated by the same reference numerals, and the description thereof is omitted.

Figure 39:
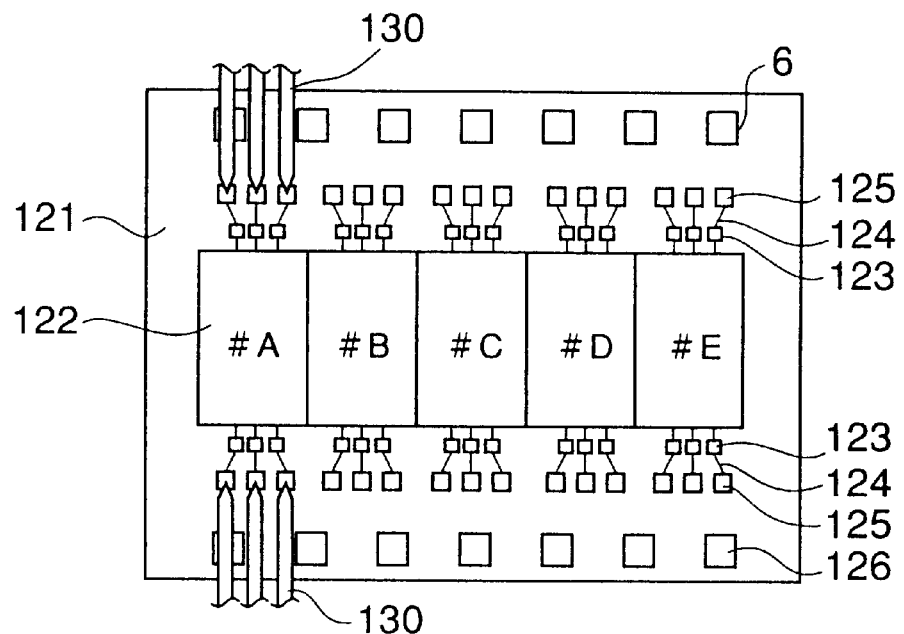
FIG. 39 is a top view showing a testing method according to the tenth embodiment.

FIG. 39 is a top view showing the testing method according to the tenth embodiment.

Referring to FIG. 39, an insulating film is formed on a cover film. A hole is provided in the insulating film in alignment with a corresponding one of a plurality of first electrodes 3 (for example, a semiconductor element electrode) leading from a plurality of cell blocks 2 in such a manner that the hole exposes the first electrode 3. A metal film directly connected to the first electrode 3 via the hole in the insulating film is formed by a sputtering technique or an evaporation technique. A lead wiring part 124 electrically connected to the first electrode 3 is formed by etching the metal film. The first electrode 3 is rerouted by forming, at a desired location on the chip 1, the second electrode 5 that correspond to the first electrode 3 connected to the lead wiring part 124.

Figure 40:
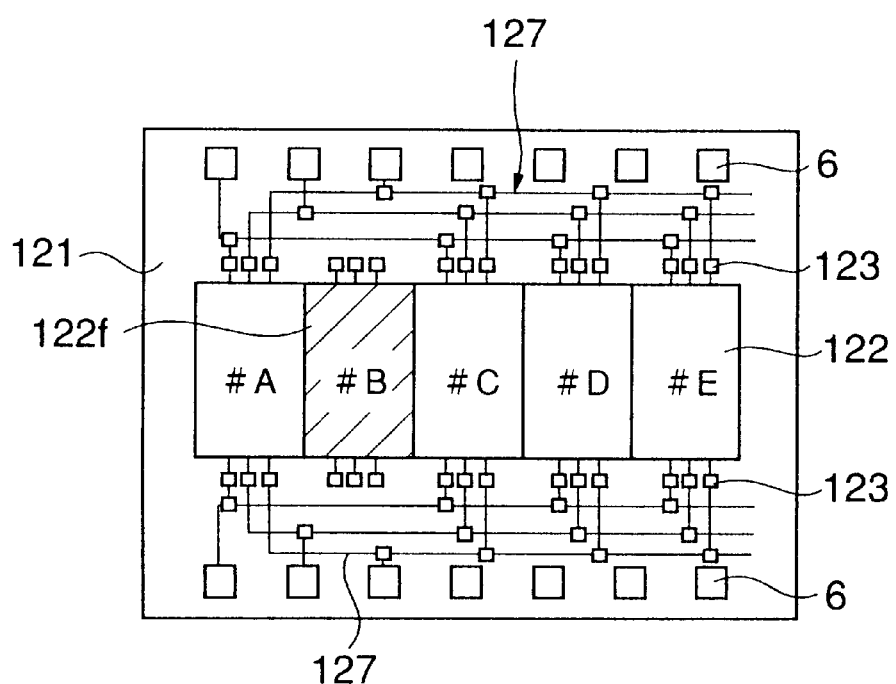
FIG. 40 is a top view showing how rerouting is performed only for those cell blocks that are found to be non-defective as a result of a test on the semiconductor elements.

Since the second electrode 5 can be provided at a desired location on the chip, a relatively large number of test pads (second electrodes) can be provided. By providing groups of second electrodes block for block, and by applying test probe pins 130 to the groups of second electrodes thus provided, a block-for-block test of the plurality of semiconductor elements can be performed efficiently. In this way, it is possible to identify a defective cell block (for example, a defective cell block 122f as shown in FIG. 40 described later) more efficiently than with a testing method for simultaneously testing the entirety of the chips on the wafer. Accordingly, the time required for the test is significantly reduced.

FIG. 40 is a top view showing how rerouting is performed only for those cell blocks that are found to be non-defective as a result of a test on the semiconductor elements.

As shown in FIG. 40, by removing the second electrodes from the insulating film after the semiconductor elements have been tested, and by rerouting only those first electrodes from the non-defective cell blocks so as to form a rewiring layer 127, the chips that include non-defective cell blocks can be used as a product. For example, a reserve cell block E may be built into the chip. When it is determined as a result of the test that block B is defective, block E (reserved non-defective block) instead of the cell block 122f that corresponds to block B may be connected to the rewiring layer 127. In this way, the yield of chip production is improved.

Thus, by performing a test that takes advantage of the TRT technology, those chips that are discarded as a result of the related art test may be used as a product by a rewiring process performed based on the test result. More specifically, by rewiring the first electrodes 3 leading from the non-defective cell blocks, and by retrieving the associated chips from the wafer, the chips including defective cell blocks but subject to rewiring can be used as a product.

Since the temporary wiring layer and the second electrodes are removed after the test, the hole may be significantly smaller than the permanent pad. For example, the hole may have a size of 2 μm×2 μm. Therefore, formation of the temporary wiring layer including the second electrodes does not increase the chip size.

Figure 41:
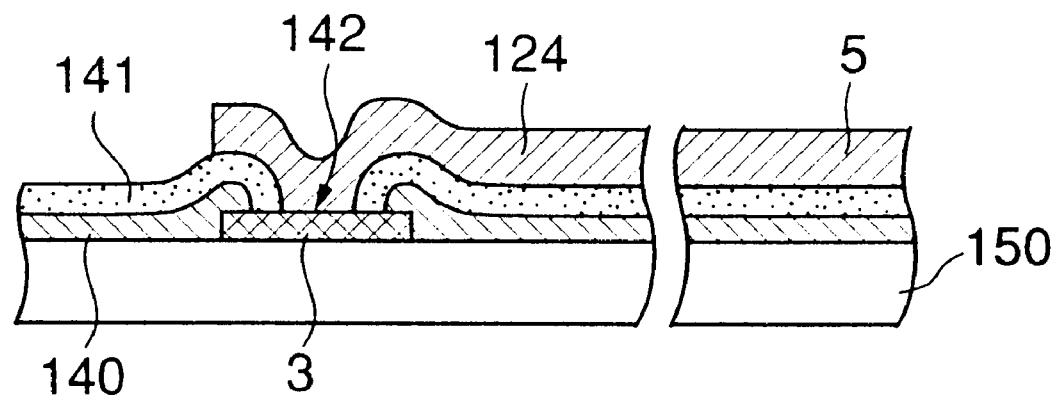
FIG. 41 is a sectional view showing the construction of a temporary wiring layer that includes second electrodes.
Figure 42:
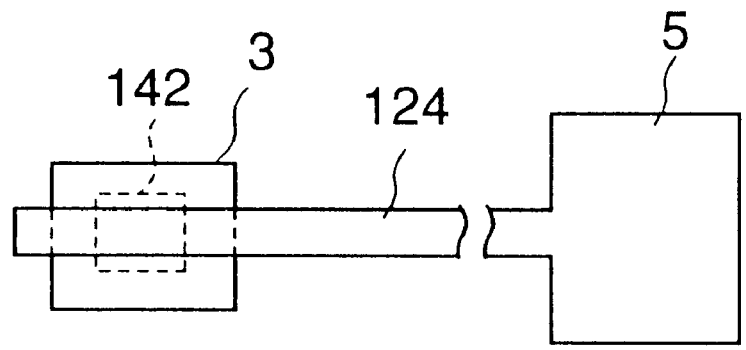
FIG. 42 is a top view showing the construction of the temporary wiring layer that includes the second electrodes.

FIGS. 41 and 42 are a sectional view and a top view, respectively, showing the construction of the temporary wiring layer that includes the second electrodes. In the top view of FIG. 42, illustration of the insulating film is omitted.

Referring to FIGS. 41 and 42, a cover film 140 protects the first electrode 3 on a substrate 150 leading from a corresponding one of a plurality of semiconductor elements. An insulating film 141 is formed on the cover film 140. A metal film is formed on the insulating film 141 by a sputtering technique or an evaporation technique. The lead wiring part 124 and the second electrode 5 are formed by etching the metal film.

The lead wiring part 124 electrically connected to the second electrode 5 is in direct contact, via a hole provided in the insulating film 141, with a contact portion 1.12 on the first electrode 3. The second electrode 5 is configured to be larger than the first electrode 3 so that the test probe pin 6 for testing the individual semiconductor element is properly applied to the second electrode 5. For example, the second electrode 5 may have a size of 100 μm×100 μm. Thus, it is highly unlikely that improper connection occurs between the test probe pins 6 (having, for example, a diameter of 20 μm) and the second electrodes 5 (test electrodes).

FIGS. 43A–43D are sectional views showing a process for forming the temporary wiring layer that includes the second electrodes.

Figure 43A:
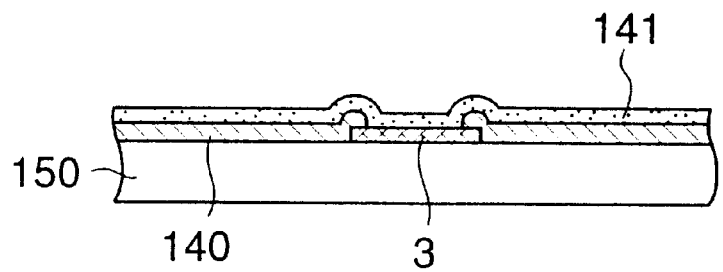
FIGS. 43A–43D are sectional views showing a process for forming the temporary wiring layer that includes the second electrodes.

In a first step shown in FIG. 43A, the insulating film 141 is formed on the cover film 140. One of the following methods may be used to form the insulating film 141. i) An agent providing a release force for preventing permanent bondage between the cover film 140 and the insulating film 141 is applied to a certain density on the cover film 140, whereupon the insulating film 141 is formed on the cover film 140.

ii) An agent providing a release force for preventing permanent bond between the cover film 140 and the insulating film 141 is applied in a certain density on the insulating film 141, whereupon the insulating film 141 is formed on the cover film 140.

iii) The insulating film 141 is formed of an organic insulating material decomposed at a temperature of 150–300°. By heating the insulating film 141 thus formed at a temperature higher than the temperature that occurred at formation, a portion of the insulating film 141 is decomposed so that bondage between the insulating film 141 and the cover film 140 is weakened. As a result, the insulating film 141 is removed from the cover film 140.

iv) The insulating film 141 is formed of an organic material subject to abrupt decomposition at a certain temperature. The insulating film 141 is made removable from the cover film 140 by heating the insulating film 141 at a temperature higher than the temperature that occurred at formation.

v) The insulating film 141 is formed of an organic material resolvable in a solvent (for example, a photoresist).

Figure 43B:
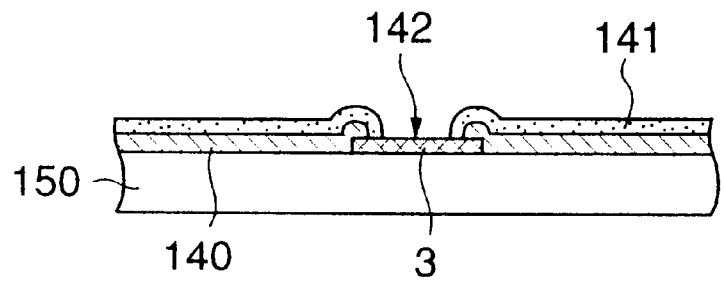

In a subsequent step as shown in FIG. 43B, the contact portion 142 to be connected to the lead wiring part 124 is formed by forming a window in the insulating film 141 in alignment with the first electrode 3.

Figure 43C:
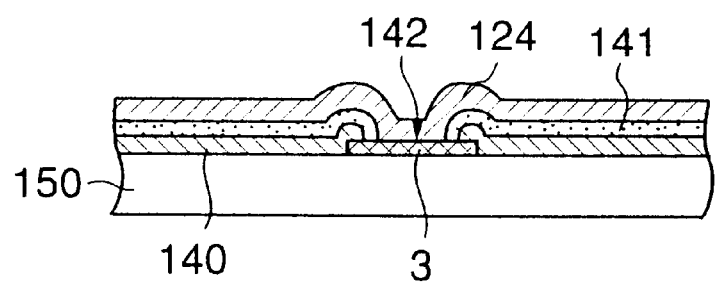

In a subsequent step as shown in FIG. 43C, a metal film is formed on the contact portion 142 by a sputtering technique or ain evaporation technique.

Figure 43D:
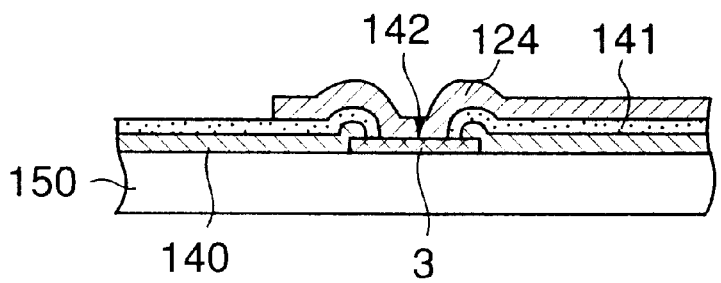

In a subsequent step as shown in FIG. 43D, the lead wiring part 124 and the second electrode 5 are formed by etching the mental film to a desired configuration. The lead wiring part 124 and the second electrode 5 constitute a temporary wiring layer.

Figure 44:
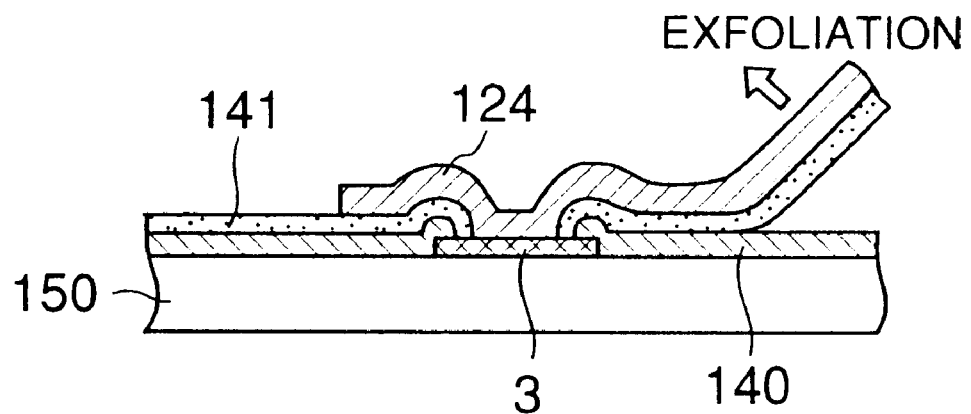
FIG. 44 is a sectional view showing how the temporary wiring layer formed according to the steps illustrated in FIGS. 43A–43D is removed.

FIG. 44 is a sectional view showing how the temporary wiring layer formed according to the steps illustrated in FIGS. 43A–43D is removed.

Referring to FIG. 44, the temporary wiring layer is removed after the plurality of semiconductor elements have been tested, by simultaneously removing the metal film (second electrodes) and the insulating film 141. One of the following three methods may be used to remove the temporary wiring layer.

a) The insulating film 141 is removed by exfoliation from the cover film 140 to which the insulating film 141 is relatively weakly bonded.

b) The organic insulating film 141 is heated beyond a decomposition temperature so as to decompose a portion of the organic insulating film 141 and remove the organic insulating film 101 from the cover film 140.

c) The insulating film 141 is removed from the cover film 140 by revolving the insulating film 141 in a solvent.

A description will now be given, with reference to FIGS. 45–47, of a variation of the tenth embodiment.

Figure 45:
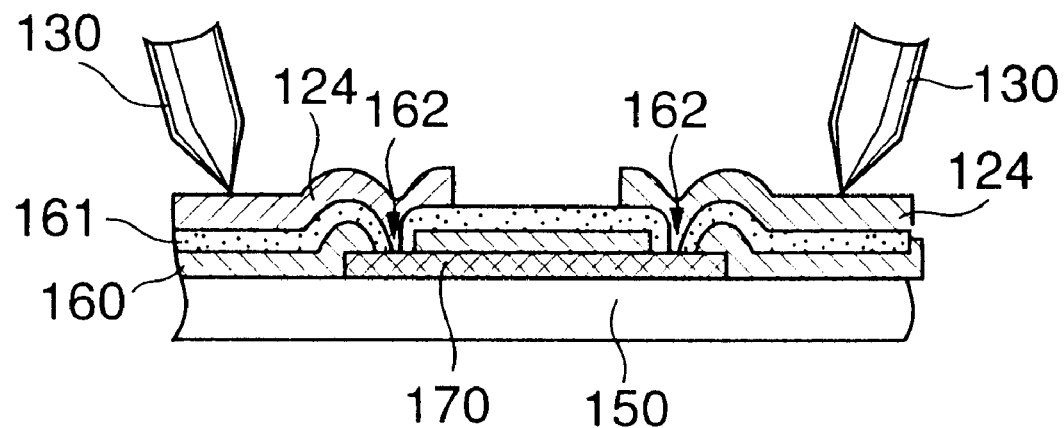
FIG. 45 is a sectional view showing the construction of the temporary wiring layer in which the second electrodes are formed at respective ends of a fuse member built into a chip.
Figure 46:
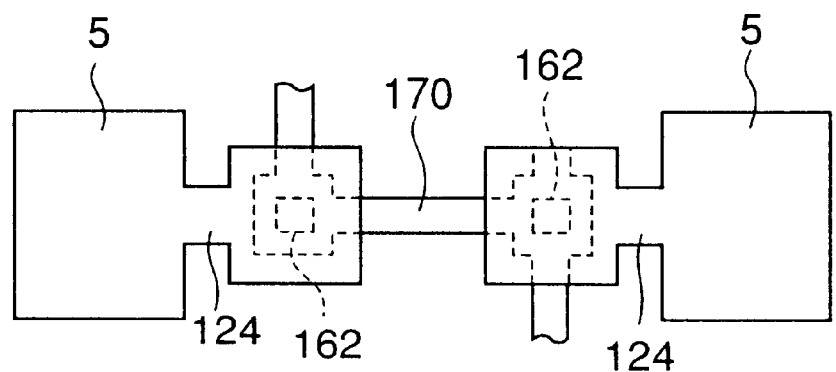
FIG. 46 is a top view showing the construction of the temporary wiring layer in which the second electrodes are formed at respective ends of a fuse member built into a chip.
Figure 47:
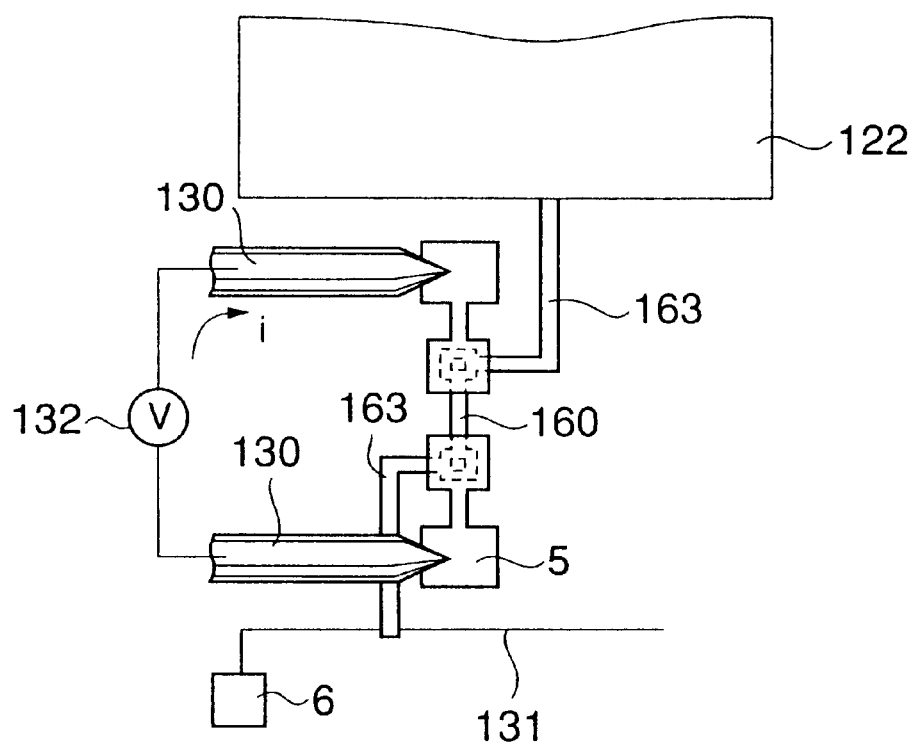
FIG. 47 is a schematic top view showing electrical connection involving the fuse member of FIG. 45.

FIGS. 45 and 46 are a sectional view and a top view, respectively, showing the construction of the temporary wiring layer in which the second electrodes are formed at respective ends of a fuse member built into a chip. FIG. 47 is a schematic top view showing electrical connection involving the fuse member of FIG. 45. In the top view of FIG. 46, illustration of an insulating film is omitted.

Referring to FIGS. 45 and 46, a fuse electrode formed by a fuse member 170 is built into the chip in addition to the first electrode 3 leading from a corresponding one of the plurality of semiconductor elements in the chip. After a cover film 170 (shown in FIG. 45) is formed on the chip, an insulating film 161 (shown in FIG. 45) is formed on the cover film 170. Holes are provided in the insulating film 161 such that some holes are in alignment with the first electrode 3 leading from the semiconductor element and some holes are in alignment with the fuse electrode formed by the fuse member 170. The first electrode 3 and the fuse electrode are exposed through the respective hole. Metal films are then formed such that some metal films are in direct contact, via the hole in the insulating film 161, with the contact portion 142 of the first electrode 3 and some metal films are in direct contact with a contact portion 162 of the fuse electrode. By etching the metal films, the lead wiring parts 124 are formed at respective ends of the fuse electrode. The lead wiring parts 124 are electrically connected to the respective second electrodes 5. By supplying an appropriate current to the second electrodes 5, the fuse member 170 of the fuse electrode blows.

Referring back to FIG. 40 showing a rewiring process for rewiring the non-defective cell blocks, given that there are five cell blocks and one of the five cell blocks may be defective for the chip to be used as a product, there are five conceivable combinations to which the rewiring according to the invention should be adapted. Normally, in such a case, a total of five masks may be prepared so that the wiring is performed using one of the five masks. However, providing a large number of masks increases the cost of chip production.

Building the fuse member into the chip so that the defective cell block is disconnected by blowing the fuse member connected thereto prevents the cost from increasing excessively high.

In order to electrically disconnect the fuse member, a large current is required.

For this purpose, the following requirements are imposed.

a) a large driving transistor is needed.

b) electrical resistance across the fuse member should be reduced.

A normal practice is that the fuse member is not disconnected by applying a large current but by illuminating the fuse member with a laser beam. However, such a method requires additional steps in producing semiconductor chips in that the wafer must be moved toward a laser cutting device after a defective cell block is found as a result of an electrical test.

According to the testing method of the tenth embodiment, the fuse member 170 may be connected to the cell block 122 via a fuse member connecting part 163 and to the permanent pad 6 via a permanent wiring part 131. The second electrode 5 is provided at the ends of the fuse member 170. By applying the test probe pins 130 directly to the second electrodes 5, and by supplying a current i from a current source 132, the fuse member 170 blows.

A description will now be given, with reference to FIGS. 48 and 49, of another variation of the tenth embodiment.

Figure 48:
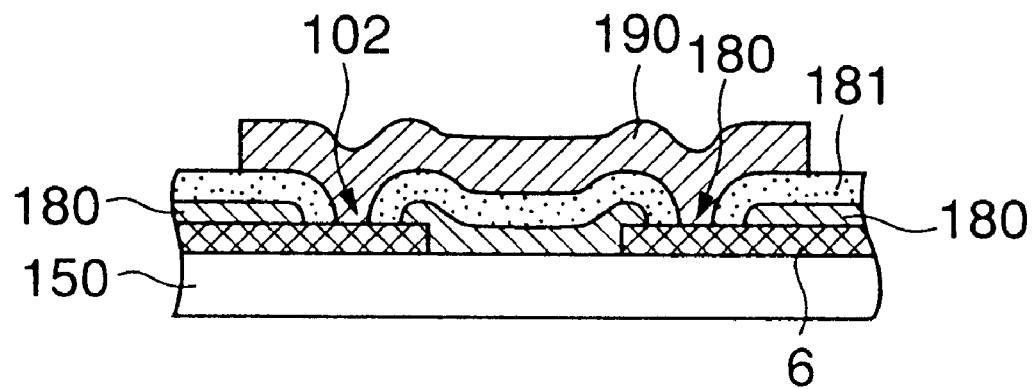
FIG. 48 is a sectional view showing the construction of the temporary wiring layer in which the second electrodes are formed using the fuse member.
Figure 49:
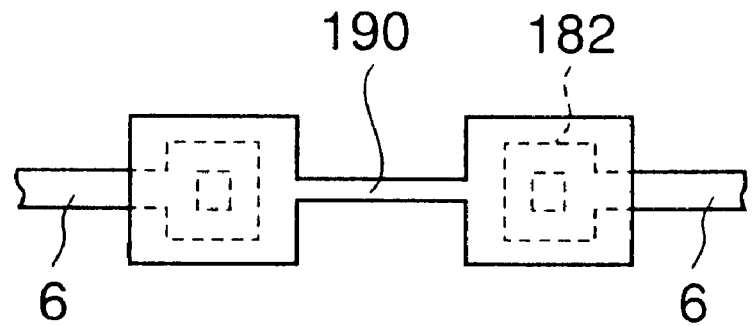
FIG. 49 is a top view showing the construction of the temporary wiring layer in which the second electrodes are formed using the fuse member.
Figure 50:
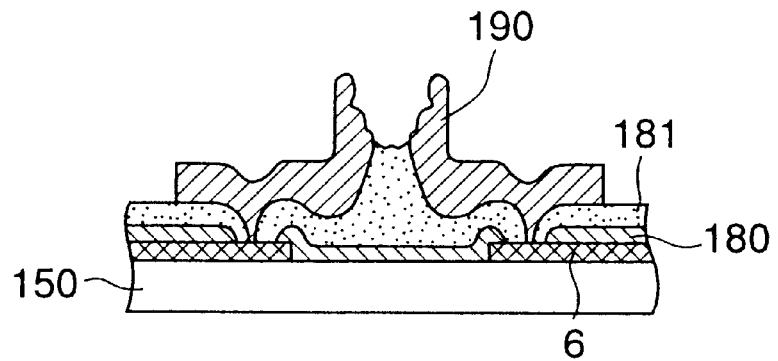
FIG. 50 is a sectional view showing a cross section in which the fuse member for temporary wiring is disconnected.

FIGS. 48 and 49 are a sectional view and a top view, respectively, showing the construction of the temporary wiring layer in which the second electrode 5 is formed using a fuse member. FIG. 50 is a sectional view showing a cross section in which the fuse member for temporary wiring has blown. In the top view of FIG. 49, illustration of an insulating film is omitted.

Referring to FIGS. 48 and 49, the second electrode in the temporary wiring layer is used as a fuse. More specifically, a temporary wiring fuse member 190 is used to form the second electrode 5.

In a defective chip invaded by a foreign substance during production, a short circuit often occurs so that a large current flows in the chip. By using the temporary wiring layer as a fuse, and by using an organic material, subject to abrupt decomposition beyond a certain temperature, to form an insulating film 181 (shown in FIG. 48) on a cover film 180 (shown in FIG. 48) and underneath the temporary wiring layer, decomposition of the insulating film 181 is induced when a large current flows in a defective portion during the test so that the metal film (the temporary fuse member 190 in the temporary wiring layer) is mechanically disconnected from the first electrode 3.

The fuse of this type may also be used in a chip burn-in test. A burn-in test in which the chip is operated at a high temperature is normally performed in order to identify initial defects prior to shipping the product. Some semiconductor devices (particularly, those products that use CMOS circuits) triggered by a defect enters a latch-up state. When the latch-up state is induced, a large current continues to flow in the defective device so that devices adjacent to the defective device are adversely affected. In a worse case, equipment for the burn-in test may be damaged.

By using the fuse member as described above, the temperature of the fuse member rises when an abnormally large current flows in the defective device having that fuse member 7. As a result, the defective device is disconnected from a power source. Accordingly, the aforementioned problem of the defective device in a latch-up state affecting adjacent normal devices does not occur.

Figure 51:
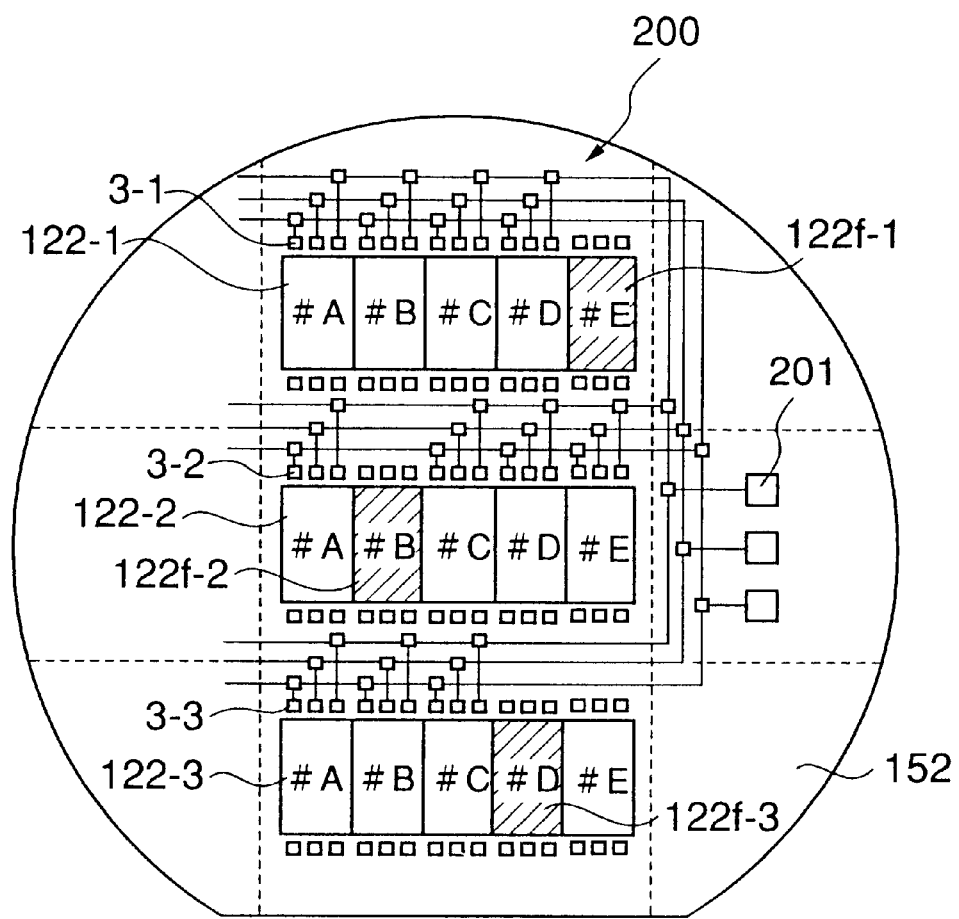
FIG. 51 shows how the semiconductor wafer testing method is applied to a wafer memory having a memory function shared by the entirety of the wafer.

FIG. 51 shows how the semiconductor wafer testing method according to the tenth embodiment is applied to a wafer memory having a memory function shared by the entirety of the wafer. Referring to FIG. 51, a wafer memory temporary wiring part 200 connects a plurality of chips each including a plurality of cell blocks 122-1–122-3, and common pads 201 leading from the wafer memory temporary wiring part 200 are shared by the plurality of chips on the wafer. By removing the temporary wiring layer after the test, and by rewiring a plurality of first electrodes 3-1–3-3 in each of the chips in such a manner as to exclude the first electrodes in defective cell blocks 122f-1–122f-3, the entirety of the wafer is used.

Figure 52:
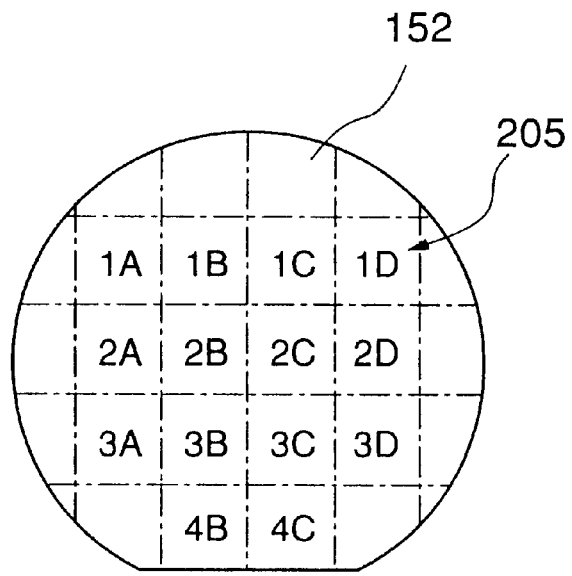
FIG. 52 is a top view showing how the semiconductor wafer testing method of the tenth embodiment is applied to chip production management, by using the temporary wiring layer to display chip identification characters.
Figure 53:
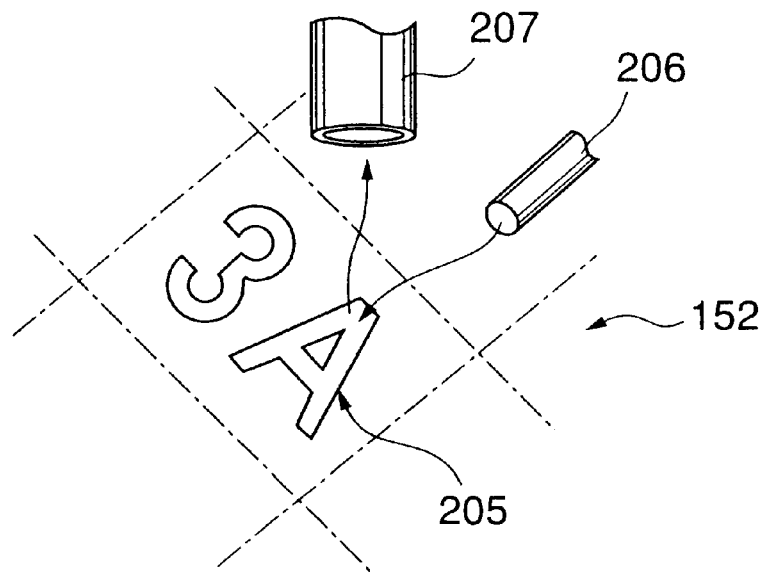
FIG. 53 is a perspective view showing how the chip identification characters of FIG. 52 are read.

FIG. 52 is a top view showing how the semiconductor wafer testing method of the tenth embodiment is applied to chip production management, by using the temporary wiring layer to display chip identification characters. FIG. 53 is a perspective view showing how the chip identification characters of FIG. 52 are read.

Referring to FIG. 52, an insulating film is formed on a wafer that includes a large number of chips, and chip identification characters (chip identification symbols) 205 for identifying the chips determined to be defective as a result of a test are formed on the insulating film. The chip identification characters 205 are read in the process of chip production management. After being used for the purpose of chip production management, the chip identification characters 205 are removed altogether.

Test equipment identifies defective cell blocks and chips by performing a chip test. FIG. 53 shows how the chip identification characters or the chip identification symbols are formed by temporary wiring so that chip production is properly controlled based on the chip test result. Such chip identification characters 205 may be read by a laser beam device so that chip production management is facilitated.

For example, when the chip identification characters are formed by using the metal film in the temporary wiring layer, the chip identification characters have a higher reflectivity than the adjacent areas. Accordingly, by impinging a laser beam emitted from a laser emitting device 206 on the chip identification characters 205, and by reading the reflected laser beam by a laser beam detecting device, defective cell blocks or chips can be easily located. Naturally, it is desirable that, when the chip production management is completed, the chip identification characters are removed in a final step of production so that the non-defective chips are properly packaged.

It is to be noted that, in the tenth embodiment, traces of the temporary wiring layer that includes the second electrodes remain in the contact portion of the first electrodes even after a removal process. However, such traces, are of such a limited quantity that the subsequent processes are not affected at all.

A description will now be given, with reference to FIGS. 58–62, of how the present invention resolves the fourth aspect of the problem inherent in the related art.

Figure 58:
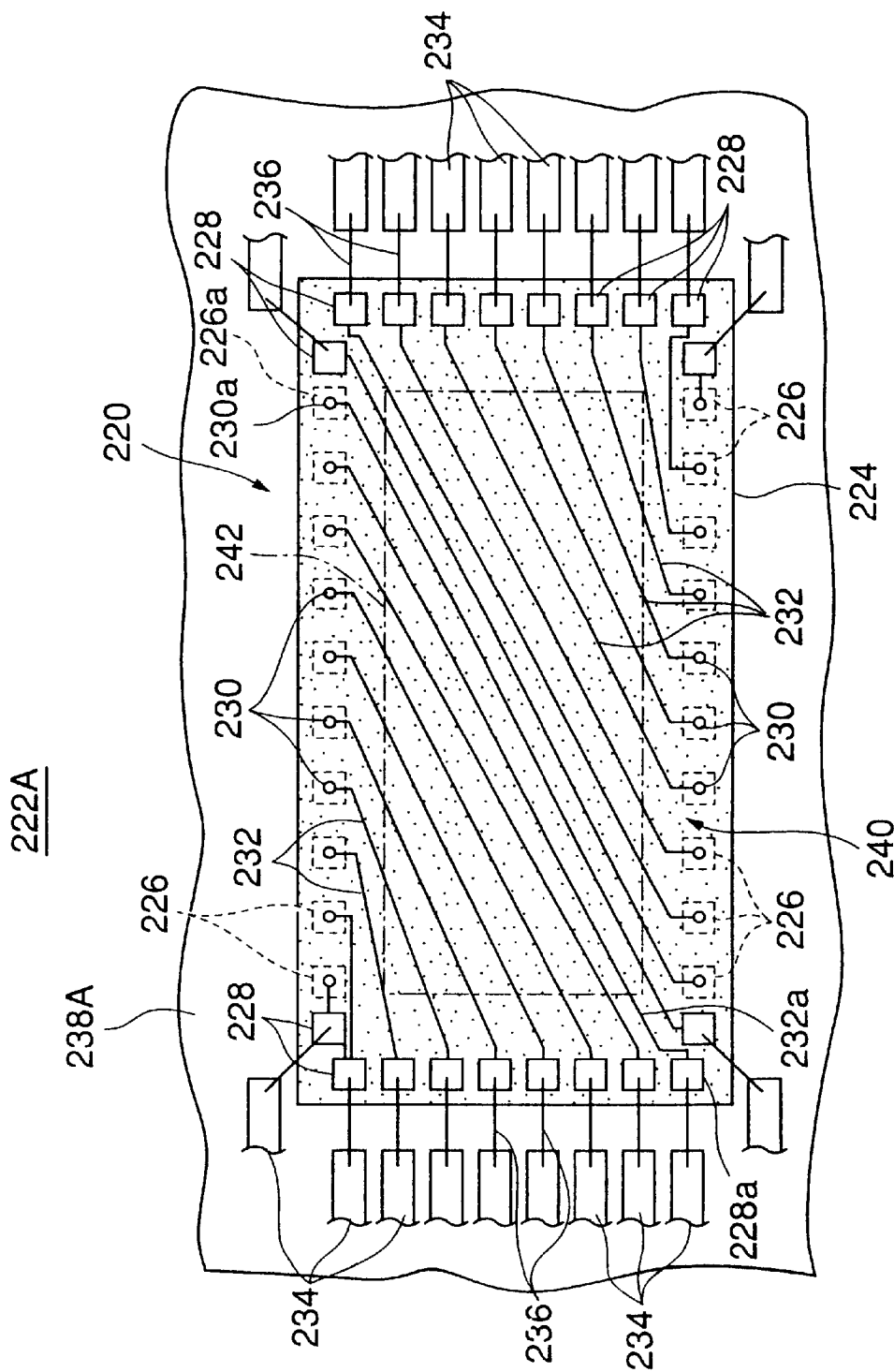
FIG. 58 shows a semiconductor device according to an eleventh embodiment of the present invention.
Figure 59:
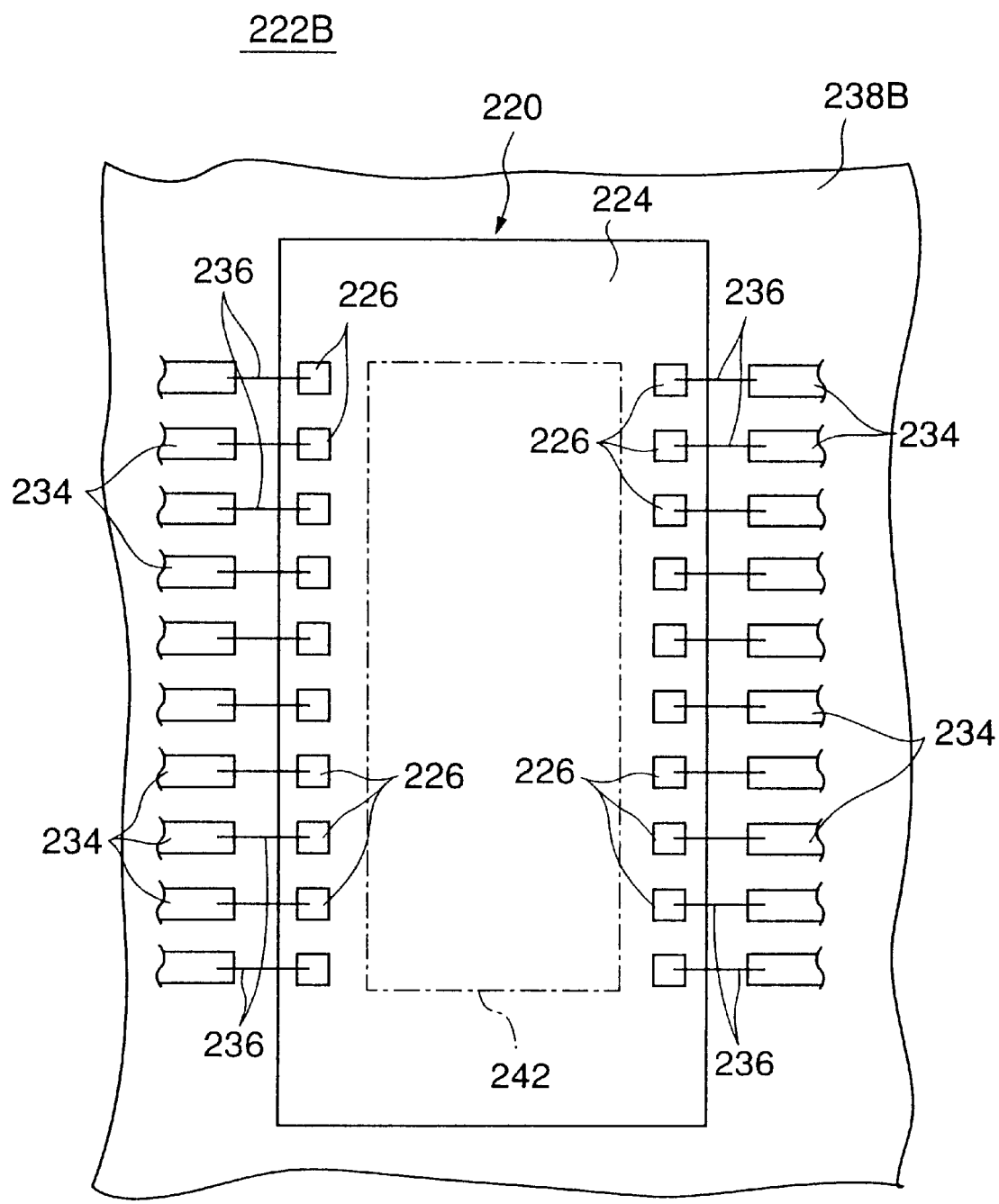
FIG. 59 shows another semiconductor device according to the eleventh embodiment.
Figure 60:
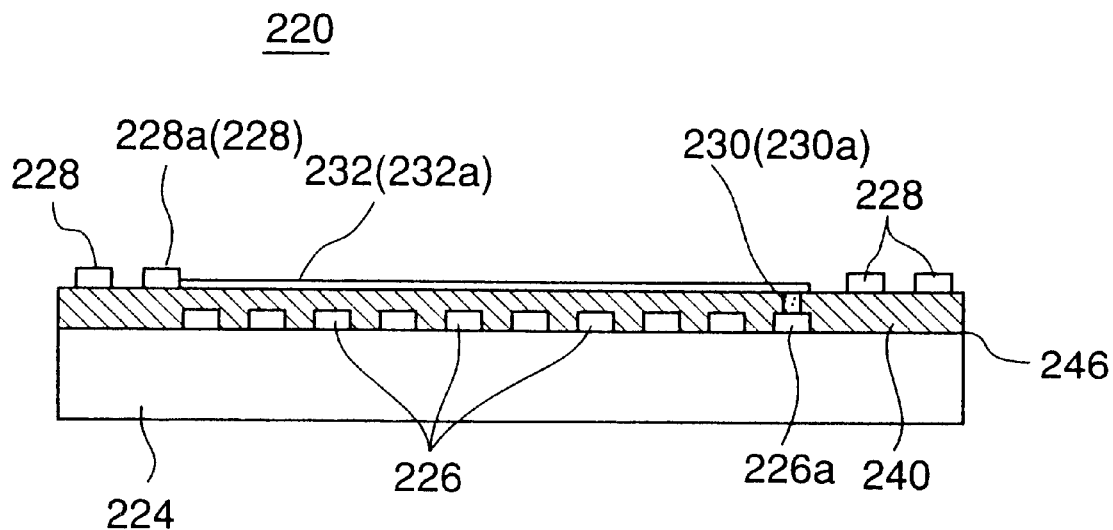
FIG. 60 shows a semiconductor element according to the eleventh embodiment.

FIGS. 58 and 59 show semiconductor devices 222A and 222B, respectively, according to an eleventh embodiment of the present invention directed to resolving the fourth aspect of the related art problem. FIG. 60 shows a semiconductor element 220 according to the eleventh embodiment. The semiconductor device 222A is constructed such that the semiconductor element 220 is used in the latitudinally elongated package as described with reference to FIG. 54. The semiconductor 222B is constructed such that the semiconductor element 220 is used in the longitudinally elongated package as described with reference to FIG. 55. A description will first be given, with reference to FIGS. 58 and 60, of the construction of the semiconductor 220.

The semiconductor element 220 generally comprises an element main body 224, first electrodes 226, second electrodes 228, through hole electrodes 230, wiring 232, and an insulating film 240 (indicated by matt surface in FIG. 58).

The element main body 224 provides a substrate for the semiconductor element 220. For example, the element main body 224 is constructed such that a circuit area 242 is formed on a silicone substrate or a GaAs substrate. In the eleventh embodiment the element main body 224 has a rectangular configuration.

The first electrodes; 226 are formed on the upper major surface of the element main body 224 and are connected to electronic circuits formed in the circuit area 242 via a wiring (not shown). As shown in FIG. 60, the first electrodes 226 are formed directly on the upper major surface of the element main body 224 along the longer sides of the element main body 224.

As shown in FIG. 58, the second electrodes 228 are formed on the upper major surface of the insulating film 240 (insulating member) along the shorter sides of the element main body 224.

The insulating film 240 mainly comprises olefin resin with a mixture of epoxy resin at a predetermined density. The insulating film 240 is formed on the entirety of the element main body 224. The olefin resin with mixture of epoxy resin provides a release force by being heated beyond a dissolution temperature of epoxy resin. Accordingly, permanent bond between the insulating film 240 and the element main body 224 is prevented so that the insulating film 240 can be removed from the element main body 224 by exfoliation.

As shown in FIG. 60, for better separability of the insulating film 240 from the element main body 224, an exfoliative agent 246 may be applied to an interface between the element main body 224 and the insulating film 240. The exfoliative agent 246 may be an olefin resin with a mixture of epoxy resin.

A bond between the insulating film 240 and the element main body 224 is maintained such that the insulating film remains attached to the element main body 224 without an external exfoliative force. When the exfoliative force is applied to the insulating film 240, the insulating film 240 is removed from the element main body 224 by exfoliation. The insulating film 240 may be formed of polyimide with a mixture of epoxy resin instead of olefin resin with a mixture of epoxy resin.

The through hole electrodes 230 and the wiring 232 function as means to connect the first electrodes 226 and the second electrodes 228. The through hole electrodes 230 are formed by forming a conductive film in a through hole provided in the insulating film 240 so as to connect the upper major surface and the lower major surface of the insulating film 240. The through hole electrodes 230 are formed in the insulating film 240 in alignment with the corresponding first electrode 226.

The wiring 232 is formed on the upper major surface of the insulating film 240 so as to form a predetermined pattern. The end of the wiring 232 is connected to the second electrode 228 and the other end of the wiring 232 is connected to the upper end of the through hole electrode 230.

The first electrode 226 and the second electrode 228 are electrically connected by the wiring 232 to each other in a one-to-one correspondence. More specifically, the first electrode 226a is connected to the second electrode 228a via the through hole electrode 230a and the wiring 232a.

The through hole electrode 230 and the wiring 232 may be formed by a well-established technique used in semiconductor production. Connection by means of the through hole electrode 230 and the wiring 232 is easy to implement.

A detailed description will now be given of the semiconductor device 222A shown in FIG. 58.

Figure 54:
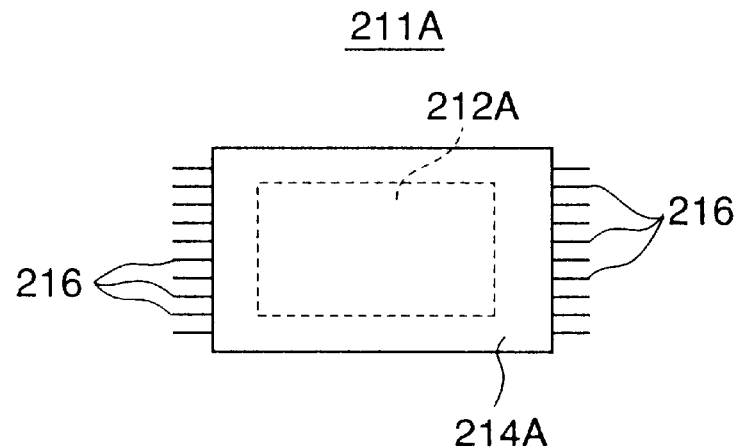
FIG. 54 shows a latitudinally elongated package.
Figure 55:
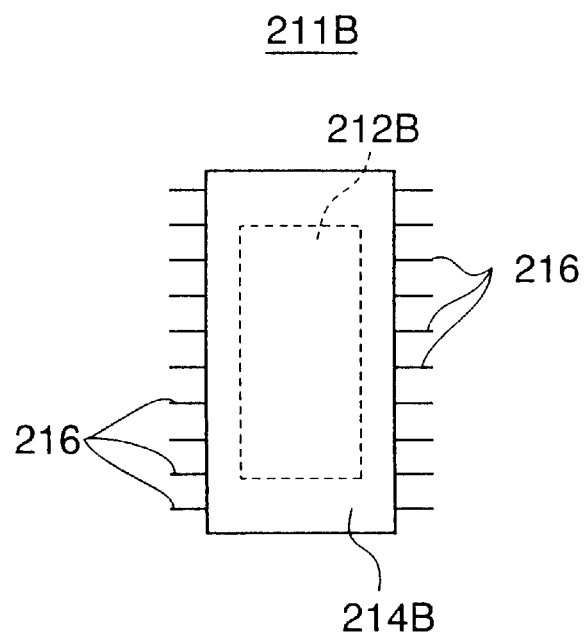
FIG. 55 shows a longitudinally elongated package.
Figure 56:
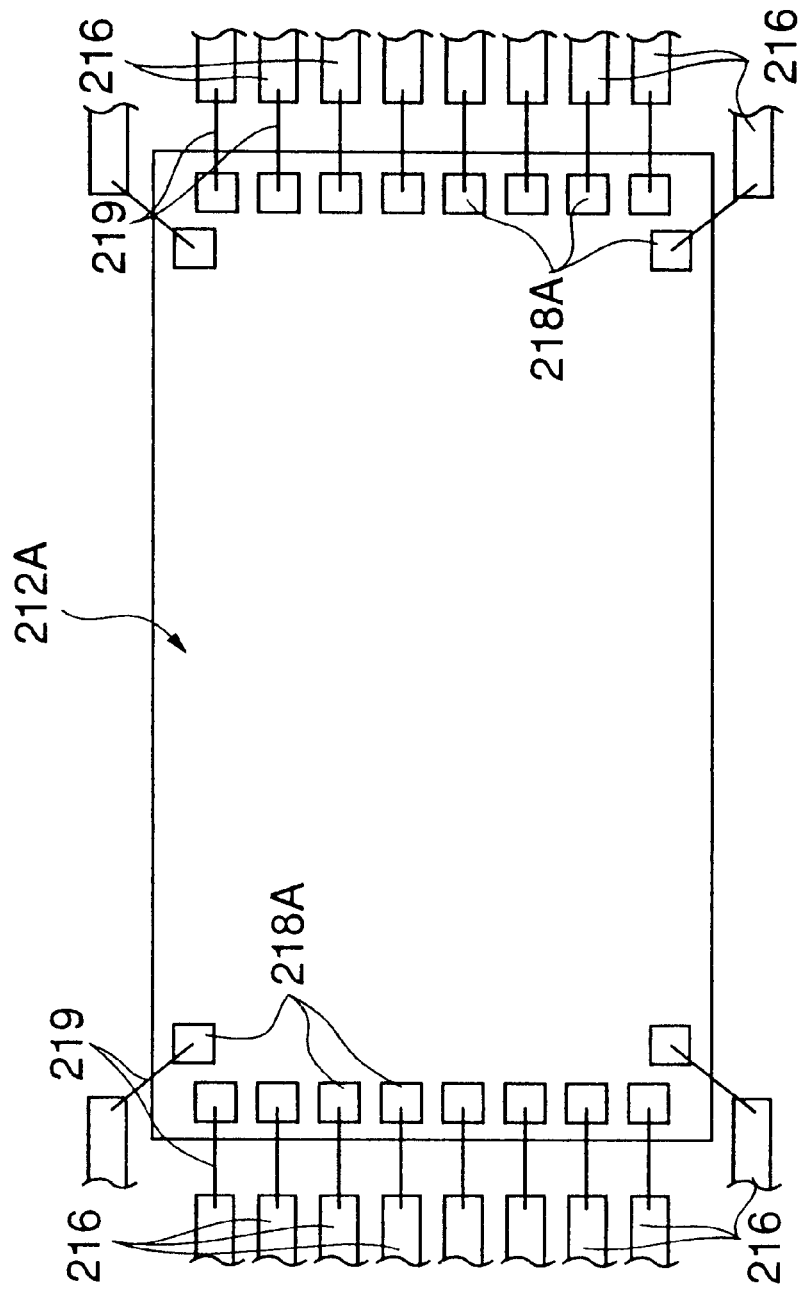
FIG. 56 shows how a semiconductor element in a latitudinally elongated package is connected to leads.
Figure 57:
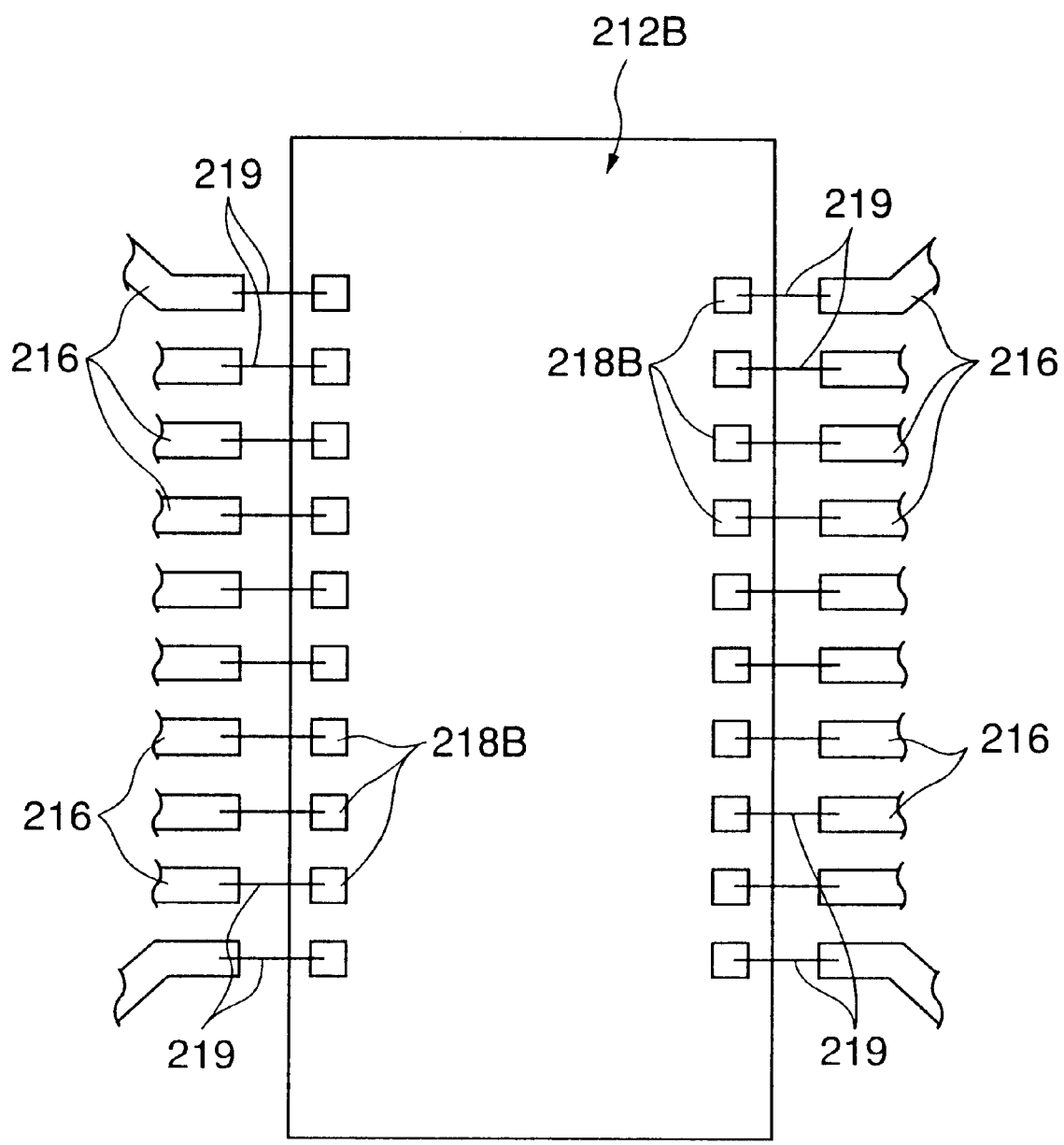
FIG. 57 shows how a semiconductor element in a longitudinally elongated package is connected to leads.

The semiconductor device 222A is constructed such that the semiconductor element 220 having the insulating film 240 applied thereon is mounted on a latitudinally elongated resin package 238A as shown in FIG. 54. Thus, leads 234 extend from the shorter sides of the resin package 238A.

The semiconductor element 220 is mounted on the resin package 238A in a latitudinally elongated orientation so as to prevent unused space from being created in the resin package 238A. By mounting the semiconductor element 220 in a latitudinally elongated orientation in the resin package 238A, each of the leads 234 is opposite to a shorter side of the semiconductor element 220.

The semiconductor element 220 according to the eleventh embodiment is constructed such that the second electrodes 228 are located in the topmost layer when the insulating film 240 is provided so that connection with an external device is enabled via the second electrodes 228. In the example shown in FIG. 58, the second electrodes 228 are formed along the shorter sides of the element main body 224.

By connecting the second electrode 228 and the lead 234 using a wire 236, the lead 234 is connected to the element main body 224 via the second electrode 228, the wiring 232, the through hole 230, and the first electrode 226. Since the second electrode 228 and the lead 234 are opposite to each other across a small spatial interval. Accordingly, the size of the semiconductor device 222A is reduced. Since the length of the wire 236 is reduced, electrical loss occurring in the wire 236 is reduced.

A detailed description will now be given of the semiconductor device 222B shown in FIG. 59.

The semiconductor device 222B is constructed such that the semiconductor element 200 having the insulating film 240 removed therefrom is mounted on a package. Before describing the construction of the semiconductor device 222B, a description will be given, with reference to FIGS. 61 and 62, of how the insulating film 240 is exfoliated from the element main body 224.

Figure 61:
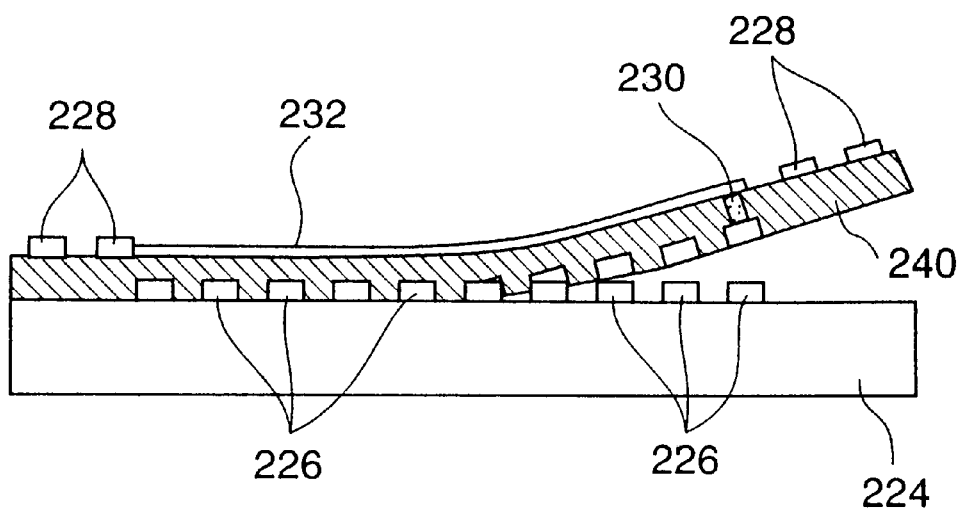
FIG. 61 illustrates a method for exfoliating an insulating film from an element main body by mechanical means.

FIG. 61 illustrates a method for exfoliating the insulating film 240 from the element main body 224 by mechanical means. The mechanical means here refers to an exfoliative force applied to the insulating film 240.

More specifically, according to the eleventh embodiment, the end (in FIG. 61, the right end) of the insulating film 240 is held and raised by a jig or the like. Since the insulating film 240 is formed of olefin resin with a mixture of epoxy resin, a release force takes effect when the insulating film 240 is heated beyond an epoxy resin dissolution temperature.

By exerting the exfoliative force on the insulating film 240 while the insulating film 240 is being heated beyond the epoxy resin dissolution temperature, removal of the insulating film 240 from the element main body 224 is facilitated. In a construction wherein the exfoliative agent 246 is applied to the interface between the element main body 224 and the insulating film 240, the insulating film 240 can be removed from the element main body 224 even more easily.

Figure 62:
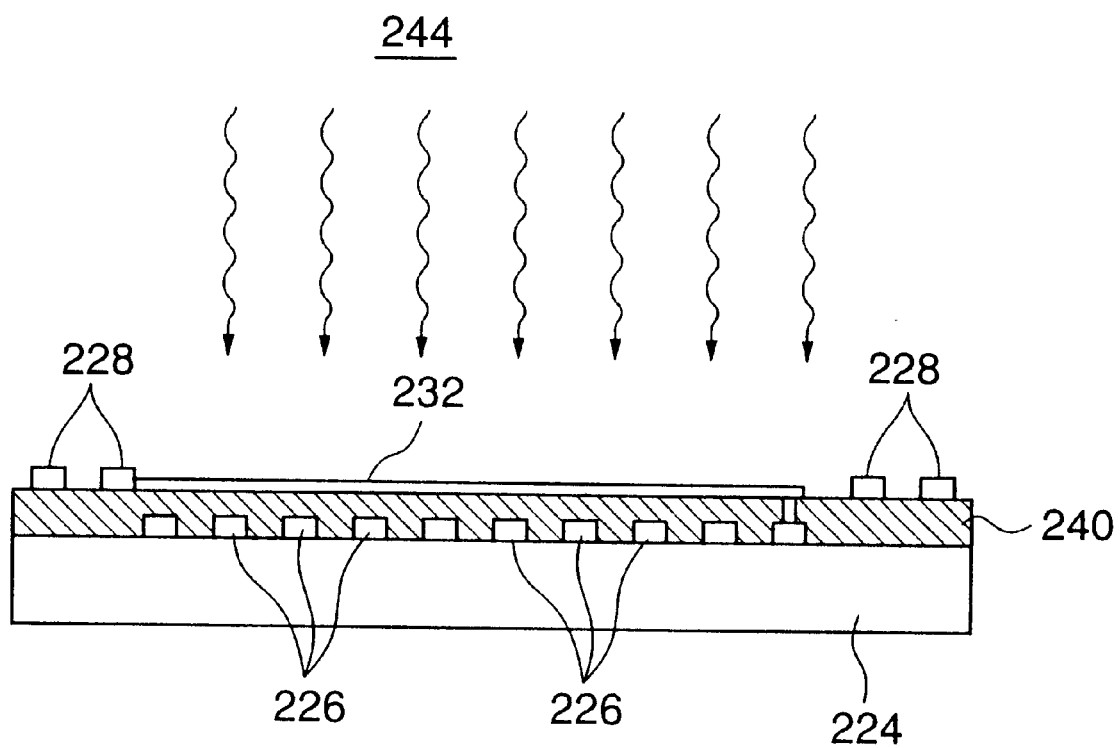
FIG. 62 illustrates a method for exfoliating the insulating film from the element main body by chemical means without applying an exfoliative force to the insulating film.

FIG. 62 illustrates a method for exfoliating the insulating film 240 from the element main body 224 by chemical means without applying an exfoliative force to the insulating film 240.

More specifically, the insulating film 240 may be removed using an etching technique. An etching solution 244 that dissolves the second electrode 228, the wiring 232 and the insulating film 240 but does not dissolve the element main body 224 and the first electrode 226 is chosen. By using the etching solution 244, the insulating film 240 can be removed from the element main body 224.

As described above, the insulating film 240 can be removed from the element main body 224 easily using the mechanical or chemical means. Since the through hole electrode 230 and the wiring 232 are provided in the insulating film 240, the through hole electrode 230 and the wiring 232 are removed from the semiconductor element 220 when the insulating film 240 is removed from the element main body 224. Therefore, there is no likelihood that the through hole electrode 230 and the wiring 232 adversely affects connection between the first electrode 226 or the lead 234 after the insulating film 240 is removed from the element main body 224.

Referring back to FIG. 59, the semiconductor device 222B will be described.

The semiconductor device 222B has a longitudinally elongated package structure where the resin package 238B is longitudinally elongated. The leads 234 extend from the longer sides of the resin package 238B.

In order to prevent unused space from being created, the semiconductor element 220 is mounted on the resin package 238B so as to lie in the longitudinally elongated orientation. When the semiconductor element 220 is mounted on the resin package 238B in a longitudinally elongated orientation, the leads 234 are opposite to the longer sides of the semiconductor element 220.

Since the insulating film 240 is removed from the semiconductor element 240, the first electrodes 226 are exposed on the element main body 224 and are arranged along the longer sides of the element main body 224.

Accordingly, the first electrodes 226 and the leads 234 can be directly connected to each other using the wires 236 so that the leads 234 are electrically connected to the semiconductor element 220. As in the semiconductor device 222A, the first electrodes 226 in the semiconductor device 222B are opposite to the leads 234 across a small spatial interval. Accordingly, the size of the semiconductor 222B is reduced. Since the wires are short, electrical loss occurring in the wires is reduced.

As described above, the semiconductor element 220 according to the eleventh embodiment is constructed such that the first electrodes 226 are formed on the element main body 224 and the second electrodes 228 are formed on the insulting film 240 formed on the element main body 224. As a result, the second electrodes 228 are built upon the first electrodes 226 via the insulating film 240. Accordingly, the area of the element main body 224 is not increased by providing the first electrodes 226 and the second electrodes 228 so that an increase in the size of the semiconductor element 220 is prevented.

While FIGS. 58 and 60 indicate that the first electrode 226 and the second electrode 228 are not vertically aligned with each other, the first electrode 226 and the second electrode 228 may be vertically aligned with each other. In that case, the size of the semiconductor element 220 is further reduced.

As described above, the semiconductor element 220 may have different arrangements of electrodes depending on whether the insulating film 240 is provided or removed.

Accordingly, the arrangement of electrodes may be appropriately selected depending on the package structure, by maintaining the insulating film 240 or by removing the insulating film 240 from the element main body 224. That is, the electrode arrangement adapted for the package structure can be easily implemented. This makes it unnecessary for prospective semiconductor device production in an expectation of a client order. Therefore, inventory management of the semiconductor devices 222A and 222B can be easily performed.

While it is assumed that the insulating film 240 is provided to form only one layer, the insulating film may be provided to form several layers. When the insulating films are provided in several layers, a wiring may be formed in each layer so as to connect the layers.

In the above construction, the electrode arrangement may differ from layer to layer. Thus, it is possible to adapt to a plurality of package types (that is, electrode arrangement types) by providing a plurality of layers. More specifically, for example, if the insulating films are provided in five layers, and if the electrodes are arranged in a desired configuration in the third layer, the desired electrode arrangement is implemented by removing the first and second layers.

The present invention is not limited to the above described embodiments, and variations and modifications may be made without departing from the scope of the present invention.

What is claimed is:

1. A semiconductor wafer testing method using a probe for testing a plurality of semiconductor units formed on a surface of a semiconductor wafer;

said semiconductor wafer testing method comprising the steps of:

forming a temporary test film on the surface of the semiconductor wafer so as to be detachable therefrom by exfoliation, forming each of said plurality of semiconductor units on said semiconductor wafer being provided with a plurality of semiconductor unit electrodes, and providing said temporary test film with a plurality of regularly arranged test electrodes and wiring patterns for electrically connecting said plurality of regularly arranged test electrodes with corresponding ones of said plurality of semiconductor unit electrodes of said plurality of semiconductor units;

testing said plurality of semiconductor units by applying a plurality of probe pins of said probe to corresponding ones of said plurality of regularly arranged test electrodes provided in said temporary test film; and detaching by said exfoliation said temporary test film from the surface of said semiconductor wafer.

2. A semiconductor wafer testing method using a probe for testing a plurality of semiconductor units formed on a surface of a semiconductor wafer;

said semiconductor wafer testing method comprising the steps of:

forming a temporary test film on the surface of the semiconductor wafer so as to be detachable therefrom by chemical means, forming each of said plurality of semiconductor units on said semiconductor wafer being provided with a plurality of semiconductor unit electrodes, and providing said temporary test film with a plurality of regularly arranged test electrodes and wiring patterns for electrically connecting said plurality of regularly arranged test electrodes with corresponding ones of said plurality of semiconductor unit electrodes of said plurality of semiconductor units;

testing said plurality of semiconductor units by applying a plurality of probe pins of said probe to corresponding ones of said plurality of regularly arranged test electrodes provided in said temporary test film; and detaching by said chemical means said temporary test film from the surface of said semiconductor wafer.

3. A semiconductor wafer testing method using a probe for testing a plurality of semiconductor units formed on a surface of said semiconductor wafer;

said semiconductor wafer testing method comprising the steps of:

forming a temporary test film on the surface of said semiconductor wafer so as to be detachable therefrom, forming each of said plurality of semiconductor units on said semiconductor wafer provided with a plurality of semiconductor unit electrodes, and providing said temporary test film with a first insulating film, first wiring pattern formed on said first insulating film so as to lead from corresponding ones of said plurality of semiconductor unit electrodes, forming a second insulating film on said first insulating film so as to cover said first wiring patterns, forming second wiring patterns on said second insulating film so as to lead from corresponding ones of junction electrodes at respective ends of said first wiring patterns and a plurality of regularly arranged test electrodes at respective ends of said second wiring patterns;

testing said plurality of semiconductor units by applying a plurality of probe pins of said probe to corresponding ones of said plurality of regularly arranged test electrodes provided in said temporary test film; and detaching said temporary test film from the surface of said semiconductor wafer.

4. A semiconductor wafer testing method using a probe for testing a plurality of semiconductor units formed on a surface of said semiconductor wafer;

said semiconductor wafer testing method comprising the steps of:

forming a temporary test film on the surface of said semiconductor wafer so as to be detachable therefrom, forming each of said plurality of semiconductor units on said semiconductor wafer being provided with a plurality of semiconductor unit electrodes, providing said temporary test film with a first insulating film, forming a first wiring pattern on said first insulating film so as to lead from corresponding ones of said plurality of semiconductor unit electrodes, forming a second insulating film on said first insulating film so as to cover said first wiring patterns, forming second wiring patterns on said second insulating film so as to lead from corresponding ones of junction electrodes at respective ends of said first wiring patterns and a plurality of regularly arranged test electrodes at respective ends of said second wiring patterns, and providing said junction electrodes in the corresponding semiconductor unit having the semiconductor unit electrodes thereof connected to said junction electrodes via corresponding ones of said first wiring patterns;

testing said plurality of semiconductor units by applying a plurality of probe pins of a probe to corresponding ones of said plurality of regularly arranged test electrodes provided in said temporary test film; and detaching said temporary test film from the surface of said semiconductor wafer.

5. A semiconductor wafer testing method comprising the steps of:

forming an insulating film on a wafer carrying a plurality of semiconductor chips each including a plurality of semiconductor elements;

forming a metal film connected to a first electrode leading from a corresponding one of said plurality of semiconductor elements via a hole in said insulating film;

forming a temporary wiring layer adapted for a wafer test, by etching said metal film;

forming a second electrode leading from said temporary wiring layer and arranging a plurality of said second electrodes at desired location on said wafer;

applying a test probe pin for the wafer test to said second electrode so as to individually test said plurality of semiconductor elements; and removing said temporary wiring layer and said plurality of second electrodes when said plurality of semiconductor elements have been tested.

6. The semiconductor wafer testing method as claimed in claim 5, including arranging said plurality of second electrodes on the wafer such that a plurality of said test probe pins are simultaneously applied to said plurality of second electrodes for a block of said plurality of semiconductor chips arranged in directions perpendicular to each other.

7. The semiconductor wafer testing method as claimed in claim 5, including arranging said plurality of second electrodes on the wafer such that a plurality of said test probe pins of a common type are used for at least two of said plurality of semiconductor chips of different types.

8. The semiconductor wafer testing method as claimed in claim 7, including applying said testing method to chip production involving a shrinking process for shrinking a prototype chip to produce a product chip, and continuing to use said plurality of test probe pins for the prototype chip to test the product chip by arranging said plurality of second electrodes for the prototype chip so as to be compatible with the product chip.

9. The semiconductor wafer testing method as claimed in claim 7, further comprising the step of providing said second electrodes outside those of said first electrodes in a first chip that are not common in functions thereof with said first electrodes of a second chip of a different type from said first chip, in such a manner that said second electrodes provided correspond to said first electrodes unique to said second chip.

10. The semiconductor wafer testing method according to claim 5, including connecting at least one of input/output signal terminals and power supply terminals used to individually test said semiconductor elements to said temporary wiring layer, and the connected terminals that have the identical function are respectively connected to said plurality of second electrodes via a temporary wiring pattern in said temporary wiring layer sc that said plurality of second electrodes are shared by at least two of said plurality of chips.

11. The semiconductor wafer testing method according to claim 10, wherein said plurality of second electrodes are provided at locations where there are no semiconductor chips underneath.

12. The semiconductor wafer testing method as claimed in claim 5, including providing only said plurality of second electrodes in said temporary wiring layer.

13. The semiconductor wafer testing method as claimed in claim 5, including providing an inner circuit formed near a center of the chip and an outer circuit formed at a periphery of the chip for each of said plurality of semiconductor chips, and said step of providing a second electrode includes the steps of:

providing a first group of said second electrodes for testing said inner circuit;

providing a second group of said second electrodes for testing said outer circuit; and connecting at least one of input/output signal terminals of said inner circuit and power supply terminals of said inner circuit to said temporary wiring layer so as to be connected to said first group of said second electrodes for testing said inner circuit.

14. The semiconductor wafer testing method as claimed in claim 5, including embedding a test circuit for testing said plurality of semiconductor elements in the wafer, and connecting said test circuit to said plurality of semiconductor elements via said temporary wiring layer so as to test said plurality of semiconductor elements.

15. A semiconductor wafer testing method comprising the steps of:

forming a first insulating film on a wafer carrying a plurality of semiconductor chips each including a plurality of semiconductor elements;

forming a first metal film connected to a first electrode leading from a corresponding one of said plurality of semiconductor elements via a hole in said first insulating film;

forming a first temporary wiring layer adapted for a wafer test, by etching said first metal film;

forming a second electrode leading from said first temporary wiring layer and arranging a plurality of said second electrodes at desired locations on said wafer;

forming a second insulating film on said first metal film;

forming a second metal film connected to said first electrode via a hole in said second insulating film;

forming a second temporary wiring layer adapted for a wafer test, by etching said second metal film;

forming a third electrode leading from said second temporary wiring layer and arranging a plurality of said third electrodes at desired locations on said wafer;

applying test probe pins for the wafer test to said plurality of second electrodes and said plurality of third electrodes so as to individually test said plurality of semiconductor elements; and removing said first temporary wiring layer, said plurality of second electrodes, said second temporary wiring layer and said plurality of third electrodes when said plurality of semiconductor elements have been tested.

16. The semiconductor wafer testing method according to claim 15, including providing capacity on the wafer in the form of a first capacity electrode layer included in said first temporary wiring layer and a second capacity electrode layer included in said second temporary wiring layer.

17. The semiconductor wafer testing method according to claim 16, including connecting said first capacity electrode layer to the second electrodes that are connected to a first power source for operating said plurality of semiconductor elements, and said second capacity electrode layer is connected to the third electrodes that are connected to a second power source for operating said plurality of semiconductor elements.

18. A semiconductor wafer testing method comprising the steps of:

forming an insulating film on a wafer carrying a plurality of semiconductor chips each including a plurality of semiconductor elements;

forming a metal film connected to a first electrode leading from a corresponding one of said plurality of semiconductor elements via a hole in said insulating film;

forming a second electrode at a desired location on the wafer by etching said metal film;

forming a temporary wiring layer so as to include a plurality of said second electrodes;

testing said plurality of semiconductor elements individually using said temporary wiring layer so as to identify a defective semiconductor element;

removing said temporary wiring layer when said plurality of semiconductor elements have been tested; and rewiring only those first electrodes leading from the semiconductor elements that are found to be non-defective by said testing step.

19. The semiconductor wafer testing method as claimed in claim 18, including providing said second electrode to be sufficiently larger than said first electrode to enable a test probe pin for testing each of said plurality of semiconductor elements to be properly applied to said second electrode.

20. The semiconductor wafer testing method as claimed in claim 18, including building a reserve cell block into the semiconductor chip in addition to a plurality of cell blocks each including corresponding ones of said plurality of semiconductor elements, so that the cell blocks that include the semiconductor element found to be defective by said testing step are excluded from said rewiring step.

21. The semiconductor wafer testing method as claimed in claim 18, further comprising the steps of:

retrieving from the wafer the semiconductor chips that include the semiconductor element found to be non-defective by said testing step.

22. A semiconductor wafer testing method comprising the steps of:

forming an insulating film on a wafer carrying a plurality of semiconductor chips each including a plurality of semiconductor elements;

forming a hole in said insulating film in alignment with a first electrode leading from a corresponding one of said plurality of semiconductor elements in such a manner as to expose said first electrode;

forming a metal film connected to said first electrode via said hole;

forming a second electrode corresponding to said first electrode by etching said metal film and arranging a plurality of said second electrodes at desired locations on the wafer;

forming a temporary wiring layer so as to include said plurality of second electrodes;

testing said plurality of semiconductor elements individually using said plurality of second electrodes so as to identify a defective semiconductor element;

removing said temporary wiring layer when said plurality of semiconductor elements have been tested; and rewiring only those first electrodes leading from the semiconductor elements that are found to be non-defective by said testing step.

23. The semiconductor wafer testing method as claimed in claim 22, including providing said second electrode to be sufficiently larger than said first electrode to enable a test probe pin for testing each of said plurality of semiconductor elements to be properly applied to said second electrode.

24. The semiconductor wafer testing method as claimed in claim 22, including building a reserve cell block into the semiconductor chip in addition to a plurality of cell blocks each including corresponding ones of said plurality of semiconductor elements, so that the cell blocks that include the semiconductor element found to be defective by said testing step are excluded from said rewiring step.

25. The semiconductor wafer testing method as claimed in claim 22, further comprising the steps of:

retrieving from the wafer the semiconductor chips that include the semiconductor element found to be non-defective by said testing step.

26. A semiconductor wafer testing method comprising the steps of:

forming an insulating film on a wafer carrying a plurality of semiconductor chips each including a plurality of semiconductor elements;

forming a first hole in said insulating film in alignment with a first electrode leading from a corresponding one of said plurality of semiconductor elements in such a manner as to expose said first electrode, and forming a second hole in said insulating film in alignment with a fuse electrode including a fuse member in such a manner as to expose said fuse electrode;

forming a first metal film that is in contact, via said first hole, with a contact portion of said first electrode, and forming a second metal film that is in contact, via said second hole, with a contact portion of said second electrode;

forming a second electrode corresponding to said first electrode by etching said first metal film and arranging a plurality of said second electrodes at desired locations on the wafer;

testing said plurality of semiconductor elements individually using said second electrode so as to identify a defective semiconductor element;

causing a sufficiently large current to blow said fuse member of said fuse electrode in alignment with said defective semiconductor element, in said second electrode connected to said fuse electrode in alignment with said defective semiconductor element;

removing a temporary wiring layer in which said second electrode connected to said fuse electrode in alignment with said defective semiconductor element is formed, after said fuse member of said fuse electrode in alignment with said defective semiconductor element is blown; and rewiring said plurality of semiconductor elements.

27. The semiconductor wafer testing method as claimed in claim 26, including forming said fuse member by building a material into said wafer.

28. The semiconductor wafer testing method as claimed in claim 26, including using said fuse member to form said second electrode, forming said insulating film of an organic material decomposable above a predetermined temperature, said insulating film underneath said second electrode being decomposed by a current in a defective cell block corresponding to said defective semiconductor element so that said defective cell block is disconnected.

29. The semiconductor wafer testing method as claimed in claim 26, including using said fuse member to form said second electrode, forming said insulating film of an organic material decomposable above a predetermined temperature, said insulating film underneath said second electrode being decomposed by a current in a defective portion of said plurality of semiconductor chips so that the defective cell block so that the chip having said defective portion is disconnected.

30. The semiconductor wafer testing method as claimed in claim 29, including configuring said fuse member forming said second electrode to be thinner than other portions of said second electrode so that an increase in temperature is likely to occur in the thinner section.

31. A semiconductor testing method comprising the steps of:

forming an insulating film on a wafer carrying a plurality of semiconductor chips each including a plurality of semiconductor elements;

forming one of an identification symbol and an identification character for identifying a defective semiconductor element on said insulating film;

effecting semiconductor chip production management by reading one of said identification symbol and said identification character; and removing said one of said identification symbol and said identification character after said semiconductor chip production management has been completed.

* * * * *